(12) United States Patent
Lesso et al.

(10) Patent No.: US 8,890,604 B2
(45) Date of Patent: Nov. 18, 2014

(54) CHARGE PUMP CIRCUIT

(75) Inventors: John Paul Lesso, Edinburgh (GB);
Peter John Frith, Edinburgh (GB);
John Laurence Pennock, Midlothian (GB)

(73) Assignee: Wolfson Microelectronics Ltd., Edinburgh (GB)

( * ) Notice: Subject to any disclaimer, the term of this patent is extended or adjusted under 35 U.S.C. 154(b) by 421 days.

(21) Appl. No.: 13/403,450

(22) Filed: Feb. 23, 2012

(65) Prior Publication Data
US 2012/0163632 A1 Jun. 28, 2012

Related U.S. Application Data

(63) Continuation of application No. 13/336,795, filed on Dec. 23, 2011, now abandoned.

(60) Provisional application No. 61/427,431, filed on Dec. 27, 2010.

(30) Foreign Application Priority Data

Dec. 23, 2010 (GB) .................................. 1021810.5

(51) Int. Cl.
*G05F 1/10* (2006.01)
*H03F 3/181* (2006.01)
*H02M 3/07* (2006.01)
*H02M 1/00* (2006.01)

(52) U.S. Cl.
CPC .......... *H02M 3/07* (2013.01); *H02M 2001/009* (2013.01); *H03F 3/181* (2013.01)
USPC ......................................... 327/536

(58) Field of Classification Search
CPC ........................ H02M 3/073; H02M 2003/073
USPC ........................................... 327/535, 536, 537
See application file for complete search history.

(56) References Cited

U.S. PATENT DOCUMENTS

| | | | |
|---|---|---|---|
| 5,532,916 A * | 7/1996 | Tamagawa | 363/62 |
| 7,382,176 B2 * | 6/2008 | Ayres et al. | 327/536 |
| 8,487,690 B2 * | 7/2013 | Wei et al. | 327/536 |
| 8,514,025 B2 * | 8/2013 | Lesso | 330/297 |
| 2002/0109415 A1 | 8/2002 | McIntyre et al. | |
| 2002/0130705 A1 | 9/2002 | Meng et al. | |
| 2006/0244513 A1 | 11/2006 | Yen et al. | |
| 2008/0150620 A1 | 6/2008 | Lesso | |
| 2009/0039947 A1 | 2/2009 | Williams | |

FOREIGN PATENT DOCUMENTS

| | | |
|---|---|---|
| GB | 2 444 985 A | 6/2008 |
| GB | 2 444 988 A | 6/2008 |

* cited by examiner

*Primary Examiner* — Jeffrey Zweizig
(74) *Attorney, Agent, or Firm* — Dickstein Shapiro LLP

(57) ABSTRACT

A bipolar output charge pump circuit 100 having a network of switching paths 110 for selectively connecting an input node (VV) and a reference node (VG) for connection to an input voltage, a first pair of output nodes (VP, VN) and a second pair of output nodes (VQ, VM), and two pairs of flying capacitor nodes (CF1A, CF1 B; CF2A, CF2B), and a controller for controlling the switching of the network of switching paths. The controller is operable to control the network of switching paths when in use with two flying capacitors (CF1, CF2) connected to the two pairs of flying capacitor nodes, to provide a first bipolar output voltage at the first pair of output nodes (VP, VN) and a second bipolar output voltage at the second pair of bipolar output nodes (VQ, VM).

42 Claims, 56 Drawing Sheets

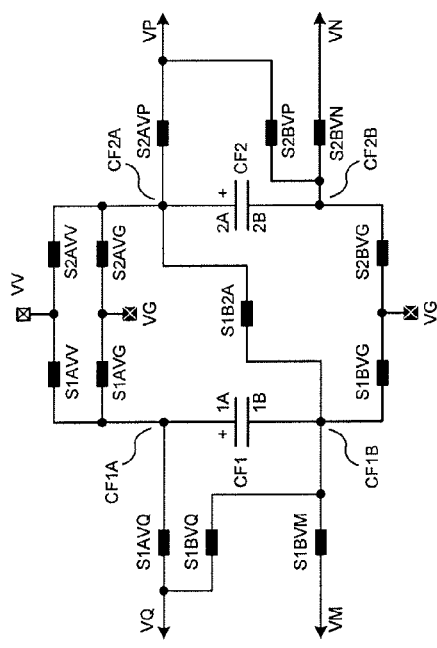
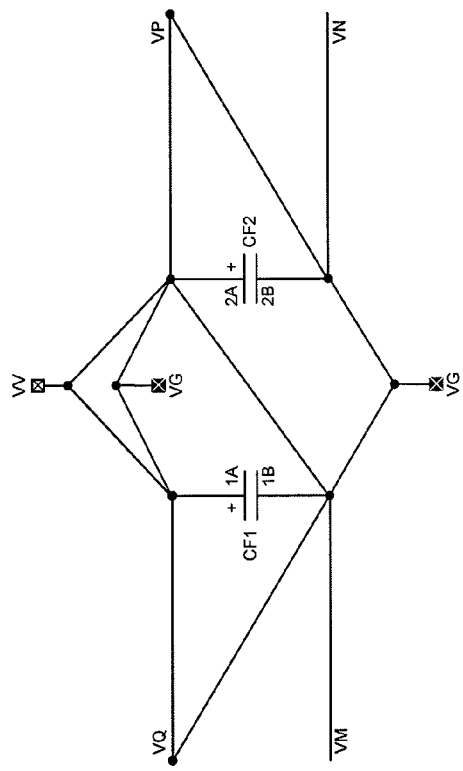
Figure 4a
Figure 4b

Figure 5a

| | S2AVV | S2AVP | S2AVG | S2BVP | S2BVG | S2BVN | S1AVV | S1B2A | S1BVG | S1AVG | S1AVQ | S1BVQ | S1BVM |
|---|---|---|---|---|---|---|---|---|---|---|---|---|---|
| P1 | 0 | 0 | 0 | 1 | 0 | 0 | 1 | 1 | 0 | 0 | 0 | 1 | 0 |
| P2n | 0 | 0 | 1 | 0 | 0 | 1 | 0 | 0 | 0 | 0 | 0 | 0 | 0 |
| P2p | 0 | 1 | 0 | 0 | 1 | 0 | 0 | 0 | 0 | 0 | 0 | 0 | 0 |
| P2q | 0 | 0 | 0 | 0 | 0 | 0 | 0 | 0 | 1 | 0 | 1 | 0 | 0 |
| P2m | 0 | 0 | 0 | 0 | 0 | 0 | 0 | 0 | 0 | 1 | 0 | 0 | 1 |

Figure 5c

| | Ph1 | Ph2 | Ph3 | Ph4 | Ph5 | Ph6 | Ph7 | Ph8 | Note |
|---|---|---|---|---|---|---|---|---|---|
| a | P1 | P2p | P2n | P2q | P2m | | | | 5-phase |
| b | P1 | P2m | P2q | P2p | P2m | | | | 5-phase |
| c | P1 | P2p | P1 | P2n | P1 | P2m | P1 | P2q | 8-phase |
| d | P1 | P2p+P2q | P2n+P2m | | | | | | 3-phase |
| e | P1 | P2p+P2m | P2n+P2q | | | | | | 3-phase |
| f | P1 | P2p+P2q | P1 | P2n+P2m | | | | | 4-phase |
| g | P1 | (*) | | | | | | | 2-phase |

(*) (P2p or P2n)+(P2q or P2m) according to detected droop

|  | S2AVV | S2AVP | S2AVG | S2BVP | S2BVG | S2BVN | S1AVV | S1B2A | S1BVG | S1AVG | S1AVQ | S1BVQ | S1BVM |
|---|---|---|---|---|---|---|---|---|---|---|---|---|---|
| PA | 1 | 1 | 0 | 0 | 0 | 0 | 0 | 0 | 0 | 0 | 0 | 0 | 0 |
| PB | 0 | 0 | 1 | 0 | 0 | 1 | 0 | 0 | 0 | 0 | 0 | 0 | 0 |
| P1 | 0 | 0 | 0 | 0 | 1 | 0 | 1 | 0 | 0 | 0 | 0 | 1 | 0 |
| P2 | 0 | 0 | 0 | 0 | 0 | 0 | 0 | 0 | 1 | 0 | 1 | 0 | 0 |
| P3 | 0 | 0 | 0 | 0 | 0 | 0 | 0 | 0 | 0 | 1 | 0 | 0 | 1 |

Figure 6a

|  | Ph1 | Ph2 | Ph3 | Ph4 | Ph5 | Ph6 | Note |
|---|---|---|---|---|---|---|---|
| a | P1 | P2 | P3 | PA | PB |  | 5-phase |
| b | P1+PA | P2+PB | P3+PA |  |  |  | 3-phase |
| c | P2+PA | P1+PB | P3+PA | P1+PB |  |  | 4-phase |

Figure 6c

|    | S2AVV | S2AVP | S2AVG | S2BVP | S2BVG | S2BVN | S1AVV | S1B2A | S1BVG | S1AVG | S1AVQ | S1BVQ | S1BVM |
|----|-------|-------|-------|-------|-------|-------|-------|-------|-------|-------|-------|-------|-------|
| PA | 0     | 1     | 0     | 0     | 1     | 0     | 0     | 0     | 0     | 0     | 0     | 0     | 0     |
| PB | 0     | 0     | 1     | 0     | 0     | 1     | 0     | 0     | 0     | 0     | 0     | 0     | 0     |
| PC | 1     | 0     | 0     | 1     | 0     | 0     | 1     | 0     | 0     | 0     | 0     | 0     | 0     |
| P1 | 0     | 0     | 0     | 0     | 0     | 0     | 0     | 0     | 1     | 0     | 0     | 1     | 0     |
| P2 | 0     | 0     | 0     | 0     | 0     | 0     | 0     | 0     | 0     | 0     | 1     | 0     | 0     |
| P3 | 0     | 0     | 0     | 0     | 0     | 0     | 0     | 0     | 0     | 1     | 0     | 0     | 1     |

| | S2AVV | S2AVP | S2AVG | S2BVP | S2BVG | S2BVN | S1AVV | S1B2A | S1BVG | S1AVG | S1AVQ | S1BVQ | S1BVM |
|---|---|---|---|---|---|---|---|---|---|---|---|---|---|
| P1  | 0 | 0 | 0 | 0 | 1 | 0 | 1 | 1 | 0 | 0 | 0 | 1 | 0 |
| P2n | 0 | 0 | 1 | 0 | 0 | 1 | 0 | 0 | 0 | 0 | 0 | 0 | 0 |
| P2p | 0 | 1 | 0 | 0 | 1 | 0 | 0 | 0 | 0 | 0 | 0 | 0 | 0 |
| P2q | 0 | 0 | 0 | 0 | 0 | 0 | 0 | 0 | 1 | 1 | 1 | 0 | 0 |
| P2m | 0 | 0 | 0 | 0 | 0 | 0 | 0 | 0 | 0 | 0 | 0 | 0 | 1 |

Figure 8c

| | Ph1 | Ph2 | Ph3 | Ph4 | Ph5 | Ph6 | Ph7 | Ph8 | Note |
|---|---|---|---|---|---|---|---|---|---|
| a | P1 | P2p | P2n | P2q | P2m | | | | 5-phase |
| b | P1 | P2m | P2q | P2p | P2m | | | | 5-phase |
| c | P1 | P2p | P1 | P2n | P1 | P2m | P1 | P2q | 8-phase |
| d | P1 | P2p+P2q | P2n+P2m | | | | | | 3-phase |
| e | P1 | P2p+P2m | P2n+P2q | | | | | | 3-phase |
| f | P1 | P2p+P2q | P1 | P2n+P2m | | | | | 4-phase |
| g | P1 | (*) | | | | | | | 2-phase |

(*) (P2p or P2n)+(P2q or P2m) according to detected droop

| | S2AVV | S2AVP | S2AVG | S2BVP | S2BVG | S2BVN | S1AVV | S1B2A | S1BVG | S1AVG | S1AVQ | S1BVQ | S1BVM | S1A2B |
|---|---|---|---|---|---|---|---|---|---|---|---|---|---|---|
| P1 | 1 | 0 | 0 | 0 | 1 | 0 | 1 | 0 | 0 | 0 | 0 | 1 | 0 | 0 |
| P2 | 0 | 1 | 0 | 0 | 0 | 0 | 0 | 0 | 1 | 0 | 1 | 0 | 0 | 1 |
| P3 | 0 | 0 | 0 | 0 | 0 | 1 | 0 | 1 | 0 | 1 | 0 | 0 | 1 | 0 |

Figure 10a

| | S2AVV | S2AVP | S2AVG | S2BVP | S2BVG | S2BVN | S1AVV | S1B2A | S1BVG | S1AVG | S1AVQ | S1BVQ | S1BVM | S1A2B | S1BVV | S1A2A |
|---|---|---|---|---|---|---|---|---|---|---|---|---|---|---|---|---|
| P1 | 0 | 0 | 0 | 0 | 0 | 0 | 1 | 0 | 0 | 0 | 0 | 1 | 0 | 0 | 0 | 0 |
| P2 | 0 | 0 | 0 | 0 | 1 | 0 | 0 | 0 | 0 | 0 | 0 | 0 | 0 | 0 | 1 | 1 |
| P3 | 0 | 1 | 0 | 0 | 0 | 0 | 0 | 0 | 1 | 0 | 1 | 0 | 0 | 1 | 0 | 0 |
| P4 | 0 | 0 | 0 | 0 | 0 | 1 | 0 | 1 | 0 | 1 | 0 | 0 | 1 | 0 | 0 | 0 |

| | S2AVV | S2AVP | S2AVG | S2BVP | S2BVG | S2BVN | S1AVV | S1B2A | S1BVG | S1AVG | S1AVQ | S1BVQ | S1BVM | S1A2A | S1B2B | S2AVN |
|---|---|---|---|---|---|---|---|---|---|---|---|---|---|---|---|---|
| P1 | 0 | 0 | 0 | 1 | 0 | 0 | 1 | 1 | 0 | 0 | 0 | 1 | 0 | 0 | 0 | 0 |
| P2c | 0 | 1 | 0 | 0 | 0 | 1 | 0 | 0 | 0 | 0 | 0 | 0 | 0 | 0 | 0 | 0 |
| P2q | 0 | 0 | 0 | 0 | 0 | 0 | 0 | 0 | 1 | 0 | 1 | 0 | 0 | 0 | 0 | 0 |
| P2m | 0 | 0 | 0 | 1 | 0 | 0 | 0 | 0 | 1 | 0 | 0 | 0 | 1 | 0 | 0 | 0 |
| P3 | 0 | 0 | 0 | 0 | 0 | 0 | 0 | 0 | 0 | 1 | 0 | 0 | 0 | 1 | 0 | 0 |
| P4 | 0 | 0 | 0 | 0 | 0 | 0 | 0 | 0 | 0 | 1 | 0 | 0 | 0 | 0 | 1 | 1 |

Figure 14c

| | Ph1 | Ph2 | Ph3 | Ph4 | Note |
|---|---|---|---|---|---|
| a | P1 | P2c+P2m | P3 | P4 | No P2q |
| b | P1 | P2c+P2q | P4 | P2c+P2m | No P3 |
| c | P1 | P2c+P2m | P3+P2a | P4+P2m | |

Figure 15a

| | S2AVV | S2AVP | S2AVG | S2BVP | S2BVG | S2BVN | S1AVV | S1B2A | S1BVG | S1AVG | S1AVQ | S1BVQ | S1BVM | S1A2A | S1B2B | S2AVN |
|---|---|---|---|---|---|---|---|---|---|---|---|---|---|---|---|---|
| P1  | 1 | 0 | 0 | 0 | 0 | 0 | 1 | 0 | 0 | 0 | 0 | 1 | 0 | 0 | 1 | 0 |
| P2n | 0 | 0 | 1 | 0 | 0 | 1 | 0 | 0 | 0 | 0 | 0 | 0 | 0 | 0 | 0 | 0 |
| P2p | 0 | 1 | 0 | 0 | 1 | 0 | 0 | 0 | 0 | 0 | 0 | 0 | 0 | 0 | 0 | 0 |
| P2q | 0 | 0 | 0 | 0 | 0 | 0 | 0 | 0 | 1 | 0 | 1 | 0 | 0 | 0 | 0 | 0 |
| P2m | 0 | 0 | 0 | 0 | 0 | 0 | 0 | 0 | 0 | 1 | 0 | 0 | 1 | 0 | 0 | 0 |

|  | S2AVV | S2AVP | S2AVG | S2BVP | S2BVG | S2BVN | S1AVV | S1B2A | S1BVG | S1AVG | S1AVQ | S1BVQ | S1BVM | S1A2A | S1B2B | S2AVN |
|---|---|---|---|---|---|---|---|---|---|---|---|---|---|---|---|---|
| P1 | 1 | 0 | 0 | 1 | 0 | 0 | 1 | 0 | 0 | 0 | 0 | 1 | 0 | 0 | 1 | 0 |
| P2 | 0 | 1 | 0 | 0 | 1 | 0 | 0 | 0 | 1 | 0 | 1 | 0 | 0 | 1 | 0 | 0 |
| P3 | 0 | 0 | 1 | 0 | 0 | 1 | 0 | 0 | 0 | 1 | 0 | 0 | 1 | 0 | 1 | 0 |

Figure 16a

| | S2AVV | S2AVP | S2AVG | S2BVP | S2BVG | S2BVN | S1AVV | S1B2A | S1BVG | S1AVG | S1AVQ | S1BVQ | S1BVM | S1A2A | S1B2B | S2AVN |
|---|---|---|---|---|---|---|---|---|---|---|---|---|---|---|---|---|
| P4 | 0 | 0 | 0 | 1 | 0 | 0 | 0 | 0 | 1 | 0 | 1 | 0 | 0 | 1 | 0 | 0 |
| P5 | 0 | 0 | 0 | 0 | 0 | 0 | 0 | 0 | 0 | 1 | 0 | 0 | 1 | 0 | 1 | 1 |
| P1 | 0 | 0 | 1 | 1 | 0 | 0 | 1 | 1 | 0 | 0 | 0 | 0 | 0 | 0 | 0 | 0 |
| P2n | 0 | 1 | 0 | 0 | 1 | 1 | 0 | 0 | 0 | 0 | 0 | 1 | 0 | 0 | 0 | 0 |
| P2p | 0 | 0 | 0 | 0 | 0 | 0 | 0 | 0 | 0 | 0 | 0 | 0 | 0 | 0 | 0 | 0 |
| P2q | 0 | 0 | 0 | 0 | 0 | 0 | 0 | 0 | 1 | 1 | 1 | 0 | 0 | 0 | 0 | 0 |
| P2m | 0 | 0 | 0 | 0 | 0 | 0 | 0 | 0 | 0 | 0 | 0 | 0 | 1 | 0 | 0 | 0 |

Figure 17a

| H4 | S1AVV | S1AVQ | S1B2A | S2BVP | S1BVM | S1A2B | S2AVN | S1A2A | S1AVG | S2AVP | S2BVN | S1BVG | S1B2B | S2BVG |
|---|---|---|---|---|---|---|---|---|---|---|---|---|---|---|
| P1 | 1 | 1 | 1 | 1 | 0 | 0 | 0 | 0 | 0 | 0 | 0 | 0 | 0 | 0 |
| P2 | 0 | 0 | 0 | 0 | 1 | 1 | 1 | 0 | 0 | 0 | 0 | 0 | 0 | 0 |
| P3 | 0 | 0 | 0 | 1 | 0 | 0 | 1 | 1 | 0 | 0 | 0 | 1 | 0 | 0 |
| P4 | 0 | 0 | 0 | 0 | 0 | 0 | 0 | 0 | 1 | 1 | 0 | 0 | 1 | 0 |
| P5 | 0 | 0 | 0 | 0 | 0 | 0 | 0 | 0 | 0 | 0 | 0 | 0 | 0 | 1 |

Figure 20a

| H6 | S1AVV | S1AVQ | S1B2A | S2BVP | S1BVM | S1A2B | S2AVN | S1A2A | S1AVG | S2AVP | S2BVN | S1BVG | S1B2B | S2BVG |
|---|---|---|---|---|---|---|---|---|---|---|---|---|---|---|
| P1 | 1 | 1 | 1 | 1 | 0 | 0 | 0 | 0 | 0 | 0 | 0 | 0 | 0 | 0 |
| P2 | 0 | 0 | 0 | 0 | 1 | 1 | 1 | 0 | 0 | 0 | 0 | 0 | 0 | 0 |
| P3 | 0 | 0 | 0 | 1 | 0 | 0 | 0 | 1 | 0 | 0 | 0 | 1 | 0 | 0 |
| P4 | 0 | 0 | 0 | 0 | 0 | 0 | 0 | 0 | 1 | 0 | 0 | 0 | 1 | 0 |
| P5 | 0 | 0 | 0 | 0 | 0 | 0 | 0 | 0 | 0 | 1 | 1 | 0 | 0 | 0 |

Figure 21a

| H3 | S1AVV | S1AVQ | S1B2A | S2BVP | S1BVM | S1A2B | S2AVN | S1A2A | S1AVG | S2AVP | S2BVN | S1BVG | S1B2B | S2BVG |
|----|-------|-------|-------|-------|-------|-------|-------|-------|-------|-------|-------|-------|-------|-------|
| P1 | 1 | 1 | 1 | 1 | 0 | 0 | 0 | 0 | 0 | 0 | 0 | 0 | 0 | 0 |
| P2 | 0 | 0 | 0 | 0 | 1 | 1 | 1 | 0 | 0 | 0 | 0 | 0 | 0 | 0 |
| P3 | 0 | 0 | 0 | 0 | 0 | 0 | 0 | 1 | 1 | 1 | 0 | 1 | 0 | 1 |
| P4 | 0 | 0 | 0 | 0 | 0 | 0 | 0 | 1 | 1 | 0 | 1 | 0 | 1 | 0 |

Figure 22a

| H2 | S1AVV | S1AVQ | S1B2A | S2BVP | S1BVM | S1A2B | S2AVN | S1A2A | S1AVG | S2AVP | S2BVN | S1BVG | S1B2B | S2BVG |
|---|---|---|---|---|---|---|---|---|---|---|---|---|---|---|
| P1 | 1 | 1 | 0 | 1 | 0 | 0 | 0 | 1 | 0 | 0 | 0 | 1 | 0 | 0 |
| P2 | 0 | 0 | 0 | 0 | 1 | 0 | 0 | 0 | 1 | 1 | 0 | 0 | 0 | 1 |
| P3 | 1 | 1 | 1 | 0 | 0 | 0 | 0 | 0 | 0 | 0 | 1 | 1 | 0 | 0 |
| P4 | 0 | 0 | 0 | 0 | 1 | 0 | 1 | 0 | 1 | 0 | 0 | 0 | 1 | 0 |

Figure 23a

| H1 | S1AVV | S1AVQ | S1B2A | S2BVP | S1BVM | S1A2B | S2AVN | S1A2A | S1AVG | S2AVP | S2BVN | S1BVG | S1B2B | S2BVG |
|---|---|---|---|---|---|---|---|---|---|---|---|---|---|---|
| P1 | 1 | 1 | 0 | 0 | 0 | 0 | 0 | 1 | 0 | 1 | 0 | 1 | 0 | 1 |
| P2 | 0 | 0 | 0 | 0 | 1 | 0 | 0 | 1 | 1 | 0 | 1 | 0 | 1 | 0 |

Figure 24a

| H2X | S1AVV | S1AVQ | S1B2A | S2BVP | S1BVM | S1A2B | S2AVN | S1A2A | S1AVG | S2AVP | S2BVN | S1BVG | S1B2B | S2BVG |
|---|---|---|---|---|---|---|---|---|---|---|---|---|---|---|
| P1 | 1 | 1 | 0 | 0 | 0 | 0 | 0 | 1 | 0 | 0 | 0 | 1 | 0 | 1 |
| P2 | 0 | 1 | 0 | 0 | 0 | 1 | 0 | 0 | 0 | 1 | 0 | 1 | 0 | 0 |
| P3 | 0 | 0 | 1 | 0 | 1 | 0 | 0 | 0 | 1 | 0 | 1 | 0 | 0 | 0 |
| P4 | 0 | 0 | 0 | 0 | 1 | 0 | 0 | 1 | 1 | 0 | 0 | 0 | 1 | 0 |

Figure 25a

| H3X | S1AVV | S1AVQ | S1B2A | S2BVP | S1BVM | S1A2B | S2AVN | S1A2A | S1AVG | S2AVP | S2BVN | S1BVG | S1B2B | S2BVG | S2AVG | S1BVQ | S2AVV |
|---|---|---|---|---|---|---|---|---|---|---|---|---|---|---|---|---|---|
| P1 | 1 | 1 | 0 | 0 | 0 | 1 | 0 | 0 | 0 | 1 | 0 | 1 | 0 | 0 | 0 | 0 | 0 |
| P2 | 0 | 0 | 0 | 0 | 0 | 0 | 0 | 1 | 0 | 0 | 0 | 0 | 0 | 1 | 0 | 1 | 0 |
| P5 | 0 | 0 | 1 | 0 | 1 | 0 | 0 | 0 | 1 | 0 | 1 | 0 | 0 | 0 | 0 | 0 | 0 |

Figure 27a

| H5 | S1AVV | S1AVQ | S1B2A | S2BVP | S1BVM | S1A2B | S2AVN | S1A2A | S1AVG | S2AVP | S2BVN | S1BVG | S1B2B | S2BVG | S2AVG | S1BVQ | S2AVV | S1BVN | S1BVV |
|---|---|---|---|---|---|---|---|---|---|---|---|---|---|---|---|---|---|---|---|
| P1 | 1 | 1 | 1 | 1 | 0 | 0 | 0 | 0 | 0 | 0 | 0 | 0 | 0 | 0 | 0 | 0 | 0 | 0 | 0 |
| P2 | 0 | 0 | 0 | 0 | 1 | 1 | 1 | 0 | 0 | 0 | 0 | 0 | 0 | 0 | 0 | 0 | 0 | 0 | 0 |
| P3 | 0 | 0 | 0 | 1 | 0 | 0 | 0 | 1 | 0 | 0 | 0 | 0 | 0 | 0 | 0 | 0 | 0 | 1 | 0 |
| P4 | 0 | 0 | 0 | 0 | 0 | 0 | 0 | 0 | 0 | 1 | 0 | 0 | 0 | 1 | 0 | 0 | 0 | 0 | 0 |
| P5 | 0 | 0 | 0 | 0 | 0 | 0 | 0 | 0 | 0 | 0 | 1 | 0 | 0 | 0 | 1 | 0 | 0 | 0 | 0 |

Figure 29a

CHARGE PUMP CIRCUIT

This is a continuation of U.S. application Ser. No. 13/336,795, filed Dec. 23, 2011, now abandoned, which claims the benefit of U.S. Provisional Application No. 61/427,431, filed on Dec. 27, 2010.

BACKGROUND OF THE INVENTION

1. Field of the Invention

Aspects of the present invention relate to a bipolar output voltage charge pump circuit and more particularly, they relate to a bipolar output voltage charge pump circuit which provides two bipolar output voltages, i.e. two pairs of opposite polarity output voltages.

2. Description of the Related Art

Bipolar, i.e. dual rail, output voltage charge pump circuits are a type of DC-DC converter that utilize transfer and storage capacitors as devices to respectively transfer and store energy such that the converter is able to provide, from a unipolar, i.e. single rail, input voltage source, a bipolar output voltage that may be different in value from that of the unipolar input voltage.

In use, single bipolar output voltage charge pump circuits may comprise two output storage capacitors, typically known as "reservoir capacitors" and one or more energy transfer capacitors, typically known as "flying capacitors". The terminals or connectors of the two "reservoir capacitors" are permanently connected to respective output voltage terminals or nodes. In contrast, the terminals or connectors of the two "flying capacitors" are capable of being switched, in a controlled sequence, to input or output voltage terminals or nodes or to the other flying capacitor terminals or nodes.

For example, a known single bipolar output voltage charge pump circuit, as disclosed in the present applicants co-pending UK patent application GB 2444985, can provide positive and negative bipolar output voltages (+/−VV/2) that are each equal to half the magnitude of the charge pump circuit's unipolar input voltage.

Furthermore, by suitable control, the co-pending UK patent application can also provide positive and negative bipolar output voltages (+/−VV) that are each equal to the magnitude of the charge pump circuit's unipolar input voltage.

Such a known bipolar output voltage charge pump circuit uses an arrangement, i.e. a network, of switches to control the connection of the terminals of the two reservoir capacitors, i.e. the two output voltage terminals, and those of the flying capacitors. The flying capacitor terminals may be connected by these switches to: the input voltage terminal, i.e. the unipolar input voltage; the output voltage terminals, i.e. the bipolar output voltages; a reference terminal, e.g. ground potential; and to one another in order to obtain either the bipolar output voltage +/−VV/2 or +/−VV.

FIG. 1 schematically shows a known audio output chain 10, utilising a charge pump 12. The audio output chain 10 receives input audio signal data 14 and after processing and amplifying the audio signal, outputs an audio signal 15. Audio signal 15 may be output to a load (not illustrated) such as headphones, speakers or a line load, possibly via a connector (not illustrated) such as a mono or stereo jack.

Input audio signal data 14 is first processed in a digital processing block 16, which is powered by DVDD and DVSS, say 1.2V and ground i.e. 0V, giving output binary digital signals with output logic levels equal to DVDD and DVSS. These output logic levels are then level shifted by digital level shifter 18 to logic levels of VV and VG required to drive the digital-to-analogue converter (DAC) 20, supplied by supplies VV and VG, say 1.8V and ground. The level shifted audio data is then converted to analogue signal data by the DAC 20. The output from the DAC 20 is input to a first amplifier stage 22, and then onto a second amplifier stage 24 which may be a headphone amplifier.

In FIG. 1, the first amplifier stage 22 is powered by the input supply voltage VV and a reference voltage VG, say ground. To maximise signal swing in each polarity, the amplifier will be configured so that its output will preferably be biased approximately half way between VV and VG, e.g. at VV/2. However, if the second amplifier stage 24 was also powered by the input voltage VV and the reference voltage VG, the amplifier output voltage would again preferably be centred about VV/2. To avoid passing d.c. current though the load, e.g. a speaker with other terminal grounded, a coupling capacitor would be required in series between the amplifier output and the load. It is well known in the art that this series connected coupling capacitor needs to be a large value to allow adequate bass response, and so tends to be physically large and expensive. Also on power-up and power down charging this capacitor up to its quiescent voltage of VV/2 is liable to cause audible pops, clicks and other audio artefacts in the audio output signal 15. Techniques are known to reduce these artefacts, but in practice cannot remove them completely, and demands of users for reduced audio artefacts are becoming ever more stringent.

In order to eliminate the above problems, the circuit of FIG. 1 uses an analogue level shift block 26, to level shift the output from the first amplifier stage 22 such that the DC quiescent voltage is removed and the signal out of the second amplifier stage 22 is balanced around zero volts i.e. ground. A charge pump circuit 12 (or some other bipolar supply means) is then necessary to provide from a unipolar supply VV, a bipolar supply voltage (VP, VN) to the second amplifier stage, to allow the second amplifier stage to drive the audio output signal 15 at either polarity centered about ground As can be seen from FIG. 1, the charge pump circuit 12 receives an input voltage VV and a reference voltage VG, say ground, and is clocked by a clock signal CK. The charge pump circuit 12 also has a flying capacitor 28. The output voltage VP, VN of the charge pump 12 may be +/−αVV, where a may be 1 or 0.5. In this way, as the audio output signal 15 from the second amplifier stage 24 may be balanced around the reference VG, in this case ground potential, the problems associated with having to have the large coupling capacitor therefore no longer exist.

However, in FIG. 1, it is necessary to perform an analogue level shift on the output signal, centred on VV/2, of the amplifier 22 to bring its quiescent level down to ground. The analogue level shifter 26 is shown as connected between the output of amplifier 22 and the input of output driver stage 24: in some implementations it may comprise a resistor network within driver amplifier stage 24, coupled to the output of the amplifier stage 24. This analogue level shift is undesirable, as any shift from VV/2 to ground may lead to some voltage drop across some resistance, and hence power will be wasted. The level shift circuit itself may introduce audio artefacts on power-up.

Further, charge pump circuits, such as charge pump circuit 12 shown in FIG. 1, are widely used in portable electronics devices where decreasing power consumption in order to extend battery discharge time is becoming ever more important. For an audio chain driving a 16 ohm headphone for example, typical listening levels in a quiet environment may require only 100 μW (40 mV rms or 2.5 mA rms for a 16 ohm headphone). However if this current is supplied from a +/−1.5V supply (required to drive 50 mW peaks for audibility in noisier environments) then the 2.5 mA rms sourced from the 1.5V supply consumes 3.3 mW, i.e. an efficiency of 100 μW/3.3 mW=3%. Even if the supply voltage (VP, VN) can be halved using the aforesaid known charge pump described above, then the efficiency is still poor, and reducing the power supply further makes it difficult practically to get enough voltage headroom for the input stage of amplifier 24.

Further, especially at low signal levels, the power required to switch the switching devices of the charge pump may be significant enough to degrade the efficiency.

Furthermore, in order to drive transducers such as piezoelectric transducers, haptic transducers or backlights for example, bipolar output voltages of greater than VV may be required. The same output chain may be required to drive such loads in some use cases, with a consequent requirement for operating modes with bipolar output stage supply voltages greater than VV.

It is desirable to be able to operate a particular charge pump circuit, particularly an integrated circuit implementation, in various applications which may have different supply voltages available. In order to maintain similar performance with different input supply voltages, it is desirable to have a range of step-down and step-up ratios available.

Charge pumps that generate a range of output voltages may have multiple flying capacitors. These flying capacitors are generally too large to be accommodated on-chip, so require dedicated pins on the package a well as occupying area on the PCB. It is desirable to minimize the number of flying capacitors to reduce cost, package size and board area.

It is therefore desirable to provide an audio output chain and an appropriate charge pump that can supply a wide range of output stage bipolar supply voltages to reduce or minimize power consumption over a wide range of output signal levels and input supplies while allowing adequate signal swing in the rest of the chain without requiring any analogue level-shifting in the signal path, while providing a low cost and small physical size.

SUMMARY OF THE INVENTION

According to an aspect of the present invention, there is provided a charge pump circuit, comprising: an input node and a reference node for connection to an input voltage; a first pair of output nodes and a second pair of output nodes; two pairs of flying capacitor nodes; a network of switching paths for interconnecting said nodes; and a controller operable to control the network of switching paths when in use with two flying capacitors connected to the two pairs of flying capacitor nodes, to provide a first bipolar output voltage at the first pair of output nodes and a second bipolar output voltage at the second pair of bipolar output nodes.

The controller may be operable to control the network of switching paths such that the first bipolar output voltage is operable to be a selectively variable bipolar output voltage, and the second bipolar output voltage a fixed bipolar voltage.

The controller may be operable to control the network of switching paths such that the first bipolar output voltage is operable to be a selectively variable first bipolar output voltage, and the second bipolar output voltage is operable to be a selectively variable second bipolar output voltage.

The controller may be operable to control the network of switching paths such that the first bipolar output voltage is +/−VV/6, where VV is the input supply voltage to the charge pump circuit.

The controller may be operable to control the network of switching paths such that the first bipolar output voltage is +/−(3/2)*VV and the second bipolar output voltage is +/−VV/2.

The controller may be operable to control the network of switching paths such that the voltage across the first flying capacitor is VV/4 and the voltage across the second flying capacitor is VV/2.

The controller may be operable to control the network of switching paths such that the first bipolar output voltage is +/−3VV.

The controller may be operable to control the network of switching paths such that the first bipolar output voltage is +/−VV/4 and the second bipolar output voltage is +/−VV/2.

The controller may be operable to control the network of switching paths such that the voltage across the first flying capacitor (CF2) is VV/3 and the voltage across the second flying capacitor (CF1) is VV/3.

The controller may be operable to control the network of switching paths such that the first bipolar output voltage is +/−VV/3.

The controller may be operable to control the network of switching paths such that the first bipolar output voltage is +/−VV/6 and the second bipolar output voltage is +/−VV/2.

The controller may be operable to control the network of switching paths such that the voltage across the first flying capacitor is VV/5 and the voltage across the second flying capacitor is (3/5)*VV.

The controller may be operable to control the network of switching paths such that the first bipolar output voltage is +/−VV/4.

The controller may be operable to control the network of switching paths such that the first bipolar output voltage is +/−VV/5.

The controller may be operable to control the network of switching paths such that first bipolar output voltage is one of +/−2VV, +/−(3/2)*VV, +/−VV, +/−VV/2, +/−VV/4, or +/−VV/6 and the second bipolar output voltage is +/−VV2.

The controller may be operable to control the network of switching paths such that first bipolar output voltage is one of +/−3VV, +/−2VV, +/−VV, +/−VV/2, +/−VV/3, +/−VV/4, +/−VV/5 or +/−VV/6 and the second bipolar output voltage is +/−VV.

When the controller is operable to control the network of switching paths such that the first bipolar output voltage is operable to be a selectively variable bipolar output voltage, and the second bipolar output voltage a fixed bipolar voltage, the controller may be operable to control the network of switching paths to provide +/−VV/2 as said fixed bipolar output voltage, where VV is the input supply voltage to the charge pump circuit. The controller may operable to control the network of switching paths to selectively provide two or more modes, said variable bipolar output voltage in each mode corresponding to a bipolar output voltage of +/−2VV, +/−(3/2)*VV, +/−VV, +/−VV/2, +/−VV/4, or +/−VV/6. The controller may also be operable to control the network of switching paths to provide +/−VV as said fixed bipolar output voltage and operable to control the network of switching paths to selectively provide two or more modes, the variable bipolar output voltage in each mode corresponding to a bipolar output voltage of +/−3VV, +/−2VV, +/−VV, +/−VV/2, +/−VV/3, +/−VV/4, +/−VV/5 or +/−VV/6.

When the controller is operable to control the network of switching paths such that both the first and second bipolar output voltages are selectively variable, the controller may be operable to control the network of switching paths to selectively provide, the variable second bipolar output voltage to be +/−VV or +/−VV/2. When the variable second bipolar output voltage is +/−VV, the controller may be operable to control the network of switching paths to selectively provide one or more modes, the variable bipolar output voltage in each mode corresponding to a bipolar output voltage of +/−3VV, +/−2VV, +/−VV, +/−VV/2, +/−VV/3, +/−VV/4, +/−VV/5 or +/−VV/6. When the variable second bipolar output voltage is +/−VV/2, the controller is operable to control the network of switching paths to selectively provide one or more modes, the variable bipolar output voltage in each mode corresponding to a bipolar output voltage of +/−2VV, +/−(3/2)*VV, +/−VV, +/−VV/2, +/−VV/4, or +/−VV/6.

In use, a first flying capacitor may be connected to first and second flying capacitor nodes, and a second flying capacitor may be connected to third and fourth flying capacitor nodes, a first reservoir capacitor may be connected between a first output node and the reference node, a second reservoir capacitor may be connected between the reference node and a second output node, a third reservoir capacitor may be connected between a third output node and the reference node and a fourth reservoir capacitor may be connected between the reference node and a fourth output node.

The controller may be operable to control the network of switching paths such that, in a first switching state, the first flying capacitor, the second flying capacitor and the first reservoir capacitor are connected in series between the input node and the reference node, the series connected first flying capacitor and the first reservoir capacitor are also connected in parallel to the third reservoir capacitor between the third output node and the reference node, and the second flying capacitor and the third reservoir capacitor are connected in series between the input node and the reference node. The controller may be operable to control the network of switching paths such that the first bipolar output voltage is +/−VV/4 and the second bipolar output voltage is +/−VV/2.

The controller may be operable to control the network of switching paths such that in a second switching state, the first flying capacitor and the second reservoir capacitor are connected in series, and the second flying capacitor is connected in parallel with the series connected first flying capacitor and second reservoir capacitor. The controller may be operable to control the network of switching paths such that the first bipolar output is +/−VV/6 and the second bipolar output is +/−VV/2.

At least one output voltage (VP, VN, VQ, VM) of the charge pump circuit, or a voltage difference between any two output voltages, may be compared with a threshold level. The threshold may be independent of the input supply voltage VV.

The controller may be operable to control the network of switching paths such that first reservoir capacitor is recharged when the first output is smaller in magnitude than a first threshold, the second reservoir capacitor is recharged when the second output is smaller in magnitude than a second threshold, the third reservoir capacitor is recharged when the third output is smaller in magnitude than a third threshold, and the fourth reservoir capacitor is recharged when the fourth output is smaller in magnitude than a fourth threshold.

According to another aspect of the present invention, there is provided an audio output chain arranged to receive an input audio signal and process the audio signal to drive a load, said load comprising at least one of: a headphone, a speaker, a line load, a haptic transducer, a piezoelectric transducer, or an ultrasonic transducer, the audio output chain comprising the charge pump circuit according to any preceding claim.

The controller may be operable to control the switching sequence of the network of switches in dependence on a comparison of at least one of the outputs of the charge pump, or difference in voltage of a bipolar output of the charge pump, with a threshold level. The threshold level may be independent of the input voltage.

The audio output chain may further comprise a charge pump controller, wherein the charge pump controller is operable to receive a control signal, the threshold level being dependent on the control signal. The control signal may be a gain or volume signal.

The controller may be operable to control the network of switching paths such that first reservoir capacitor is recharged when the first output is smaller in magnitude than a first threshold, and the second reservoir capacitor is recharged when the second output is smaller in magnitude than a second threshold.

The controller may additionally be operable to control the network of switching paths such that the third reservoir capacitor is recharged when the third output is smaller in magnitude than a third threshold, and the fourth reservoir capacitor is recharged when the fourth output is smaller in magnitude than a fourth threshold.

The charge pump controller may be operable to receive an input audio signal, the threshold level being dependent on the input audio signal.

There is also provided an integrated circuit comprising the above charge pump circuit.

There is also provided an audio device comprising the above charge pump circuit. Said device may be at least one of: a battery powered device, a portable device, a personal audio device, a personal video device; a mobile telephone, a personal data assistant, a gaming device, a portable computing device, a laptop and a satellite navigation system.

According to another aspect of the present invention, there is provided a method of controlling a charge pump circuit to generate a bipolar output voltage, the charge pump circuit comprising an input node and a reference node for connection to an input voltage, a first pair of output nodes and a second pair of output nodes, two pairs of flying capacitor nodes, and a network of switching paths for interconnecting said nodes, the method comprising the step of: controlling the network of switching paths when in use with two flying capacitors connected to the two pairs of flying capacitor nodes, to provide a first bipolar output voltage at the first pair of output nodes and a second bipolar output voltage at the second pair of bipolar output nodes.

BRIEF DESCRIPTION OF THE DRAWINGS

Embodiments of the present invention will now be described with reference to the accompany drawings, of which:

FIG. 4a shows a circuit diagram of a switch matrix according to an embodiment of the invention;

FIG. 4b shows a network plan of the switching paths in the switch matrix of FIG. 4a;

FIG. 5a is a table indicating which of the switching paths in FIG. 4a are closed in a first mode of operation;

FIG. 5c shows the sequencing of phases of the first mode of operation;

FIG. 6a is a table indicating which of the switching paths in FIG. 4a are closed in a second mode of operation;

FIG. 6c shows the sequencing of phases of the second mode of operation;

FIG. 7a is a table indicating which of the switching paths in FIG. 4a are closed in a third mode of operation;

FIG. 8a is a table indicating which of the switching paths in FIG. 4a are closed in a fourth mode of operation;

FIG. 8c shows the sequencing of phases of the fourth mode of operation;

FIG. 9b shows a network plan of the switching paths in the switch matrix of FIG. 9a;

FIG. 10a is a table indicating which of the switching paths in FIG. 9a are closed in a fifth mode of operation;

FIG. 11b shows a network plan of the switching paths in the switch matrix of FIG. 11a;

FIG. 12a is a table indicating which of the switching paths in FIG. 11a are closed in a sixth mode of operation;

FIG. 13b shows a network plan of the switching paths in the switch matrix of FIG. 13a;

FIG. 14a is a table indicating which of the switching paths in FIG. 13a are closed in an seventh mode of operation;

FIG. 14c shows the sequencing of phases of the seventh mode of operation;

FIG. 15a is a table indicating which of the switching paths in FIG. 13a are closed in an eighth mode of operation;

FIG. 16a is a table indicating which of the switching paths in FIG. 13a are closed in a ninth mode of operation;

FIG. 17a is a table indicating which of the switching paths in FIG. 13a are closed in a tenth mode of operation;

FIG. 18b shows a network plan of the switching paths in the switch matrix of FIG. 18a;

FIG. 19b shows a network plan of the switching paths in the switch matrix of FIG. 19a;

FIG. 20a is a table indicating which of the switching paths in FIG. 19a are closed in an eleventh mode of operation;

FIG. 21a is a table indicating which of the switching paths in FIG. 19a are closed in a twelfth mode of operation;

FIG. 22a is a table indicating which of the switching paths in FIG. 19a are closed in a thirteenth mode of operation;

FIG. 23a is a table indicating which of the switching paths in FIG. 19a are closed in a fourteenth mode of operation;

FIG. 24a is a table indicating which of the switching paths in FIG. 19a are closed in a fifteenth mode of operation;

FIG. 25a is a table indicating which of the switching paths in FIG. 19a are closed in a sixteenth mode of operation;

FIG. 26b shows a network plan of the switching paths in the switch matrix of FIG. 26a;

FIG. 27a is a table indicating which of the switching paths in FIG. 26a are closed in a seventeenth mode of operation;

FIG. 28b shows a network plan of the switching paths in the switch matrix of FIG. 28a;

FIG. 29a is a table indicating which of the switching paths in FIG. 26a are closed in an eighteenth mode of operation;

FIG. 31b shows a network plan of the switching paths in the switch matrix of FIG. 31a;

DETAILED DESCRIPTION OF THE PREFERRED EMBODIMENTS

Figure 2:
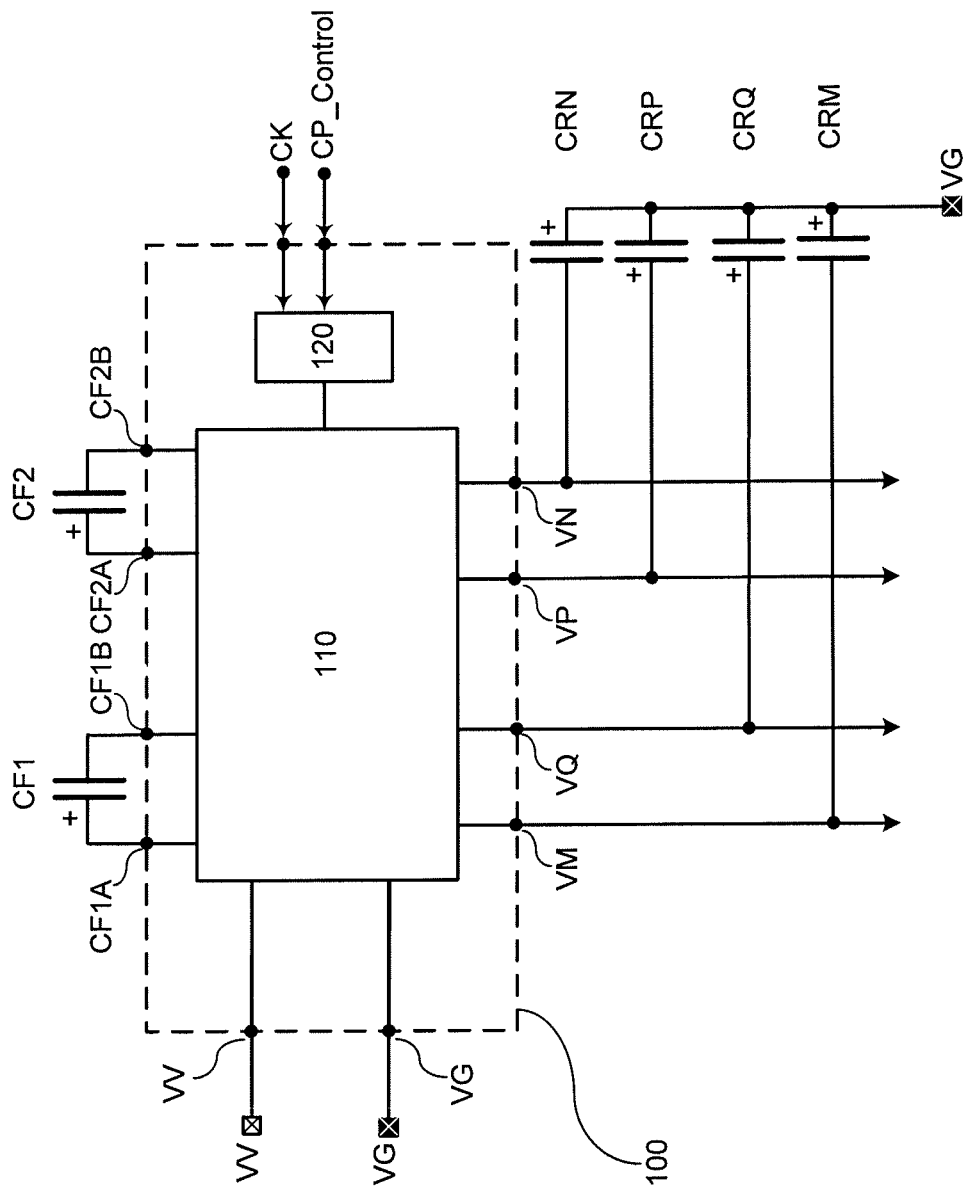
FIG. 2 schematically shows a charge pump circuit according to an embodiment of the invention.

FIG. 2 schematically shows a charge pump circuit 100 that includes a plurality of nodes and a network of switching paths, i.e. a switch matrix or network of switches or switching network, 110, for selective connection of the plurality of nodes and a controller 120 for controlling the network of switching paths. The charge pump circuit 100 includes an input node (VV) for receiving an input voltage, a reference node (VG) for receiving a reference voltage, a first flying capacitor node (CF2A) and a second flying capacitor node (CF2B) for connection with a first flying capacitor (CF2), a third flying capacitor node (CF1A) and a fourth flying capacitor node (CF1B) for connection with a second flying capacitor (CF1), a first pair of output nodes comprising a first output node (VP) and a second output node (VN), and a second pair of output nodes comprising a third output node (VQ) and a fourth output node (VM).

As shown in FIG. 2 and throughout the figures, the input node VV is shown with a white box with a black cross. Likewise, the reference node VG is shown with a black box with a white cross. It should be understood that the input node VV, the reference node VG, the first and second output nodes VP, VN and the first to fourth flying capacitor nodes CF1A, CF1B, CF2A, CF2B, are nodes on the charge pump circuit for connection to components/inputs external from the charge pump.

FIG. 2 shows charge pump circuit 100 in use, i.e. with a first flying capacitor (CF2) and a second flying capacitor (CF1) connected to the first and second (CF2A,CF2B), and third and fourth flying capacitor nodes (CF1A,CF1B) respectively. A first reservoir capacitor (CRP) is connected to the first output node (VP), a second reservoir capacitor (CRN) is connected to the second output node (VN), a third reservoir capacitor (CRQ) is connected to the third output node (VQ) and a fourth reservoir capacitor (CRM) is connected to the fourth output node (VM). The reservoir capacitors are arranged such that in use, the negative terminals of the first and third (CRP,CRQ) and the positive terminals of the second and fourth (CRN, CRM) reservoir capacitors are connected to the reference voltage.

While the positive and negative terminals on these capacitors, i.e. the terminals which in normal operation will be positive and negative with respect to each other, are identified as such, these capacitors may be polarised (e.g. electrolytic) or non-polarised (e.g. ceramic) capacitors according to normal design choice.

In the example shown in FIG. 2, the reference voltage VG is ground, though as would be understood by a person skilled in the art, the reference voltage could be a voltage other than ground.

The controller 120 may control the network of switching paths 110 such that the charge pump circuit 100 is operable to provide a first bipolar output voltage at the first pair of output nodes and a second bipolar voltage at the second pair of output nodes.

The term bipolar voltage is to be understood to mean two voltages of opposite polarity relative to some reference voltage, usually a ground voltage. The bipolar voltage may be symmetric, i.e. be a pair of equal and opposite voltages, centred about ground, or may be asymmetric, i.e. be a pair of unequal but opposite polarity voltages. However, as would be understood, if a reference voltage other than ground was used, a symmetric bipolar output voltage may be centred around the reference voltage.

In other words, the charge pump circuit is operable to provide a positive first output voltage at the first output node (VP), a negative first output voltage at the second output node (VN), a positive second output voltage at the third output node (VQ) and a negative second output voltage at the fourth output node (VM). The first and second bipolar output voltages may be the same.

In embodiments of the charge pump circuit 100 described herein, by control of the network of switching paths 110 by the controller 120, the charge pump circuit 100 may be operable to provide a first bipolar output voltage at the first and second output nodes (VP,VN) of one of +/−3VV, +/−2VV, +/−3⁄2VV, +/−VV, +/−VV/2, +/−VV/3, +/−VV/4, +/−VV/5 or +/−VV/6, where VV is the input voltage.

By control of the network of switching paths 110 by the controller 120, the charge pump circuit 100 may be operable to provide a second bipolar output voltage at the third and fourth output nodes (VQ,VM) of one of +/−VV or +/−VV/2, where VV is the input voltage.

Additionally, the controller 120 may selectively control the switching network 110 to provide a variable, or selectable, first bipolar output voltage at the first and second output nodes (VP,VN), while maintaining a fixed second bipolar output voltage at the third and fourth output nodes (VQ,VN). The switching network 110 may be controlled such that the variable first bipolar output may be selectable to be one or more of +/−3VV, +/−2VV, +/−3⁄2VV/2, +/−VV, +/−VV/2, +/−VV/3, +/−VV/4, +/−VV/5 or +/−VV/6. The switching network 110 may be controlled such that the fixed second bipolar output may either be fixed to +/−VV or be fixed to be +/−VV/2.

Further, the controller 120 may selectively control the switching network 110 to provide a variable, or selectable, first bipolar output voltage at the first and second output nodes (VP,VN), and a variable, or selectable, second bipolar output voltage at the third and fourth output nodes (VQ,VN). The switching network 110 may be controlled such that the first variable first bipolar output may be selectable to be one or more of +/−3VV, +/−2VV, +/−3⁄2VV, +/−VV, +/−VV/2, +/−VV/3, +/−VV/4, +/−VV/5 or +/−VV/6. The switching network 110 may be controlled such that the second bipolar output may be selectable in use to be +/−VV or +/−VV/2.

Figure 3:
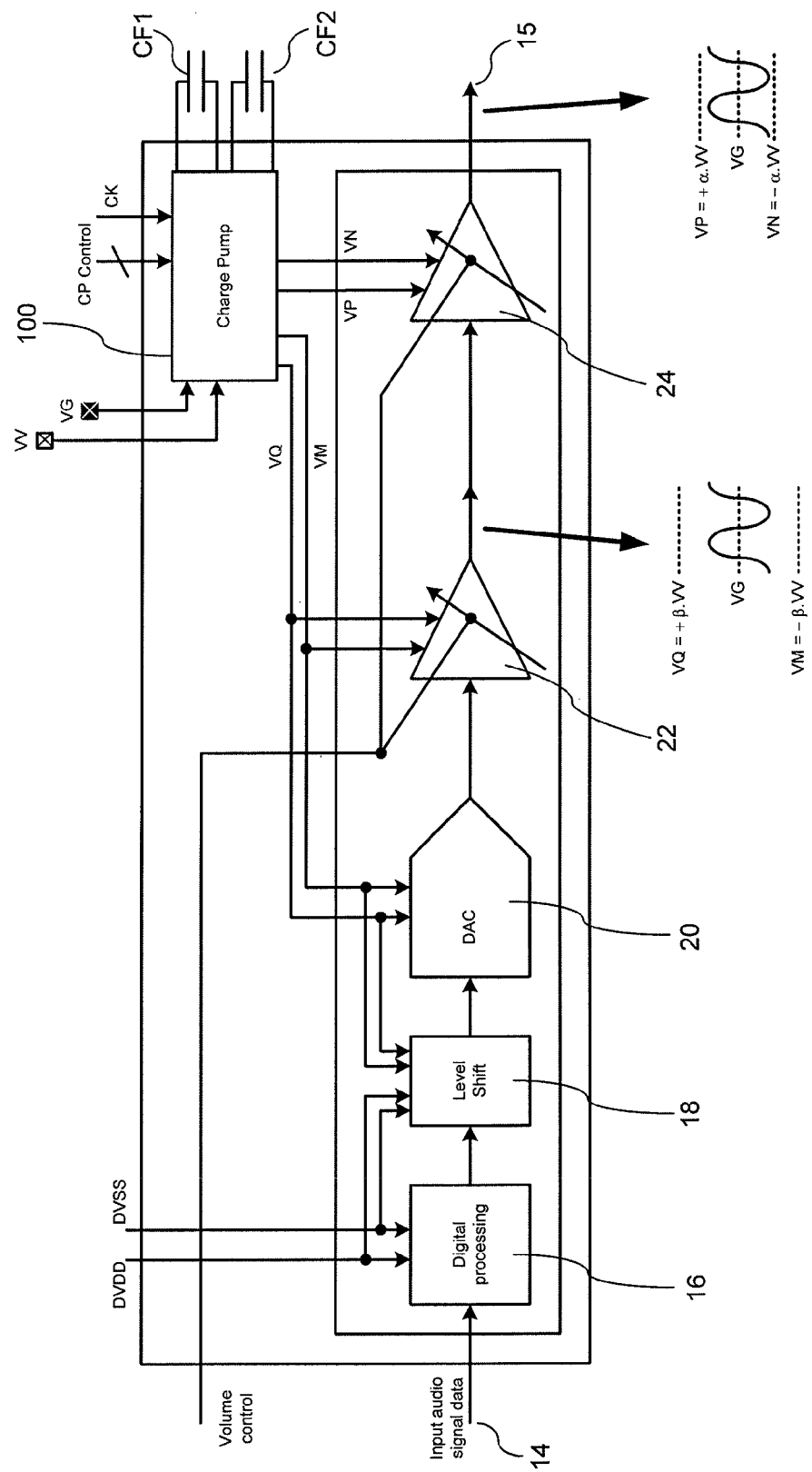
FIG. 3 schematically shows the charge pump circuit of FIG. 2 in use in an audio output chain.

The above voltages may be directly or indirectly selectable by means of a control signal CP_Control as shown in FIG. 3. The control signal CP_Control may be generated externally, or may be generated within an audio output chain containing the charge pump 100. The charge pump 100 may also receive an externally supplied clock CK, or may generate a clock internally.

It should be understood that the above voltages are nominal voltages. Each nominal voltage is associated with a particular control of the switch matrix, such that in ideal conditions, that nominal output voltage would be achieved. In practice however, the actual output voltages may be reduced by effects such as switch resistance and load current. In some embodiments the charge pump 100 may be regulated to supply a somewhat reduced voltage, possibly related to a reference voltage (e.g. a bandgap voltage) independent of VV, which reference voltage may also vary with time, for example according to the envelope of some audio signal, although in the absence of such reduction by regulation the charge pump 100 would be capable of generating the above nominal voltages, i.e. would still be operating in a mode corresponding to one of the nominal voltages. In some embodiments the regulation of the charge pump may render an output voltage asymmetric, even though the charge pump output would otherwise be a symmetric bipolar output voltage.

Figure 1:
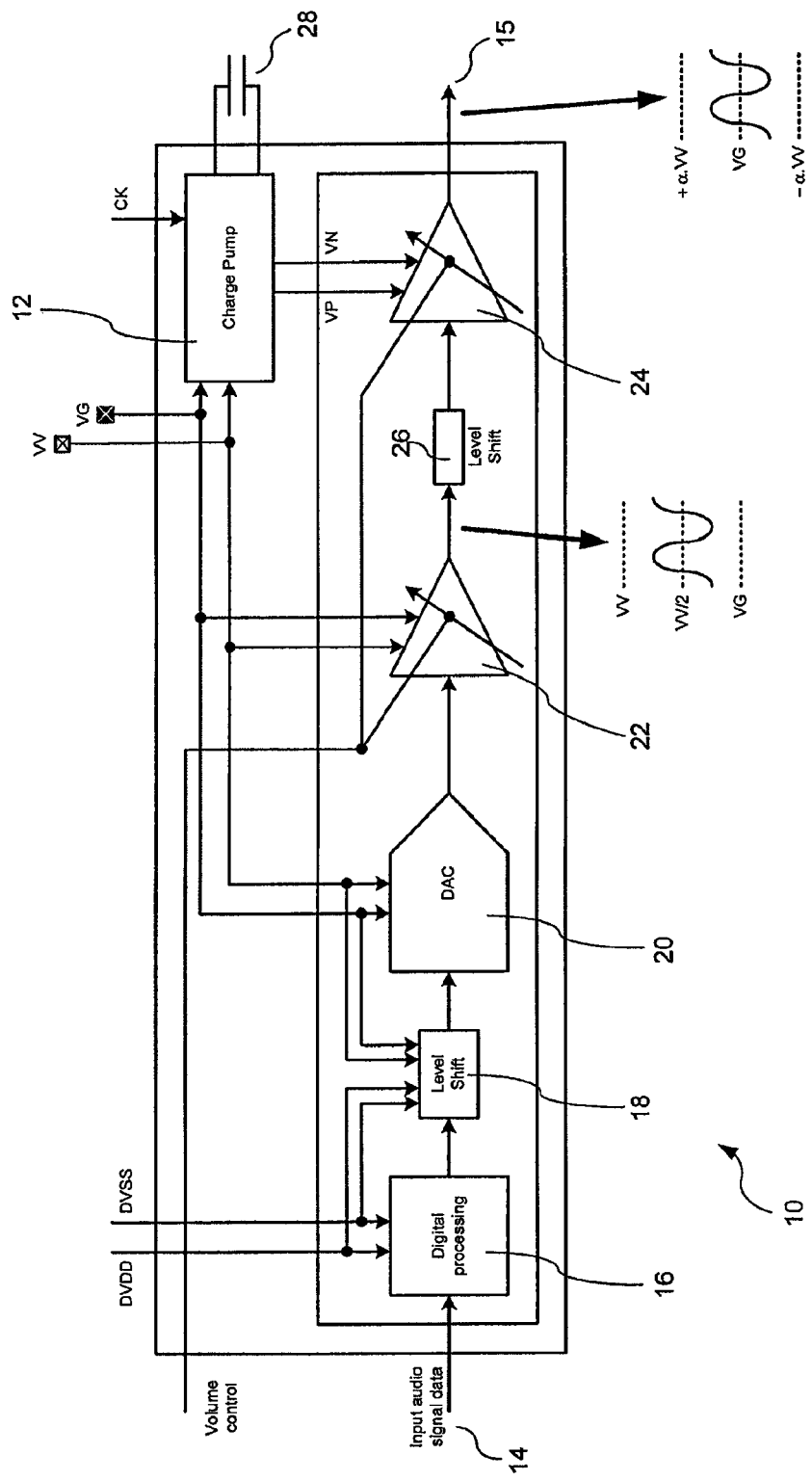
FIG. 1 schematically shows a prior art audio output chain.

FIG. 3 shows an audio output chain, that includes the charge pump circuit 100 of FIG. 2. Elements that are common to FIGS. 1 and 2 are given the same reference numerals.

As can be seen in FIG. 3, charge pump 100 is operable to output a first bipolar output voltage at outputs VP, VN for powering the amplifier 24 and to output a second bipolar output voltage at outputs VQ, VM for powering the amplifier 22 and DAC 20. Therefore, by using the charge pump circuit 100, the need for the level shift 26 of the system shown in FIG. 1 is removed, as the first amplifier stage 22 and the second amplifier stage 24, can be powered by separate bipolar voltages of different (or the same) magnitude output from a single charge pump 100 so the outputs from DAC 20 and amplifier stages 22 and 24 can all be centred on ground i.e. the reference voltage.

Providing two bipolar output voltages allows one to be adjusted to avoid excess power consumption or dissipation in the output stage, while the other can be designed to supply adequate headroom for upstream signals and amplifier circuitry.

FIG. 4a shows a circuit diagram of a switch matrix, in which the network of switching paths is explicitly shown. FIG. 4a, like FIG. 2, shows the switch matrix having an input node VV for receiving an input voltage, a ground reference node VG, a first output node VP, a second output node VN, a third output node VQ and a fourth output node VM. Like FIG. 2, FIG. 4a shows the switch matrix in use with two flying capacitors CF1 and CF2 connected to the first, second, third and fourth flying capacitor nodes CF2A, CF2B, CF1A, CF1B. The flying capacitors, and the reservoir capacitors, themselves are not part of the switch matrix as defined, nor generally integrated on the same integrated circuit, but are connected to the switch matrix in use. However, it is envisaged that in a particular implementation, particularly for very light loads with a very fast switching frequency, the capacitors may be integrated into the same integrated circuit as the switch matrix and indeed other elements of the charge pump circuit.

For clarity, the first, second, third and fourth reservoir capacitors CRP, CRN, CRQ, CRM are omitted from FIG. 4a, although it would be understood by the skilled person that, in use: a first reservoir capacitor CRP would be connected between the first output node VP and a reference node VG; a second reservoir capacitor CRN would be connected between the reference node VG and the second output node VN; a third reservoir capacitor CRQ would be connected between the third output node VQ and the reference node VG; and a fourth reservoir capacitor CRM would be connected between the reference node VG and the fourth output node VM.

In FIG. 4a, one embodiment of the network of switching paths is explicitly shown. The network of switching paths in FIG. 4a comprises thirteen switching paths for connecting the various nodes together. Although each switching path in FIG. 4a is shown comprising a single element, as would be understood by the skilled person, each switching path may comprise a number of discrete switches, e.g. single MOS switches, or MOS transmission gates, or may be a T-switch or the like as described below, e.g. comprising such discrete switches. The switching paths provided in FIG. 4a are:

A first switching path S2AVP for connecting the first flying capacitor node (CF2A) to the first output node VP;
A second switching path S2AVV for connecting the first flying capacitor node CF2A to the input node VV;
A third switching path S2AVG for connecting the first flying capacitor node CF2A to the reference node VG;
A fourth switching path S2BVN for connecting the second flying capacitor node CF2B to the second output node VN;
A fifth switching path S2BVP for connecting the second flying capacitor node CF2B to the first output node VP;
A sixth switching path S2BVG for connecting the second flying capacitor node CF2B to the reference node VG;
A seventh switching path S1AVQ for connecting the third flying capacitor node CF1A to the third output node VQ;
An eighth switching path S1AVV for connecting the third flying capacitor node CF1A to the input node VV;
A ninth switching path S1AVG for connecting the third flying capacitor node CF1A to the reference node VG;
A tenth switching path S1BVM for connecting the fourth flying capacitor node CF1B to the fourth output node VM;
An eleventh switching path S1BVQ for connecting the fourth flying capacitor node CF1B to the third output node VQ;
A twelfth switching path S1BVG for connecting the fourth flying capacitor node CF1B to the reference node VG; and
A thirteenth switching path S1B2A for connecting the first flying capacitor node CF2A to the fourth flying capacitor node CF1B.

Although FIG. 4a is shown with the above thirteen listed switching paths, one or more of the switching paths may be removed from the circuit if not required to provide the desired functionality, i.e. if not required in any of the operational modes anticipated in a particular implementation.

FIG. 4b shows a network plan of the switching paths in the switch matrix of FIG. 4a. Essentially, FIG. 4b shows more clearly the pairs of nodes between which there are provided respective switching paths.

Operation of various embodiments of the charge pump circuitry 100 in various modes of operation is explained below. A mode of operation denotes a class of embodiments generating a certain pair of bipolar voltages using a particular set of switching paths.

Each mode of operation involves sequencing though various phases of operation, termed Ph1, Ph2, etc., where each phase employs some or all of the available switching paths.

The set of switching paths employed in each phase are described as a switching state, denoted as e.g. P1, P2a or P37c, or possibly a combination of switching states, denoted as e.g. P1+P2a, P3x+P37c. The phases employed in a mode may be sequenced in a chosen one of a plurality of possible repeated sequences, or the sequence may be modified from one cycle to another according to factors such as varying load current demand.

Figure 5B:
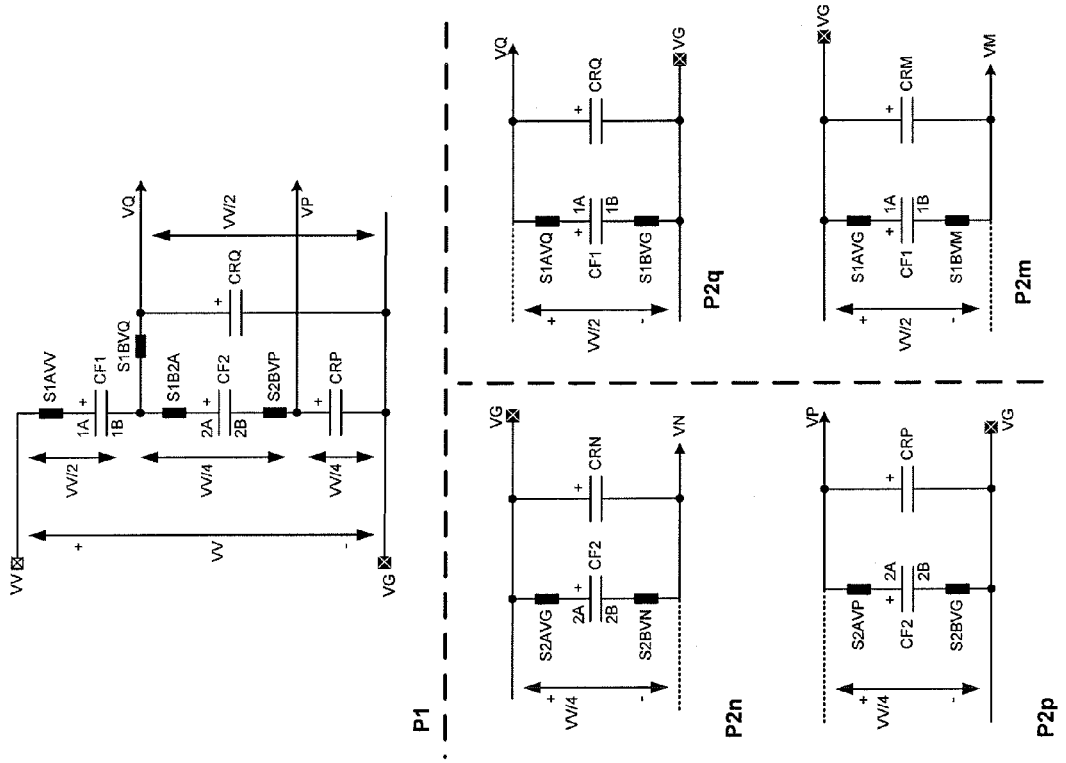
FIG. 5b shows the switching phases of the first mode of operation.

In the descriptions of the modes of operation that follow, the switching states involved in each mode are shown schematically in figures such as FIG. 5b. Tables such as FIG. 5a are also provided to illustrate which switching paths are used (marked with a "1") and which are not used (marked with a "0") for each of the switching states of a mode. Tables such as FIG. 5c then show possible sequences of phases, i.e. combinations of switching states in various orders. Various networks of switching paths are shown in figures such as FIG. 4a, suitable for operation in various sets of modes. If some possible modes are not required in use, there may be switching paths which are never employed: these may either just be always turned off or may be omitted from the physical implementation to leave a set of switching paths with fewer switching paths, saving space and cost.

In each mode, the output voltages are derived algebraically. The nomenclature V(CF1) is used for the voltage between the positive plate and negative plate of CF1, and similarly for V(CF2). The input and output supply node voltages are just referred to by the same name as the respective nodes VP, VQ, etc for simplicity, though might be considered as V(CRP), V(CRQ) etc.

In a first mode of operation, the switch matrix of FIG. 4a may be operable to provide a first bipolar output voltage of +/−VV/4 at the first and second output nodes (VP,VN), and a second bipolar output voltage of +/−VV/2 at the third and fourth output nodes (VQ,VM).

FIG. 5b illustrates one embodiment of a plurality of switching states of the charge pump of FIG. 4a which can be used to provide the above voltages at the output nodes.

In a first switching state, labelled P1 in FIG. 5b, the first flying capacitor CF2, the second flying capacitor CF1 and the first reservoir capacitor CRP are connected in series between the input node VV and the reference node VG, the series connected first flying capacitor CF2 and the first reservoir capacitor CRP are also connected in parallel to the third reservoir capacitor CRQ between the third output node VQ and the reference node VG, and the second flying capacitor CF1 and the third reservoir capacitor CRQ are connected in series between the input node VV and the reference node VG. This is achieved by closing the S1AVV switching path, the S1B2A switching path, the S2BVP switching path and the S1BVQ switching path.

In a second state P2n, the first flying capacitor CF2 and the second reservoir capacitor CRN are connected in parallel between the reference node VG and the second output node VN. This is achieved by closing the S2AVG switching path and the S2BVN switching path.

In a third state P2q, the second flying capacitor CF1 and the third reservoir capacitor CRQ are connected in parallel between the third output node VQ and the reference node VG. This is achieved by closing the S1BVG switching path and the S1AVQ switching path.

In a fourth state P2p, the first flying capacitor CF2 and the first reservoir capacitor CRP are connected in parallel between the first output node VP and the reference node VG. This is achieved by closing the S2AVP switching path and the S2BVG switching path.

In a fifth state P2m, the second flying capacitor CF1 and the fourth reservoir capacitor CRM are connected in parallel between the reference node VG and the fourth output node VM. This is achieved by closing the S1AVG switching path and the S1BVM switching path.

From inspection of FIG. 5b, the steady-state output voltages may be derived as follows by assuming there is negligible droop on each capacitor, so the voltage across each capacitor remains constant throughout the various phases.

In state P1, V(CF1)+VQ=VV. From state P2q, V(CF1)= VQ. Thus V(CF1)=VV/2=VQ.

Similarly, from state P1, VP+V(CF2)+V(CF1)=VV. But V(CF1)=VV/2 and from state P2p, V(CF2)=VP so VP+VP+ VV/2=VV, so VP=VV/4=V(CF2).

In states P2n and P2m CRN and CRM are charged to – V(CF2) and –V(CF1) respectively, i.e. –VV/4 and –VV/2 respectively.

FIG. 5a is a table showing which switching paths of the charge pump of FIG. 4a are used in each above state of this mode. In common with other modes of operation, the various states may be sequenced in a variety of ways, FIG. 5c is a table showing possible sequences a, b, c, ... of these phases.

For instance each state may be sequenced sequentially, one state in each switching phase per sequence a or b or indeed any other order of these states, possibly including P1 in more than one phase of each cycle to allow more frequent recharging from input supply VV. However preferably states may be sequenced in combination in a single switching phase. For example either of state P2p and P2n may be sequenced in combination with either of states P2q and P2m e.g. per sequences d or e, again possibly with more frequent appearances of P1 e.g. sequence f.

Also some of the states may be omitted or replaced in particular cycles according to load demand and the consequent droop over time of the voltages stored on the reservoir capacitors droop. For instance P1 may be sequenced in one phase of each two-phase cycle, and in the other phase of each cycle (either P2p or P2n) and (either P2q or P2m) are chosen based on a detection of which member of each pair of output voltages (VP, VN) and (VQ, VM) respectively has drooped the most, as illustrated by sequence g. Indeed if there were little droop on both VQ and VM, say, then neither P2q nor P2m need be selected until the droop accumulates enough to make it worth expending the switching energy involved.

In a second mode of operation, the switch matrix of FIG. 4a may also be operable to provide a first bipolar output voltage of +/–VV at the first and second output node (VP,VN), and a second bipolar output voltage of +/–VV/2 at the third and fourth output nodes (VQ,VM).

Figure 6B:
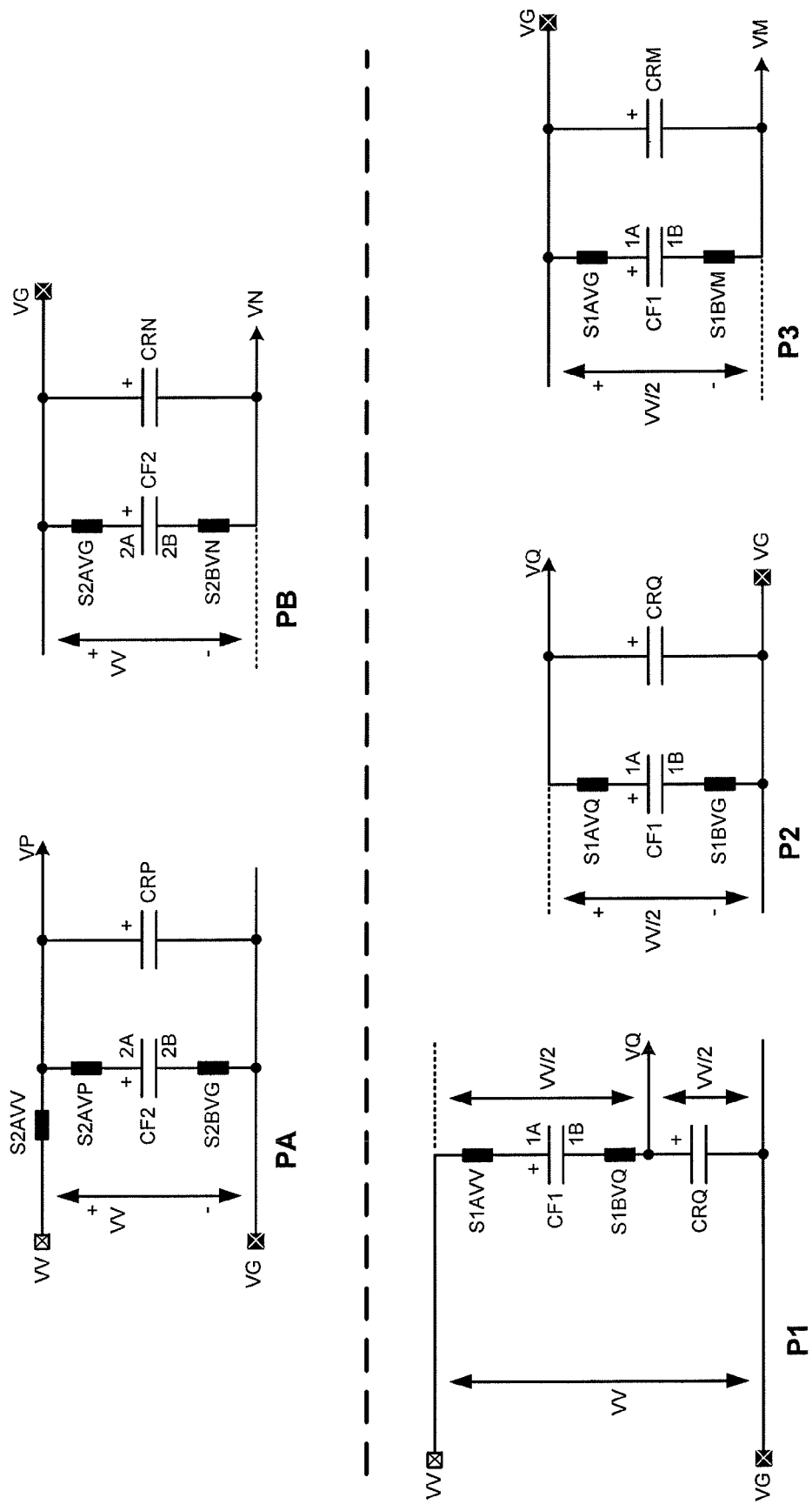
FIG. 6b shows the switching phases of the second mode of operation.

FIG. 6b illustrates one embodiment of a plurality of switching states of the charge pump of FIG. 4a which can be used to provide the above voltages at the output nodes.

In a first switching state, labelled PA in FIG. 6b, the first flying capacitor CF2 and the first reservoir capacitor CRP are connected in parallel between the input node VV and the reference node VG. This is achieved by closing the S2AVV switching path, the S2AVP switching path and the S2BVG switching path. In this phase, as the first flying capacitor CF2 and the first reservoir capacitor CRP are connected in parallel between the input node VV and the reference node VG, both the first flying capacitor CF2 and the first reservoir capacitor CRP are charged to VV. This provides a positive voltage of +VV at the output node VP.

In a second state, labelled as PB in FIG. 6b, the first flying capacitor CF2 and the second reservoir capacitor CRN are connected in parallel between the reference node VG and the second output node VN. This is achieved by closing the S2AVG switching path and the S2BVN switching path. In this phase, as the first flying capacitor CF2 was charged to VV in the first state and the first flying capacitor CF2 and the second reservoir capacitor CRN are connected in parallel, the second reservoir capacitor is also charged to VV. As the second reservoir capacitor is connected with its positive plate to the reference node VG, a negative voltage of –VV is provided at the second output node VN.

In a third state, labelled as P1 in FIG. 6b, the second flying capacitor CF1 and the third reservoir capacitor CRQ are connected in series between the input node VV and the reference node VG. This is achieved by closing the S1AVV switching path and the S1BVQ switching path.

In a fourth state, labelled as P2 in FIG. 6b, the second flying capacitor CF1 and the third reservoir capacitor CRQ are connected in parallel between the third output node VQ and the reference node VG. This is achieved by closing the S1BVG switching path and the S1AVQ switching path.

In a fifth state, labelled as P3 in FIG. 6b, the second flying capacitor CF1 and the fourth reservoir capacitor CRM are connected in parallel between the reference node VG and the fourth output node VM. This is achieved by closing the S1AVG switching path and the S1BVM switching path.

From inspection of FIG. 6b, the steady-state output voltages may be derived as follows. In state P1, V(CF1)+VQ=VV. But from state P2, V(CF1)=VQ. Thus V(CF1)=VV/2=VQ. In state P3 CRM is charged to –V(CF2), i.e. –VV/2 so VM=– VV/2.

FIG. 6a is a table showing which switching paths of the charge pump of FIG. 4a are used in each above state of this mode. FIG. 6c is a table showing possible sequences a, b, c, ... of these phases.

In operation, the controller may sequence these states P1, P2, P3, PA, PB, P1, P2, .... However preferably and more efficiently the states any one of states P1, P2, P3 may be exercised at the same time as either of states PA or PB. For instance the sequence may comprise three phases (P1+PA), (P2+PB), (P3+PA), repeatedly. Alternatively the sequence may comprise four phases (P2+PA), (P1+PB), (P3+PA), (P1+ PB), repeatedly: in this sequence VV is charging one of the flying capacitors in every one of the four phases, which may help reduce the maximum current spike and reduce losses at high current demands.

A further possibility is to modify the switching sequence on the fly according to load current demands or observed droop on the outputs, For instance in the third sequence above, after each phase (P1+PB), say, either (P2+PA) or (P3+PA) may be selected, perhaps on the basis of whether VQ or VM had drooped the most. Indeed if there were little droop on both VQ and VM, say, then neither P2 nor P3 need be selected in this phase, and only the state PA exercised, until the droop on VQ or VM accumulates enough to make it worth expending the switching energy involved in including the switching of state P2 or P3

In a third mode of operation, the switch matrix of FIG. 4a may also be operable to provide a first bipolar output voltage of +/−VV/2 at the first and second output node (VP,VN), and a second bipolar output voltage of +/−VV/2 at the third and fourth output nodes (VQ,VM).

Figure 7B:
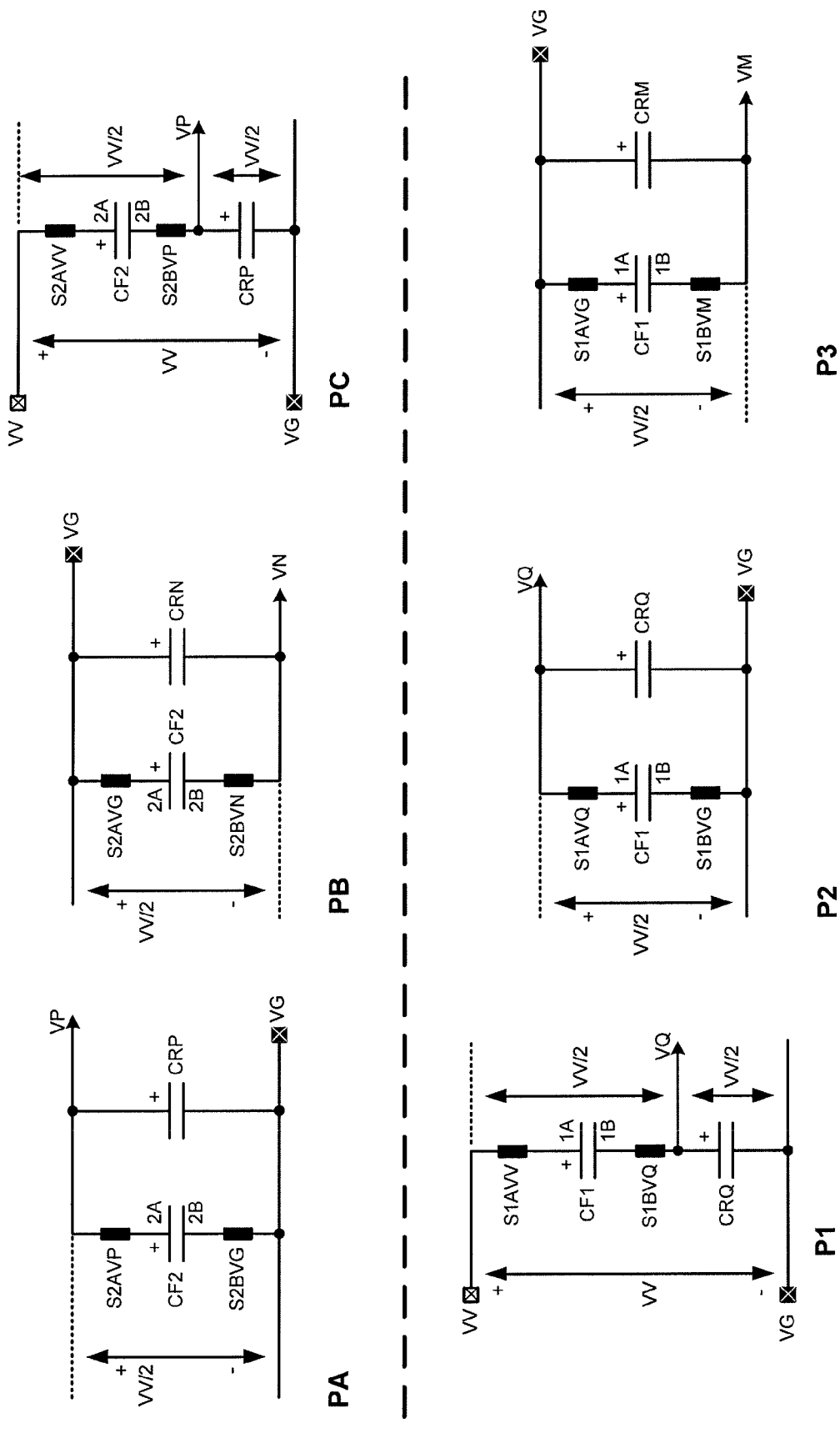
FIG. 7b shows the switching phases of the third mode of operation.

FIG. 7b illustrates one embodiment of a plurality of switching states of the charge pump of FIG. 4a which can be used to provide the above voltages at the output nodes.

In a first state, labelled PA in FIG. 7b, the first flying capacitor CF2 and the first reservoir capacitor CRP are connected in parallel between the first output node VP and the reference node VG. This is achieved by closing the S2AVP switching path and the S2BVG switching path.

In a second state, labelled PB in FIG. 7b, the first flying capacitor CF2 and the second reservoir capacitor CRN are connected in parallel between the reference node VG and the second output node VN. This is achieved by closing the S2AVG switching path and the S2BVN switching path.

In a third state, labelled PC in FIG. 7b, the first flying capacitor CF2 and the first reservoir capacitor CRP are connected in series between the input node VV and the reference node VG. To achieve this, the S2AVV switching path and the S2BVP switching path are closed In a fourth, fifth and sixth states, labelled P1, P2 and P3, respectively, in FIG. 7b, are the same as the third, fourth and fifth states of the above second mode.

As the states P1, P2, P3 are identical to states P1, P2, P3 of the second mode, by the arguments previously stated, the steady state voltages at output nodes VQ and VM are VQ=VV/2 and VM=−VV/2 respectively.

Also the states PC, PA, PB are the same as states P1, P2, P3 respectively except that CF1, VQ, and VM are replaced by CF2, VP, and VN respectively, with consequent changes to the equivalent switching paths employed. Thus by similarity, VP=VV/2 and VN=−VV/2.

As with the previous second mode, states PA, PB, PC may be arbitrarily combined with states P1, P2 and P3 (though to reduce switching current spike loading of VV, P1 and PC are preferably not simultaneous), or sequenced in a different order, or some of these states may be omitted in particular cycles according to load demand or droop.

In a fourth mode of operation, the switch matrix of FIG. 4a may be operable to provide a first bipolar output voltage of +/−VV/2 at the first and second output node (VP,VN), and a second bipolar output voltage of +/−VV/2 at the third and fourth output nodes (VQ,VM). The fourth mode is operable to provide the same output voltages as the third mode, but provides these output voltage using different switching states and different switching paths, resulting in different flying capacitor voltages.

Figure 8B:
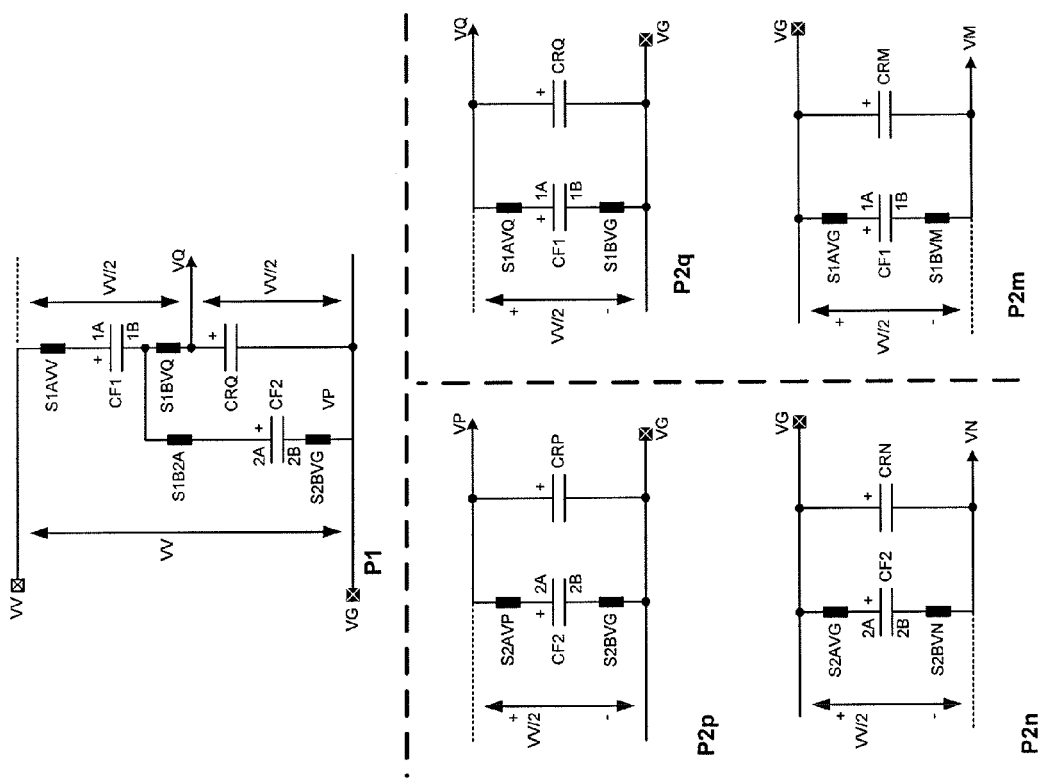
FIG. 8b shows the switching phases of the fourth mode of operation.

FIG. 8b illustrates one embodiment of a plurality of switching states of the charge pump of FIG. 4a which can be used to provide the above voltages at the output nodes.

In a first state, labelled P1 in FIG. 8b, the first flying capacitor CF2 and the second flying capacitor CF1 are connected in series between the input node VV and the reference node VG, the second flying capacitor CF1 and the third reservoir capacitor CRQ are connected in series between the input node VV and the reference node VG and the first flying capacitor CF2 and the third reservoir capacitor CRQ are connected in parallel between the third output node VQ and the reference node VG. This is achieved by closing the S1AVV switching path, the S1BVQ switching path, the S1B2A switching path and the S2BVG switching path.

In a second state, labelled P2p in FIG. 8b, the first flying capacitor CF2 and the first reservoir capacitor CRP are connected in parallel between the first output node VP and the reference node VG. This is achieved by closing the S2AVP switching path and the S2BVG switching path.

In a third state labelled P2q in FIG. 8b, the second flying capacitor CF1 and the third reservoir capacitor CRQ are connected in parallel between the third output node VQ and the reference node VG. This is achieved by closing the S1BVG switching path and the S1AVQ switching path.

In a fourth state labelled P2n in FIG. 8b, the first flying capacitor CF2 and the second reservoir capacitor CRN are connected in parallel between the reference node VG and the second output node VN. This is achieved by closing the S2AVG switching path and the S2BVN switching path.

In a fifth state labelled P2m in FIG. 8b, the second flying capacitor CF1 and the fourth reservoir capacitor CRM are connected in parallel between the reference node VG and the fourth output node VM. This is achieved by closing the S1AVG switching path and the S1BVM switching path.

By similar analysis to the above modes, in state P1, V(CF1)+VQ=VV. But from state P2q, V(CF1)=VQ. Thus V(CF1)=VV/2=VQ.

Similarly, from state P1, V(CF2)+V(CF1)=VV. But V(CF1)=VV/2 and from state P2p, V(CF2)=VP so VP+VV/2=VV, so VP=VV/2=V(CF2).

In states P2n and P2m CRN and CRM are charged to −V(CF2) and −V(CF1) respectively, i.e. both to −VV/2.

FIG. 8a is a table showing which switching paths of the charge pump of FIG. 4a are used in each above state of this mode. In common with other modes of operation, the various states may be sequenced in a variety of ways, FIG. 8c is a table showing possible sequences a, b, c, . . . of these phases.

For instance each state may be sequenced sequentially, as above in relation to the first mode of operation. Also as with other modes of operation above, some of the states may be repeated, omitted, or replaced in particular cycles according to load demand and droop.

As described in the above first, second, third and fourth modes, the switch matrix of FIG. 4a is operable to provide a first bipolar voltage of one of +/−VV, +/−VV/2 or +/−VV/4 at the first pair of output nodes (VP,VN), and to provide a bipolar output voltage of +/−VV/2 at the second pair of output nodes (VQ,VM).

Although the above describes individual modes of operation of the switch matrix separately, and the specific switching paths used in each mode, it should be apparent that when all of the switching paths of FIG. 4a are provided the mode of operation of the switch matrix may be varied in use, and thus the switch matrix may be operable to provide a first bipolar voltage that is selectable by the controller from the group of +/−VV, +/−VV/2 or +/−VV/4 at the first pair of output nodes (VP,VN), while providing a fixed bipolar voltage of +/−VV/2 at the second pair of output nodes (VQ,VM).

In other words, the first bipolar output voltage is variable and the second bipolar output voltage is fixed. The first bipolar output voltage being variable to be +/−VV, +/−VV/2 or +/−VV/4 and the second fixed bipolar output voltage being fixed at +/−VV/2.

Figure 9A:
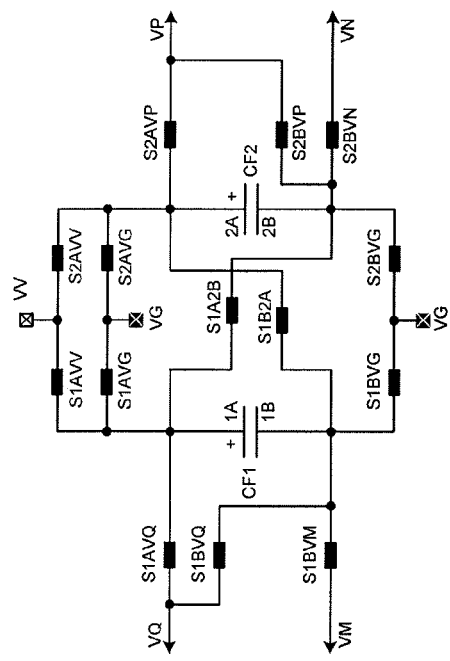
FIG. 9a shows a circuit diagram of a switch matrix according to another embodiment of the invention.

FIG. 9a shows a circuit diagram, similar to FIG. 4a, of another switch matrix, in which the network of switching paths is explicitly shown. This switch matrix comprises all the switches of the switch matrix of FIG. 4a, but with an additional switching path S1A2B provided between the second flying capacitor terminal CF2B and the third flying capacitor terminal CF1A.

Figure 9B:
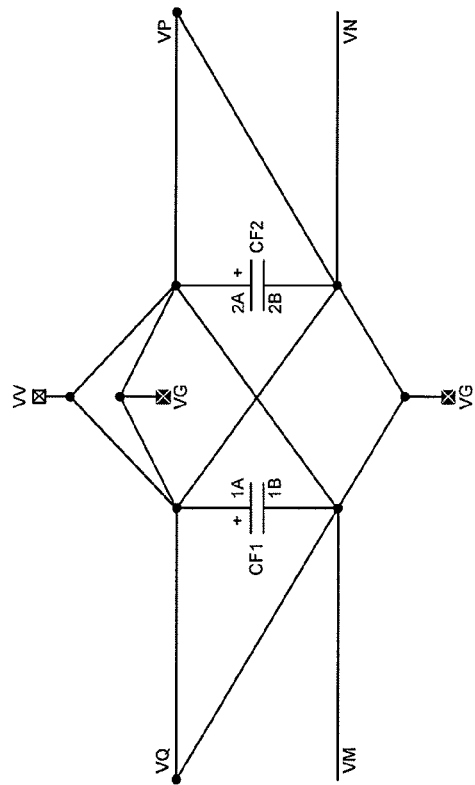

FIG. 9b shows a network plan of the switching paths in the switch matrix of FIG. 9a. Essentially, FIG. 9b shows more clearly the pairs of nodes between which there are provided respective switching paths.

As will be understood, as the switch matrix of FIG. 9a contains all of the switches of the switch matrix of FIG. 4a, it is also possible to control the switch matrix of FIG. 9a to provide the first, second, third and fourth modes as described above.

However, by providing the additional switching path S1A2B, the switch matrix of FIG. 9a may also be operable in a fifth mode to provide a first bipolar output voltage of +/−(3/2)·VV at the first and second output node (VP,VN), and a second bipolar output voltage of +/−VV/2 at the third and fourth output nodes (VQ,VM).

Figure 10B:
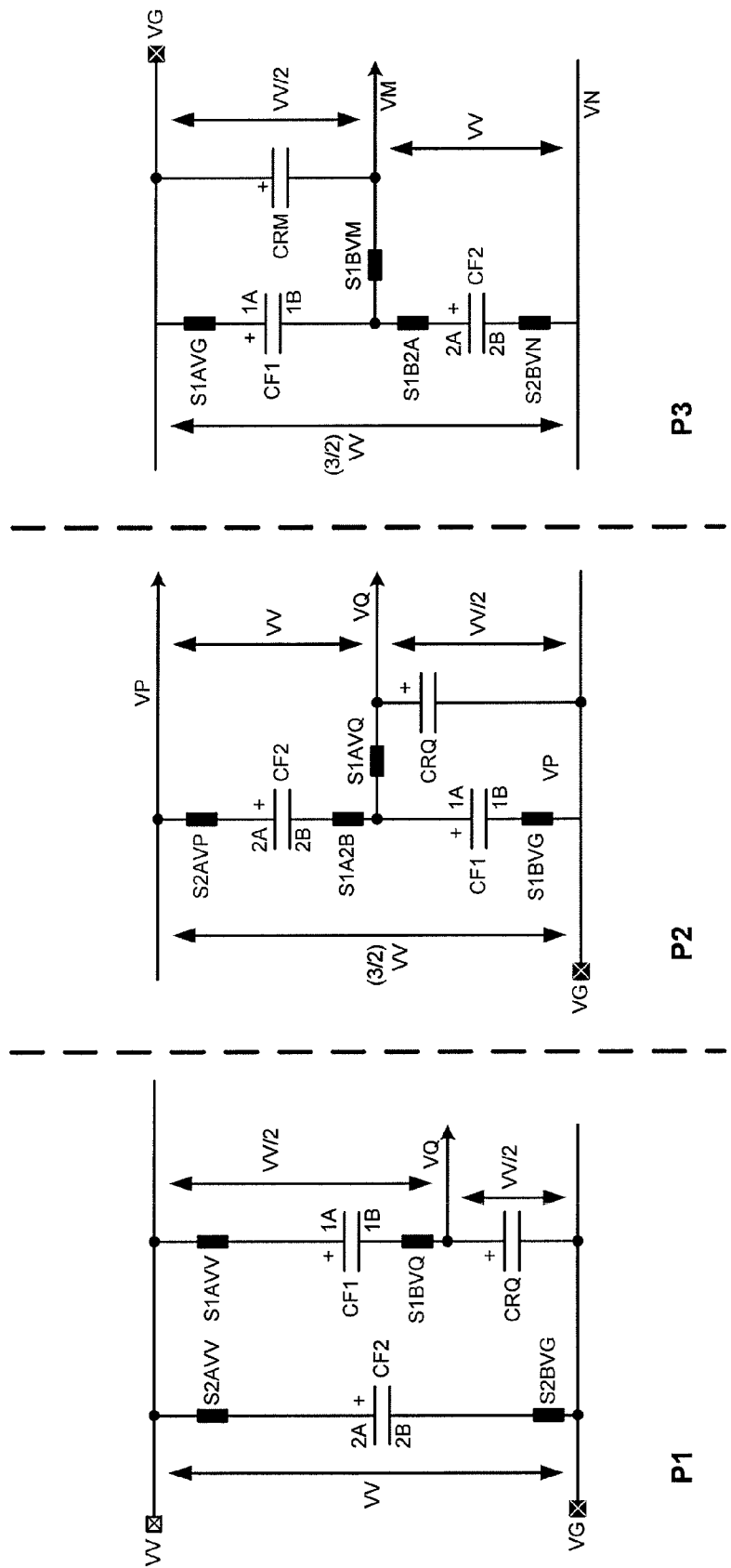
FIG. 10b shows the switching phases of the fifth mode of operation.

FIG. 10b illustrates one embodiment of a plurality of switching states of the charge pump of FIG. 9a which can be used to provide the above voltages at the output nodes, in a fifth mode.

In a first switching state, labelled P1 in FIG. 10b, the first flying capacitor CF2 is connected between the input node VV and the reference node VG, the second flying capacitor CF1 and the third reservoir capacitor CRQ are connected in series between the input node (VV) and the reference node VG, and the first flying capacitor CF2 and the series connected second flying capacitor CF1 and third reservoir capacitor CRQ are connected in parallel between the input node VV and the reference node VG. This is achieved by closing the S2AVV switching path, the S2BVG switching path, the S1AVV switching path, and the S1BVQ switching path.

In a second state, labelled P2 in FIG. 10b, the first flying capacitor CF2 and the second flying capacitor CF1 are connected in series between the first output node VP and the reference node VG, the first flying capacitor CF2 and the third reservoir capacitor CRQ are connected in series between the first output node VP and the reference node VG, and the second flying capacitor CF1 and the third reservoir capacitor CRQ are connected in parallel between the third output node VQ and the reference node VG. This is achieved by closing the S2AVP switching path, the S1AVQ switching path, the S1BVG switching path and the S1A2B switching path.

In a third state, labelled P3 in FIG. 10b, the first flying capacitor CF2 and the second flying capacitor CF1 are connected in series between the reference node VG and the second output node VN, the first flying capacitor CF2 and the fourth reservoir capacitor CRM are connected in series between the reference node VG and the second output node VN, and the second flying capacitor CF1 and the fourth reservoir capacitor CRM are connected in parallel between the reference node VG and the fourth output node VN. This is achieved by closing the S2BVN switching path, the S1AVG switching path, the S1BVM switching path and the S1B2A switching path.

By similar analysis to previous modes, in state P1, V(CF1)+VQ=VV. But from state P2b, V(CF1)=VQ. Thus V(CF1)=VV/2=VQ.

Also from state P1, V(CF2)=VV. From state P2, VP=V(CF1)+V(CF2) so VP=VV/2+VV=3VV/2.

Similarly, from state P3, VN=−V(CF2)−V(CF1) so VN=−VV−VV/2=−3VV/2.

Finally from state P3, VM=−V(CF1)=−VV/2.

FIG. 10a is a table showing which switching paths of the charge pump of FIG. 4a are used in each above state of this mode. In this mode, both CF1 and CF2 are employed in each state and at different terminal voltages, so the operations phases Ph1, Ph2, Ph3 just comprise single states P1, P2, P3. These states may be sequenced in any order, for example P1, P2, P3, . . . or P1, P2, P1, P3: for example if there is little loading on VM and VN, so these outputs exhibit little voltage droop per cycle, while VP and VQ are more heavily loaded, then the sequence might be modified to P1, P2, P1, P3, P1, P2, P1, P2, P1, P2, P1, P3 . . . .

Figure 11A:
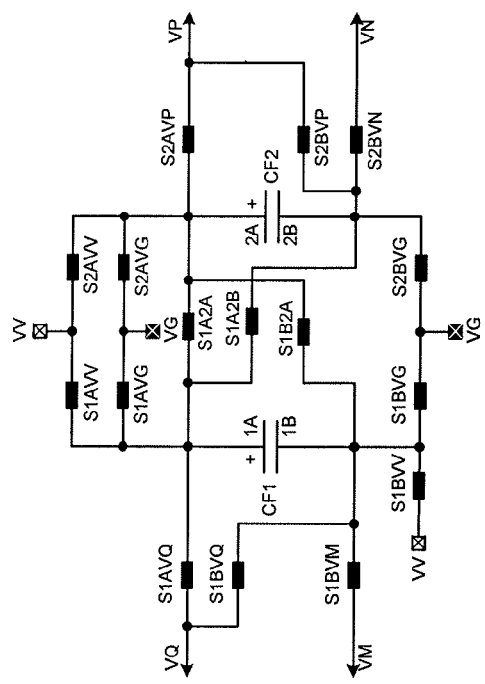
FIG. 11a shows a circuit diagram of a switch matrix according to another embodiment of the invention.

FIG. 11a shows a circuit diagram, similar to FIG. 4a, of another switch matrix, in which the network of switching paths is explicitly shown. This switch matrix comprises all the switches of the switch matrix of FIG. 9a, but with two additional switching paths provided: S1A2A provided between the first flying capacitor terminal CF2A and the third flying capacitor terminal CF1A, and S1BVV provided between the fourth flying capacitor terminal CF1B and the input node VV. Also, this switch matrix includes all of the switching paths of the switch matrix of FIG. 4a, with the additional switching paths S1A2B, S1A2A and S1BVV provided.

Figure 11B:
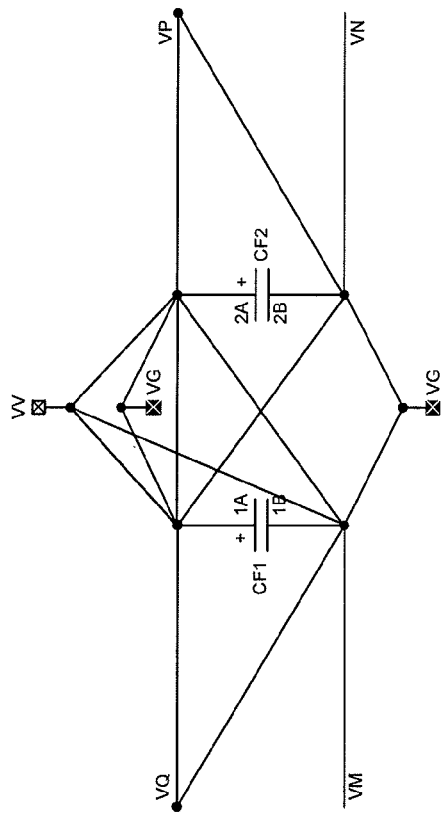

FIG. 11b shows a network plan of the switching paths in the switch matrix of FIG. 11a. Essentially, FIG. 11b shows more clearly the pairs of nodes between which there are provided respective switching paths.

As will be understood, as the switch matrix of FIG. 11a contains all of the switches of the switch matrix of FIG. 9a, it will also be possible to control the switch matrix of FIG. 11a to provide the first, second, third, fourth and fifth modes as described above.

By providing the additional switching paths S1A2A and S1BVV, the switch matrix of FIG. 11a may be operable in a sixth mode to provide a first bipolar output voltage of +/−2VV at the first and second output node (VP,VN), and a second bipolar output voltage of +/−VV/2 at the third and fourth output nodes (VQ,VM).

Figure 12B:
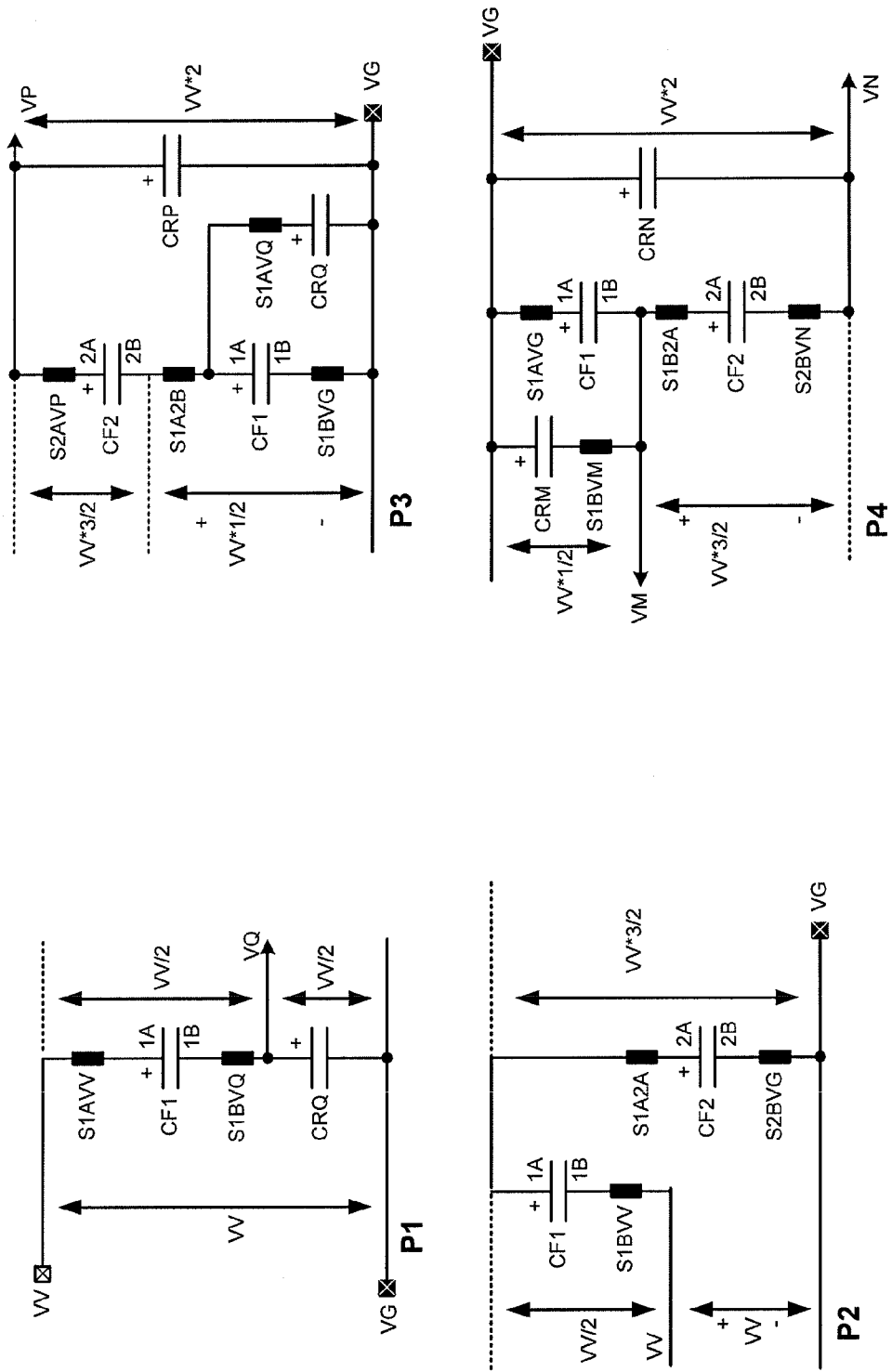
FIG. 12b shows the switching phases of the sixth mode of operation.

FIG. 12b illustrates one embodiment of a plurality of switching states of the charge pump of FIG. 11a which can be used to provide the above voltages at the output nodes in a sixth mode.

In a first state, labelled P1 in FIG. 12b, the second flying capacitor CF1 and the third reservoir capacitor CRQ are connected in series between the input node VV and the reference node VG. This is achieved by closing the S1AVV switching path and the S1BVQ switching path.

In a second state, labelled P2 in FIG. 12b, the first flying capacitor CF2 is connected between the reference voltage VG and one terminal of the second flying capacitor CF1, the other terminal of the second flying capacitor CF1 being connected to the input voltage VV. This is achieved by closing the S2BVG switching path, the S1A2A switching path and the S1BVV switching path.

In a third state, labelled P3 in FIG. 12b, the first flying capacitor CF2 is connected in series with the second flying capacitor CF1 between the first output node VP and the reference node VG, the series connected first and second flying capacitors are connected in parallel with the first reservoir capacitor CRP between the first output node VP and the reference node VG, the first flying capacitor CF2 is connected in series with the third reservoir capacitor CRQ between the first output node VP and the reference node VG, and the second flying capacitor CF1 is connected in parallel with the third reservoir capacitor CRQ. This is achieved by closing the S2AVP switching path, the S1BVG switching path, the S1AVQ switching path and the S1A2B switching path.

In a fourth state, labelled P4 in FIG. 12b, the first flying capacitor CF2 and the second flying capacitor CF1 are connected in series between the reference node VG and the second output node VN, the series connected first and second flying capacitors are connected in parallel with the second reservoir capacitor CRN between the reference node VG and the second output node VN, the first flying capacitor CF2 is connected in series with the fourth reservoir capacitor CRM between the reference node VG and the second output node VN, and the second flying capacitor CF1 is connected in parallel with the fourth reservoir capacitor CRM. This is achieved by closing the S2BVN switching path, the S1B2A switching path, the S1AVG switching path and the S1BVM switching path.

The steady-state output voltages may be derived as with other modes from inspection of FIG. 8b.

In state P1, V(CF1)+VQ=VV. From state P3, V(CF1)=VQ. Thus V(CF1)=VV/2=VQ.

From state P2, V(CF2)=VV+V(CF1). But V(CF1)=VV/2 so V(CF2)=VV+VV/2=3VV/2. Hence in state P3, VP=V(CF1)+V(CF2)=VV/2+3VV/2=2·VV.

Similarly from state P4, VN=−V(CF1)−V(CF2)=−2·VV.

Finally, in state P4, VM=−V(CF1)=−VV/2.

FIG. 12a is a table showing which switching paths of the charge pump of FIG. 4a are used in each above state of this mode. In this mode, both CF1 and CF2 are employed in each state and at different terminal voltages, so combinations of these states are not possible, so the operational phases Ph1, Ph2, Ph3, just comprise single states P1, P2, P3, P4. These states may be sequenced in any order, for example P1, P2, P3, P4 . . . or P1, P4, P1, P2, P3, or omitted in some cycles according to load current demand and droop.

Figure 13A:
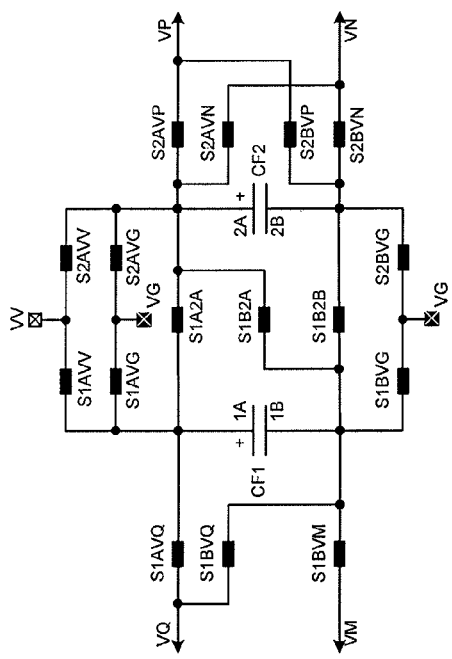
FIG. 13a shows a circuit diagram of a switch matrix according to another embodiment of the invention.

FIG. 13a shows a circuit diagram, similar to FIG. 4a, of another switch matrix, in which the network of switching paths is explicitly shown. This switch matrix comprises all the switching paths of the switch matrix of FIG. 4a, but with three additional switching paths provided: S1A2A provided between the first flying capacitor terminal CF2A and the third flying capacitor terminal CF1A, S1B2B provided between the second flying capacitor terminal CF2B and the fourth flying capacitor terminal CF1B, and S2AVN provided between the first flying capacitor terminal CF2A and the second output node VN.

Figure 13B:
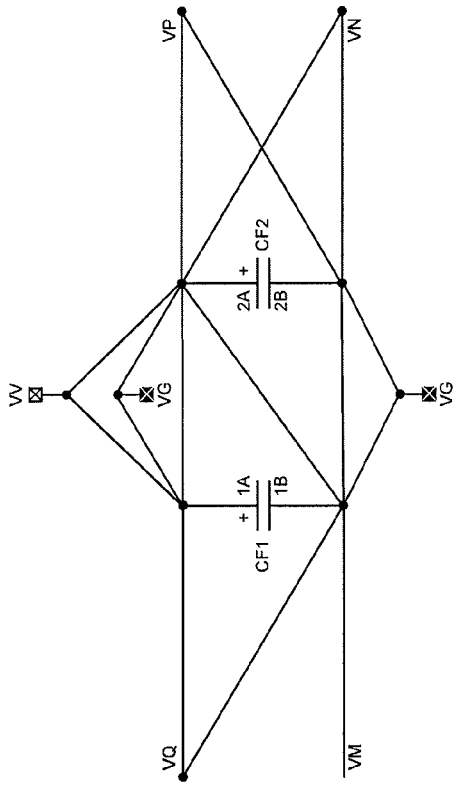

FIG. 13b shows a network plan of the switching paths in the switch matrix of FIG. 13a. Essentially, FIG. 13b shows more clearly the pairs of nodes between which there are provided respective switching paths.

By providing the additional switching paths S1A2A, S1B2B and S2AVN, the switch matrix of FIG. 13a may be operable to provide a first bipolar output voltage of +/−VV/6 at the first and second output node (VP,VN), and a second bipolar output voltage of +/−VV/2 at the third and fourth output nodes (VQ,VM). The switch matrix of FIG. 13a may also be operable to provide alternate modes for providing a first bipolar output voltage of +/−VV/2 or +/−VV/4 at the first and second output node (VP,VN), and a second bipolar output voltage of +/−VV/2 at the third and fourth output nodes (VQ,VM).

As will be understood, as the switch matrix of FIG. 13a contains all of the switches of the switch matrix of FIG. 4a, it is also possible to control the switch matrix of FIG. 13a to provide the first, second, third and fourth modes as described above.

In a seventh mode of operation, the switch matrix of FIG. 13a may be operable to provide a first bipolar output voltage of +/−VV/6 at the first and second output node (VP,VN), and a second bipolar output voltage of +/−VV/2 at the third and fourth output nodes (VQ,VM).

Figure 14B:
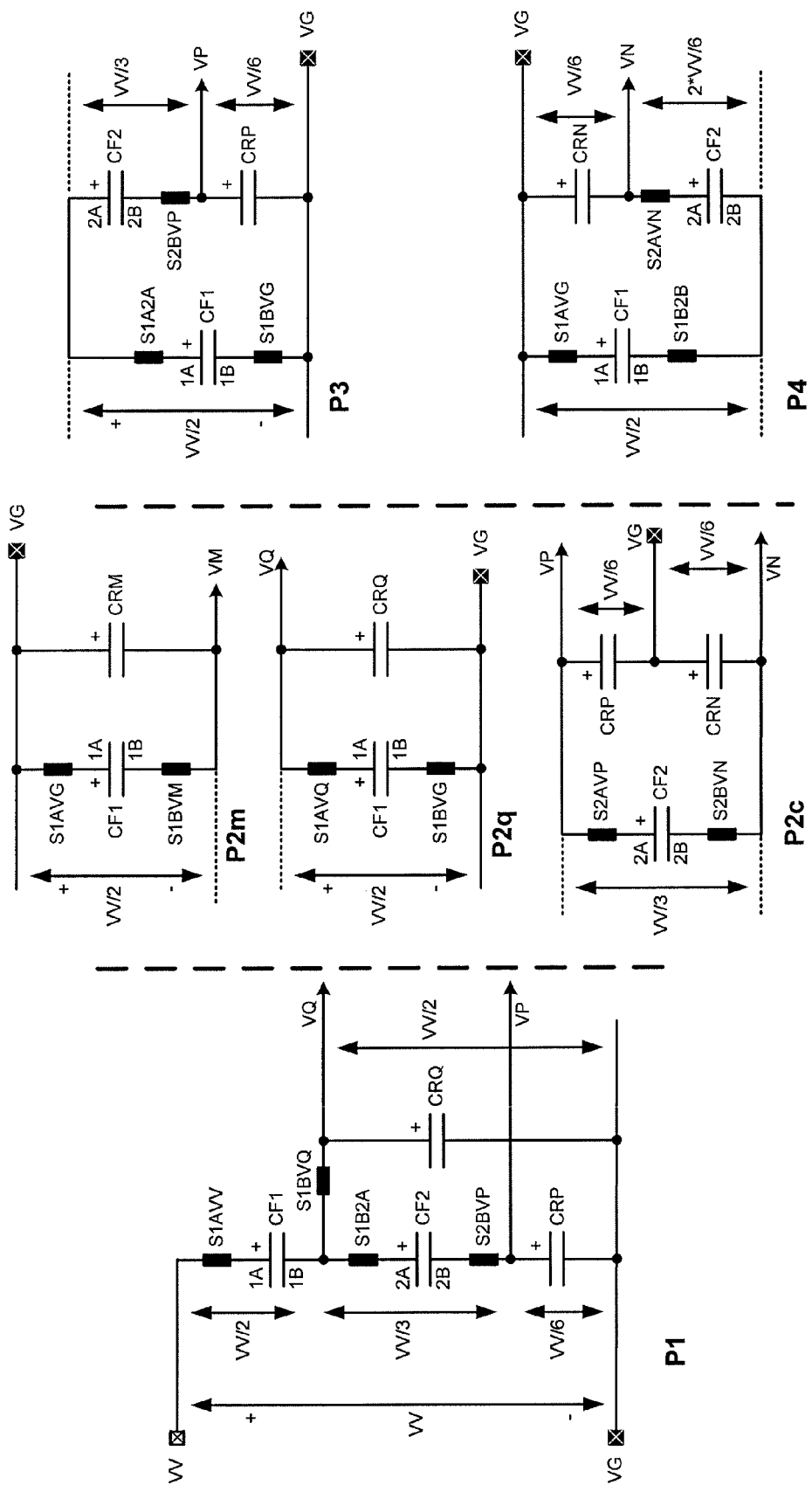
FIG. 14b shows the switching phases of the seventh mode of operation.

FIG. 14b illustrates one embodiment of a plurality of switching states of the charge pump of FIG. 13a which can be used to provide the above voltages at the output nodes.

In a first switching state, labelled P1 in FIG. 14b, the first flying capacitor CF2, the second flying capacitor CF1 and the first reservoir capacitor CRP are connected in series between the input node VV and the reference node VG, the series connected first flying capacitor CF2 and the first reservoir capacitor CRP are also connected in parallel to the third reservoir capacitor CRQ between the third output node VQ and the reference node VG, and the second flying capacitor CF1 and the third reservoir capacitor CRQ are connected in series between the input node VV and the reference node VG. This is achieved by closing the S1AVV switching path, the S1B2A switching path, the S2BVP switching path and the S1BVQ switching path.

In a second state, labelled P2c in FIG. 14b, the first reservoir capacitor CRP and the second reservoir capacitor CRN are connected in series between the first output node VP and the second output node VN, and the first flying capacitor CF2 is connected in parallel between the series connected first reservoir capacitor CRP and second reservoir capacitor CRN. This is achieved by closing the S2AVP switching path and the S2BVN switching path. Please note that this phase may be performed synchronously with either or both of P2m and P2q.

In a third state, labelled P2q in FIG. 14b, the second flying capacitor CF1 and the third reservoir capacitor CRQ are connected in parallel between the third output node VQ and the reference node VG. This is achieved by closing the S1BVG switching path and the S1AVQ switching path.

In a fourth state, labelled P2m in FIG. 14b, the second flying capacitor CF1 and the fourth reservoir capacitor CRM are connected in parallel between the reference node VG and the fourth output node VM. This is achieved by closing the S1AVG switching path and the S1BVM switching path.

In a fifth state, labelled P3 in FIG. 14b, the first flying capacitor CF2 and first reservoir capacitor CRP are connected in series, and the second flying capacitor CF1 is connected in parallel with the series connected first flying capacitor CF2 and the first reservoir capacitor CRP. This is achieved by closing the S1A2A switching path, the S1BVG switching path and the S2BVP switching path.

In a sixth state, labelled P4 in FIG. 14b, the first flying capacitor CF2 and the second reservoir capacitor CRN are connected in series, and the second flying capacitor CF1 is connected in parallel with the series connected first flying capacitor CF2 and second reservoir capacitor CRN. This is achieved by closing the S1AVG switching path, the S1B2B switching path and the S2AVN switching path.

By similar analysis to the above modes, in state P1, V(CF1)+VQ=VV. But from state P2q, V(CF1)=VQ. Thus V(CF1)=VV/2=VQ.

Also from state P1, $$V(CF2)+VP+V(CF1)=VV,$$

so:

$$V(CF2)+VP+VV/2=VV,$$

so $$V(CF2)+VP=VV/2 \qquad (x)$$

But from state P4, $$-V(CF1)=-V(CF2)+VN,$$

so $$V(CF2)-VN=V(CF1)=VV/2 \quad (y)$$

So, comparing (x) and (y):

$$VP=-VN.$$

But from state P2c $$V(CF2)=VP-VN$$

So $$V(CF2)=2 \cdot VP$$

Hence from (above)

$$V(CF2)+VP=2 \cdot VP+VP=VV/2$$

Hence $$V(CF2)=VV/6.$$

And hence $$VP=VV/6; VN=-VV/6$$

Finally, from state P2m, VM=−V(CF1)=−VV/2.

Note that P3 is not included in the above analysis, so is not an essential state. Alternatively, it may be shown that P2q may be omitted if P3 is present.

From the above analysis, embodiments of this mode should include at least switch states P1, P2c, P4 and P2m, and at least one of P3 or P2q. However, since P2c involves only CF2, P2c may be combined with one of P2q or P2m if desired. Also since CF1 is connected to the same voltages in P2q and P3, P2q may be combined with P3. Similarly, P4 may be combined with P2m. There are thus several possible sequences of these states or combinations of states that can implement this mode of operation.

FIG. 14a is a table showing which switching paths of the charge pump of FIG. 10a are used in each state. FIG. 14c is a table illustrating three possible sequences a, b, c each comprising a four phase sequence Ph12, Ph2, Ph3, Ph4 of these states.

These phases may be sequenced in any order, for example Ph1, Ph2, Ph3, Ph4 . . . or Ph1, Ph2, Ph1, Ph3: In common with other modes various states may be repeated, replaced, or omitted in some cycles depending on the loading or droop on various outputs.

In an eighth mode of operation, the switch matrix of FIG. 13a may also be operable to provide a first bipolar output voltage of +/−VV/2 at the first and second output node (VP, VN), and a second bipolar output voltage of +/−VV/2 at the third and fourth output nodes (VQ,VM). The eighth mode provides the same output voltages as the third and fourth modes, but provides these output voltage using a different switching state enabled by the additional switches.

Figure 15B:
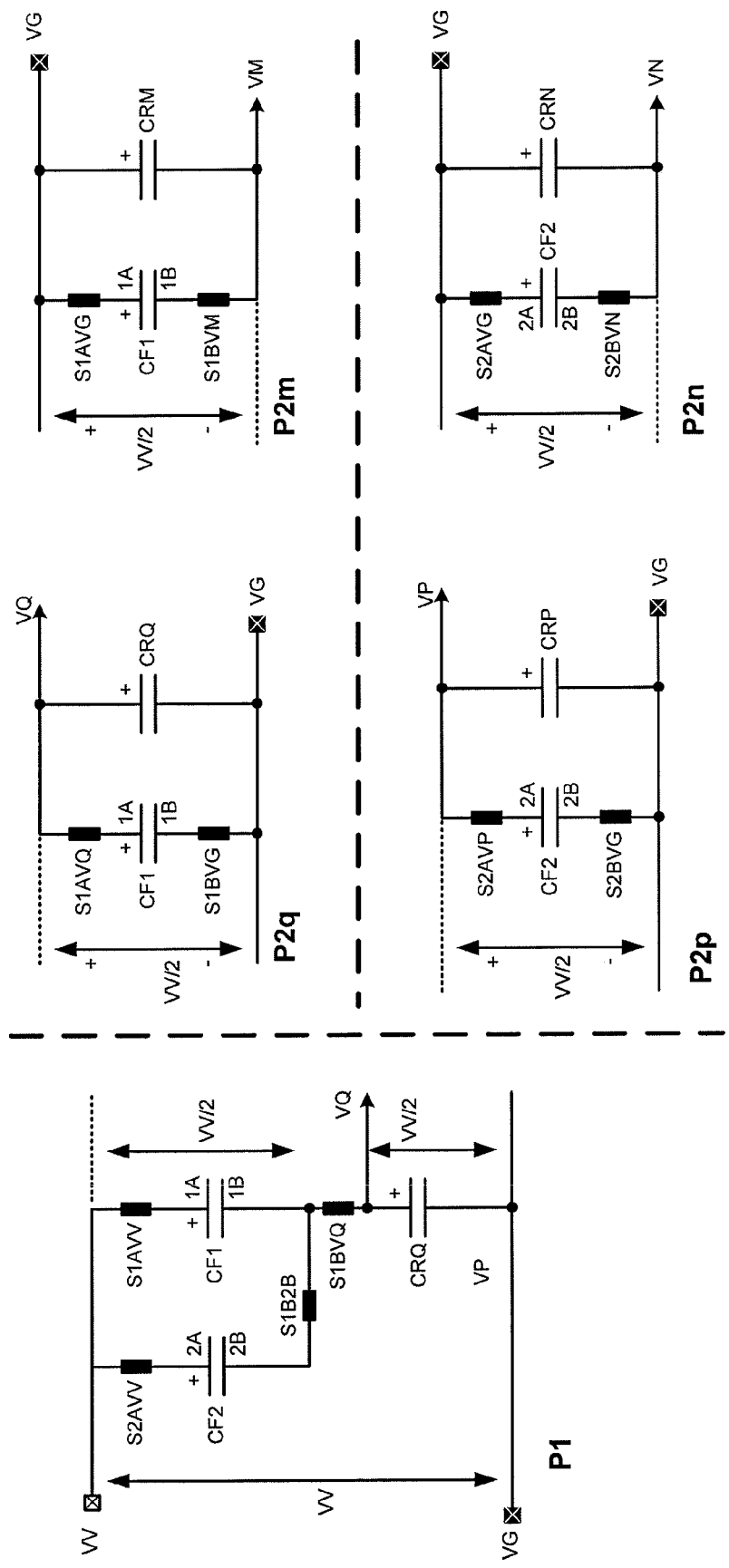
FIG. 15b shows the switching phases of the eighth mode of operation.

FIG. 15b illustrates one embodiment of a plurality of switching states of the charge pump of FIG. 14a which can be used to provide the above voltages at the output nodes.

In a first state, labelled P1 in FIG. 15b, the controller is operable to control the network of switches such that the first flying capacitor CF2 and the second flying capacitor CF1 are connected in parallel between the input node VV and the third output node VQ, the first flying capacitor CF2 and the third reservoir capacitor CRQ are connected in series between input node VV and the reference node VG, and the second flying capacitor CF1 and the third reservoir capacitor CRQ are connected in series between the input node VV and the reference node VG. This is achieved by closing the S1AVV switching path, the S1BVQ switching path, the S1B2B switching path and the S2AVV switching path.

The second, third, fourth, and fifth switching states P2q, P2m, P2p and P2n are identical to the respective states of the third and fourth modes.

By similar analysis to the above modes, in state P1, V(CF1)+VQ=VV. But from state P2b, VQ=V(CF1). Thus VQ+VQ=VV, so VQ=VV/2, and also V(CF1)=VV/2.

Also, from state P1, V(CF2)=V(CF1) so V(CF2)=VV/2.

In states P3a and P3b CRN and CRM are charged to −V(CF2) and −V(CF1) respectively, i.e. both VN and VM are equal to −VV/2.

FIG. 15a is a table showing which switching paths of the charge pump of FIG. 13a are used in each above state of this mode. The various states may be sequenced in a variety of ways as described in respect to the second and third modes. Also the states P1 of the third mode or states P1, PC, or P1+PC of the second mode may be interleaved with or replace state P1 of this mode is some cycles if desired. Also as with other modes of operation above, some of the states may be repeated, replaced, or omitted in particular cycles according to load demand and droop.

In a ninth mode of operation, the switch matrix of FIG. 13a may be operable to provide a first bipolar output voltage of +/−VV/2 at the first and second output node (VP,VN), and a second bipolar output voltage of +/−VV/2 at the third and fourth output nodes (VQ,VM). The ninth mode is operable to provide the same output voltages as the third, fourth and eighth modes, but provides these output voltage using different switching states.

Figure 16B:
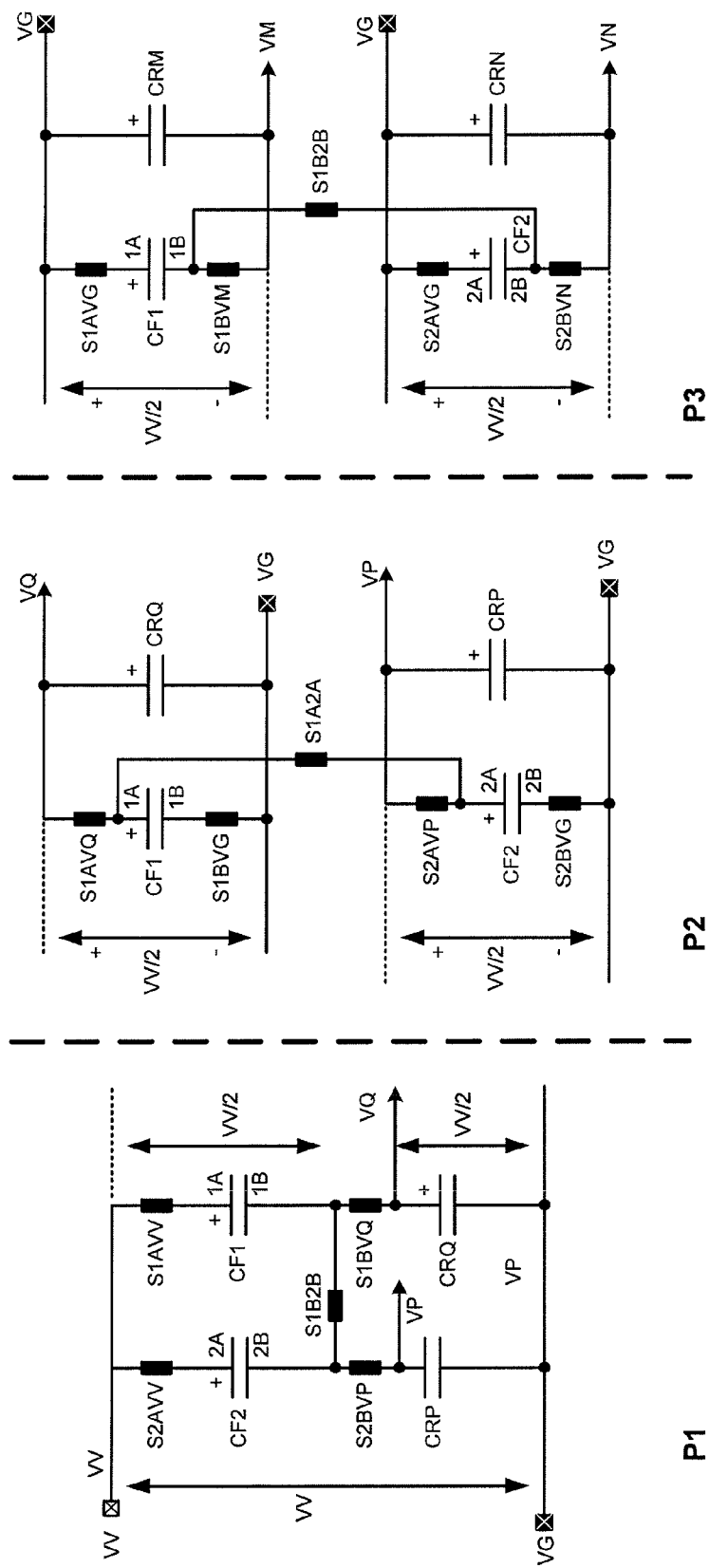
FIG. 16b shows the switching phases of the ninth mode of operation.

FIG. 16b illustrates one embodiment of a plurality of switching states of the charge pump of FIG. 13a which can be used to provide the above voltages at the output nodes.

In a first state, labelled P1 in FIG. 16b, the first flying capacitor CF2 and the first reservoir capacitor CRP are connected in series between the input node VV and the reference node VG, the second flying capacitor CF1 and the third reservoir capacitor CRQ are connected in series between the input node VV and the reference node VG, the first flying capacitor CF2 and the second flying capacitor CF1 are connected in parallel between the input node VV and the third output node VQ and the first reservoir capacitor CRP and the third reservoir capacitor CRQ are connected in parallel between the third output node VQ and the reference node VG, and also in parallel between the first output node VP and the reference voltage VG. This is achieved by closing the S1AVV switching path, the S1BVQ switching path, the S1B2B switching path, the S2AVV switching path and the S2BVP switching path.

In a second state, labelled P2 in FIG. 16b, the first flying capacitor CF2 and the first reservoir capacitor CRP are connected in parallel between the first output node VP and the reference node VG, the second flying capacitor CF1 and the third reservoir capacitor CRQ are connected in parallel between the third output node VQ and the reference node VG, and the first output node VP and the third output node VQ are connected together. This is achieved by closing the S2AVP switching path, the S2BVG switching path, the S1BVG switching path, the S1AVQ switching path and the S1A2A switching path.

In a third state, labelled P3 in FIG. 16b, the first flying capacitor CF2 and the second reservoir capacitor CRN are connected in parallel between the reference node VG and the second output node VN, second flying capacitor CF1 and the fourth reservoir capacitor CRM are connected in parallel between the reference node VG and the fourth output node VM, and the second output node and the fourth output node are connected together. This is achieved by closing the S2AVG switching path, the S2BVN switching path, the S1AVG switching path, the S1BVM switching path and the S1B2B switching path.

By similar analysis to previous modes, in state P1, V(CF1)+VQ=VV. But from state P2, V(CF1)=VQ. Thus VQ+VQ=VV, so VQ=VV/2, and hence V(CF1)=VV/2.

In state P3 CRM is charged to −V(CF1), i.e. −VV/2. Similarly in state P1, V(CF2)+VP=VV. But from state P2, V(CF2)= VP. Thus V(CF2)=VV/2 and hence VP=VV/2.

In state P3 CRN is charged to −V(CF2), i.e. −VV/2.

FIG. 16a is a table showing which switching paths of the charge pump of FIG. 14a are used in each above state of this mode. These states may be sequenced in any order, for example P1, P2, P3, . . . or P1, P2, P1, P3: for example if there is little loading on VM and VN, so these outputs exhibit little voltage droop per cycle, while VP and VQ are more heavily loaded then the sequence might be modified to include more instances of state P2 than state P3, for example P1, P2, P1, P3, P1, P2, P1, P2, P1, P2, P1, P3 . . . .

In a tenth mode of operation, the switch matrix of FIG. 13a may be operable to provide a first bipolar output voltage of +/−VV/4 at the first and second output nodes (VP,VN), and a second bipolar output voltage of +/−VV/2 at the third and fourth output nodes (VQ,VM). The tenth mode is operable to provide the same output voltages as the first mode, but the extra switches available render it possible to provide additional switching states, labelled P4 and P5 in FIG. 17b, giving more flexibility in optimising the dynamic behaviour of the charge pump under different loads.

Figure 17B:
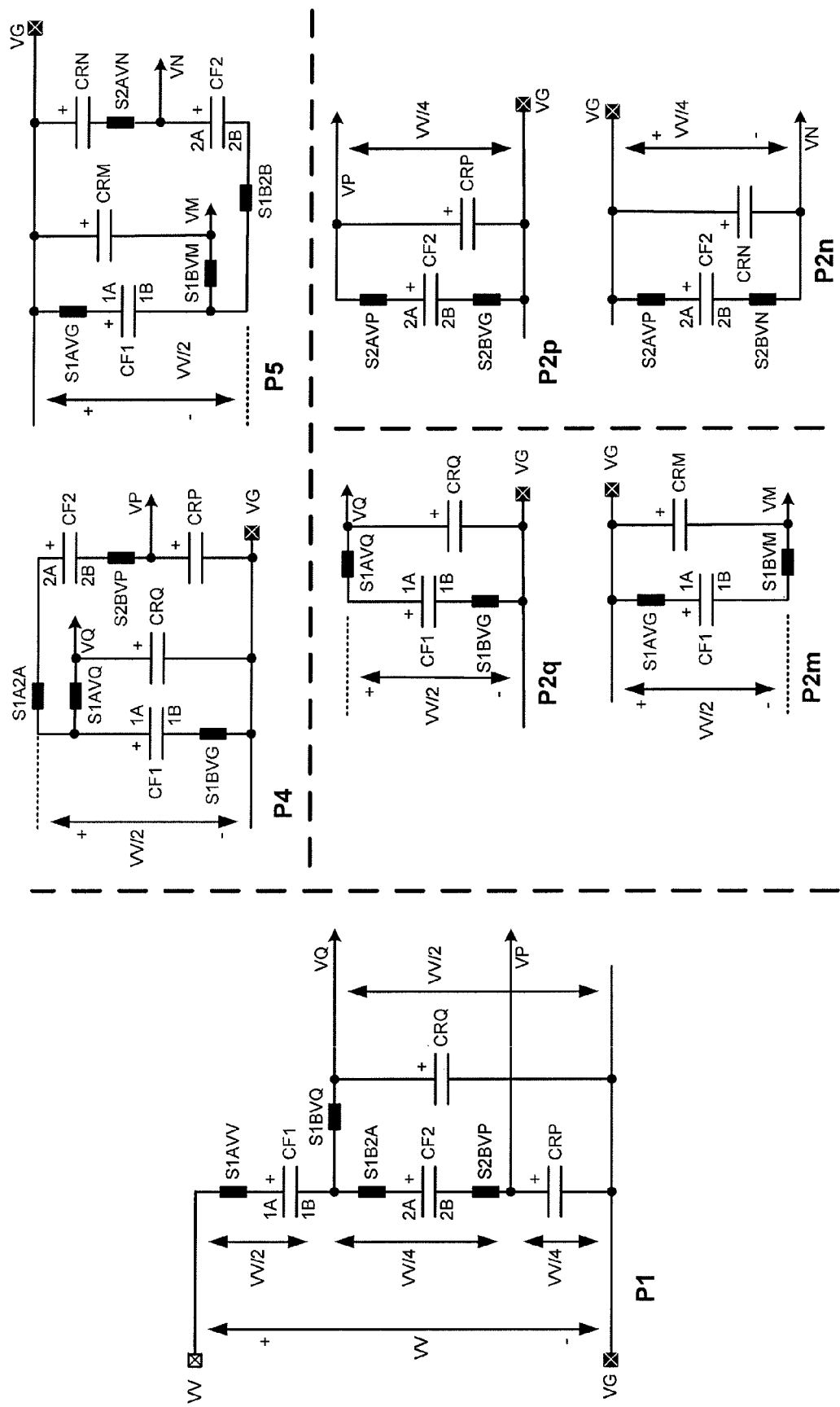
FIG. 17b shows the switching phases of the tenth mode of operation.

FIG. 17b illustrates one embodiment of a plurality of switching states of the charge pump of FIG. 13a which can be used to provide the above voltages at the output nodes.

In a first state, labelled P4 in FIG. 17b, the first flying capacitor CF2 and the first reservoir capacitor CRP are connected in series between the third output node VQ and the reference node VG, and the second flying capacitor CF1, the third reservoir capacitor CRQ and the series connected first flying capacitor CF2 and first reservoir CRP capacitor are connected in parallel between the third output node VQ and the reference node VG. This is achieved by closing the S2BVP switching path, the S1AVQ switching path, the S1BVG switching path and the S1A2A switching path.

In a second state, labelled P5 in FIG. 17b, the first flying capacitor CF2 and the second reservoir capacitor CRN are connected in series between the reference node VG and the fourth output node VM, and the second flying capacitor CF1, the fourth reservoir capacitor CRM and the series connected first flying capacitor CF2 and second reservoir capacitor CRN are connected in parallel between the reference node VG and the fourth output node VM. This is achieved by closing the S1AVG switching path, the S1BVM switching path, the S1B2B switching path and the S2AVN switching path.

Third to seventh states (labelled P1, P2n, P2p, P2q, and P2n) are identical to correspondingly labelled states of the first mode of operation. Thus the same analysis proves VQ=V (CF1)=VV/2, VM=−VV/2, VP=V(CF2)=VV/4, and VN=−VV/4.

States P4 and P5 provide additional states, compatible with third to seventh states, i.e. able to maintain the same steady state capacitor voltages, where for example, in state P5 CF2 can source charge from CRM to help supply a load on VN, even if V(CF2) has drooped below VV/4 due to heavy loading on a previous phase.

FIG. 17a is a table showing which switching paths of the charge pump of FIG. 14a are used in each above state of this mode. These states may be sequenced in a variety of ways, similar to those described with reference to FIG. 5c, but with additional possibilities arising from the enablement of new phases P4 and P5. As with other modes of operation above, some of the states may be omitted in particular cycles according to load demand and droop.

As described in the above seventh, eighth, ninth, and tenth modes, the switch matrix of FIG. 13a is operable to provide a bipolar output voltage of +/−VV/2, +/−VV/4 or +/−VV/6 at the first pair of output nodes (VP,VN), and to provide a bipolar output voltage of +/−VV/2 at the second pair of output nodes (VQ,VM). It should also be appreciated, that as the switch matrix of FIG. 13a also includes all of the switching paths of the switch matrix or FIG. 4a, the switch matrix of FIG. 13a is also operable to provide the above described first, second, third and fourth modes.

In other words, the switch matrix of FIG. 13a is operable to provide a first bipolar voltage of +/−VV, +/−VV/2, +/−VV/4 or +/−VV/6 at the first pair of output nodes (VP,VN), and to provide a bipolar output voltage of +/−VV/2 at the second pair of output nodes (VQ,VM).

Although the above describes individual modes of operation of the switch matrix separately, and the specific switching paths used in each mode, it should be apparent that when all of the switching paths of FIG. 13a are provided the mode of operation of the switch matrix may be varied in use, and thus the switch matrix may be operable to provide a first bipolar voltage that is selectable by the controller from the group of +/−VV, +/−VV/2, +/−VV/4 or +/−VV/6 at the first pair of output nodes (VP,VN), while providing a bipolar voltage of +/−VV/2 at the second pair of output nodes (VQ, VM).

Figure 18A:
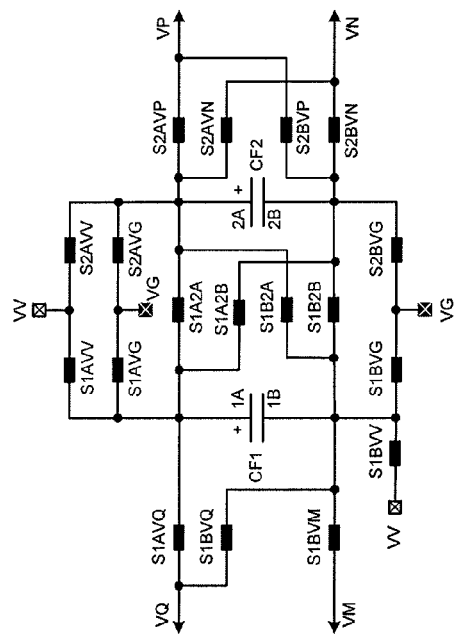
FIG. 18a shows a circuit diagram of a switch matrix according to another embodiment of the invention.

In other words, the switch matrix of FIG. 13a is operable to provide a variable first bipolar voltage and a fixed second bipolar output voltage FIG. 18a shows a circuit diagram, similar to FIG. 4a, of another switch matrix, in which the network of switching paths is explicitly shown. This switch matrix comprises all the switches of the switch matrix of FIG. 13a, but with two additional switching paths provided: S1A2B provided between the second flying capacitor terminal CF2B and the third flying capacitor terminal CF1A, and S1BVV provided between the fourth flying capacitor terminal CF1B and the input node VV.

Figure 18B:
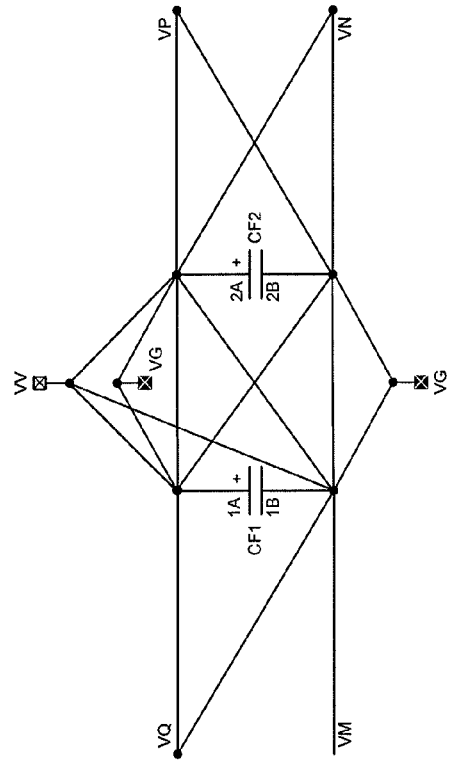

FIG. 18b shows a network plan of the switching paths in the switch matrix of FIG. 18a. Essentially, FIG. 18b shows more clearly the pairs of nodes between which there are provided respective switching paths.

By providing the additional switching paths S1A2B and S1BVV, the switch matrix of FIG. 18a includes all of the switching paths of the switch matrix of FIG. 13a, with the additional switching paths S1A2B and S1BVV provided. In other words, the switch matrix of FIG. 18a provides the same additional switching paths as provided in FIG. 11a. The switch matrix of FIG. 18a may therefore be operable in the fifth and sixth modes as described above to provide a first bipolar output voltage of +/−2VV or +/−3⁄2VV at the first and second output nodes (VP,VN), and a second bipolar output voltage of +/−VV/2 at the third and fourth output nodes (VQ,VM).

As will be understood, as the switch matrix of FIG. 18a contains all of the switches of the switch matrixes of FIGS.

4a, 9a, 11a and 13a, the switch matrix of FIG. 18a is operable to provide all of the first to tenth modes as described above.

As should now be apparent, when all of the switching paths of FIG. 18a are provided, the switch matrix may be operable to provide a first bipolar voltage that is selectable by the controller from the group of +/−2VV, +/−½VV, +/−VV, +/−VV/2, +/−VV/4 or +/−VV6 at the first pair of output nodes (VP,VN), while providing a fixed bipolar voltage of +/−VV/2 at the second pair of output nodes (VQ,VM).

In other words, the switch matrix of FIG. 18a is operable to provide a variable first bipolar voltage at the first pair of output nodes (VP,VN), and to provide a fixed bipolar output voltage at the second pair of output nodes (VQ,VM)

The above described embodiments produce +/−VV/2 at one pair of outputs (VQ, VM) and a one or selectable more other bipolar output voltages at the other pair of outputs (VP, VN). In some systems or devices it is preferable for the bipolar voltage at VQ, VM to be +/−VV rather than +/−VV/2, for example for a device powered from a lower supply voltage VV.

Figure 19A:
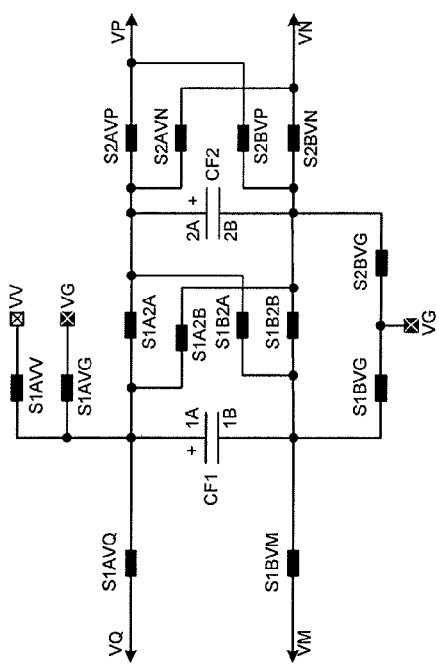
FIG. 19a shows a circuit diagram of a switch matrix according to another embodiment of the invention.

FIG. 19a shows a circuit diagram, similar to FIG. 4a, of another switch matrix, in which the network of switching paths is explicitly shown.

Figure 19B:
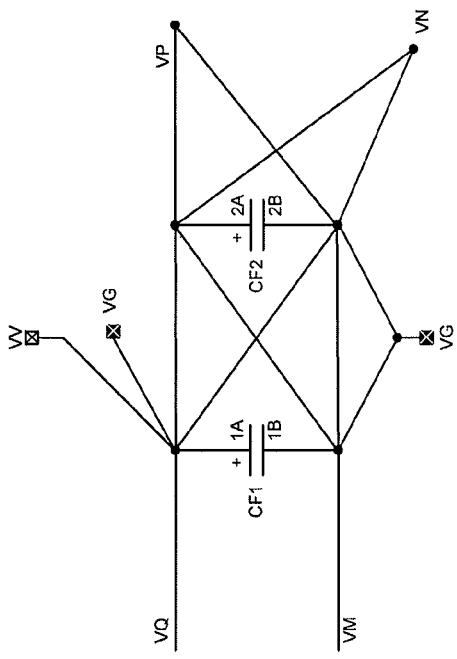

FIG. 19b shows a network plan of the switching paths in the switch matrix of FIG. 19a. Essentially, FIG. 19b shows more clearly the pairs of nodes between which there are provided respective switching paths.

As described below, the switch matrix of FIG. 19a may be operable in modes to provide a first bipolar output voltage of +/−VV/6, +/−VV/4, +/−VV/3, +/−VV/2, +/−VV, or +/−2*VV at the first and second output nodes (VP,VN), and a second bipolar output voltage of +/−VV at the third and fourth output nodes (VQ,VM).

As will be understood, as the switch matrix of FIG. 19a does not contain all of the switches of the switch matrix of FIG. 4a, for example S1BVQ.

In an eleventh mode of operation, the switch matrix of FIG. 19a may be operable to provide a first bipolar output voltage of +/−VV/4 at the first and second output nodes (VP,VN), and a second bipolar output voltage of +/−VV at the third and fourth output nodes (VQ,VM).

Figure 20B:
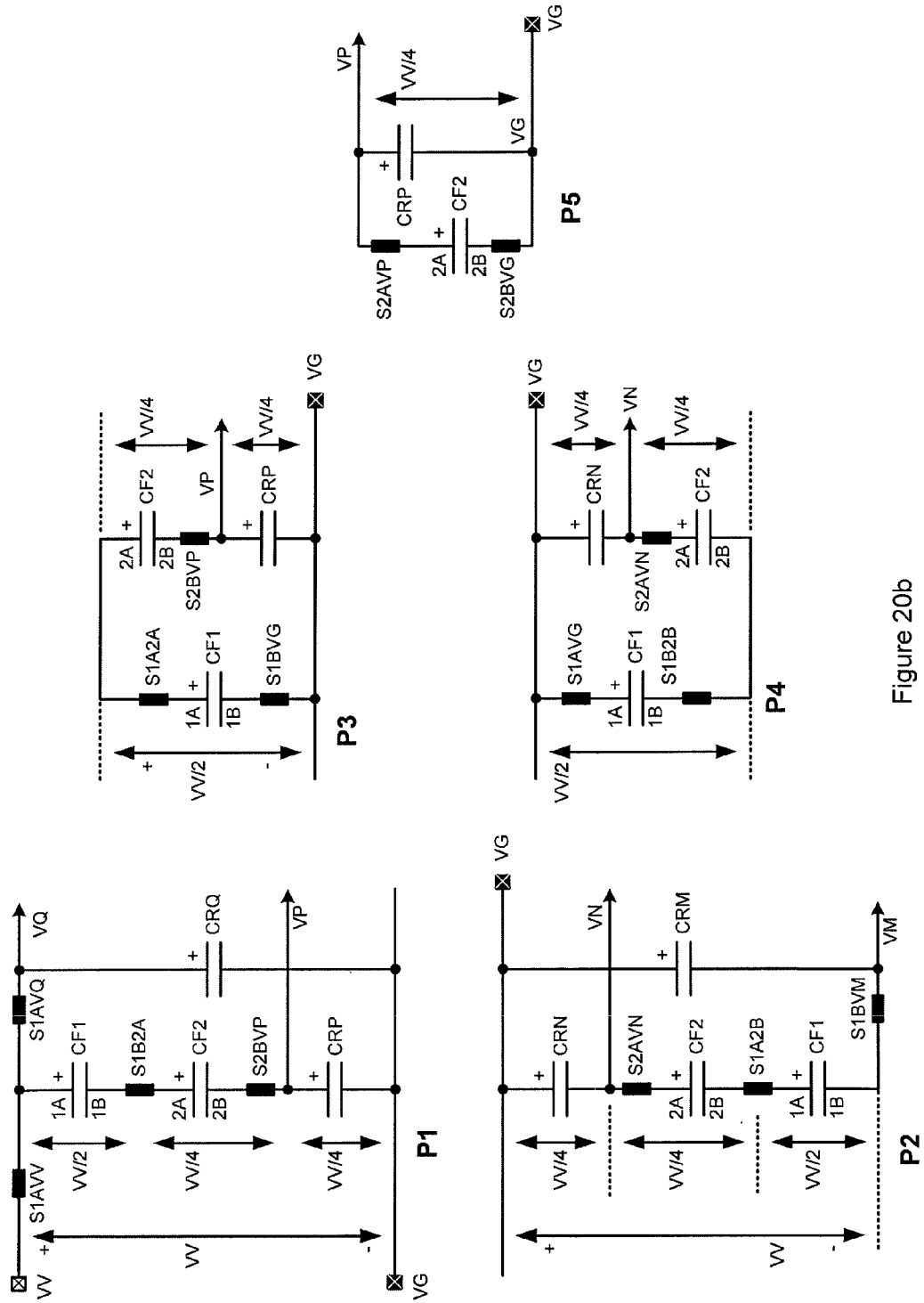
FIG. 20b shows the switching phases of the eleventh mode of operation.

FIG. 20b illustrates one embodiment of a plurality of switching states of the charge pump of FIG. 19a which can be used to provide the above voltages at the output nodes. FIG. 20b shows the switching paths activated in each phase and the resulting respective circuit topologies.

From inspection of FIG. 20b, the steady-state output voltages may be derived similarly to analyses above.

In state P1, V(CF1)+V(CF2)+VP=VV.

But from P3, V(CF1)=V(CF2)+VP, so by substitution for V(CF1), 2*V(CF2)+2*VP=VV.

But from state P5, V(CF2)=VP, so by substitution for V(CF2), 2*VP+2*VP=4*VP=VV, so hence VP=VV/4, also V(CF2)=VV/4 and V(CF1)=V(CF2)+VP=VV/4+VV/4=VV/2.

From state P4, VN=−(V(CF1)−V(CF2), so VN=−(VV/2−VV/4)=−VV/4.

From state P2, VM=−(V(CF1)+V(CF2)−VN)=−(VV/2+VV/4+VV/4)=−VV.

Finally VQ=VV from the direct connection via S1AVV and S1AVQ in state P1.

FIG. 20a is a table showing which switching paths of the charge pump of FIG. 19a are used in each above state of this mode. In common with other modes of operation, the various states may be sequenced in any order, for example P1, P2, P3, P4, P5 . . . or P1, P4, P1, P2, P1, P3, P1, P5, or some states may be omitted in some cycles according to load current demand and droop.

In a twelfth mode of operation, the switch matrix of FIG. 19a may also be operable to provide a first bipolar output voltage of +/−VV/6 at the first and second output nodes (VP,VN), and a second bipolar output voltage of +/−VV at the third and fourth output nodes (VQ,VM).

Figure 21B:
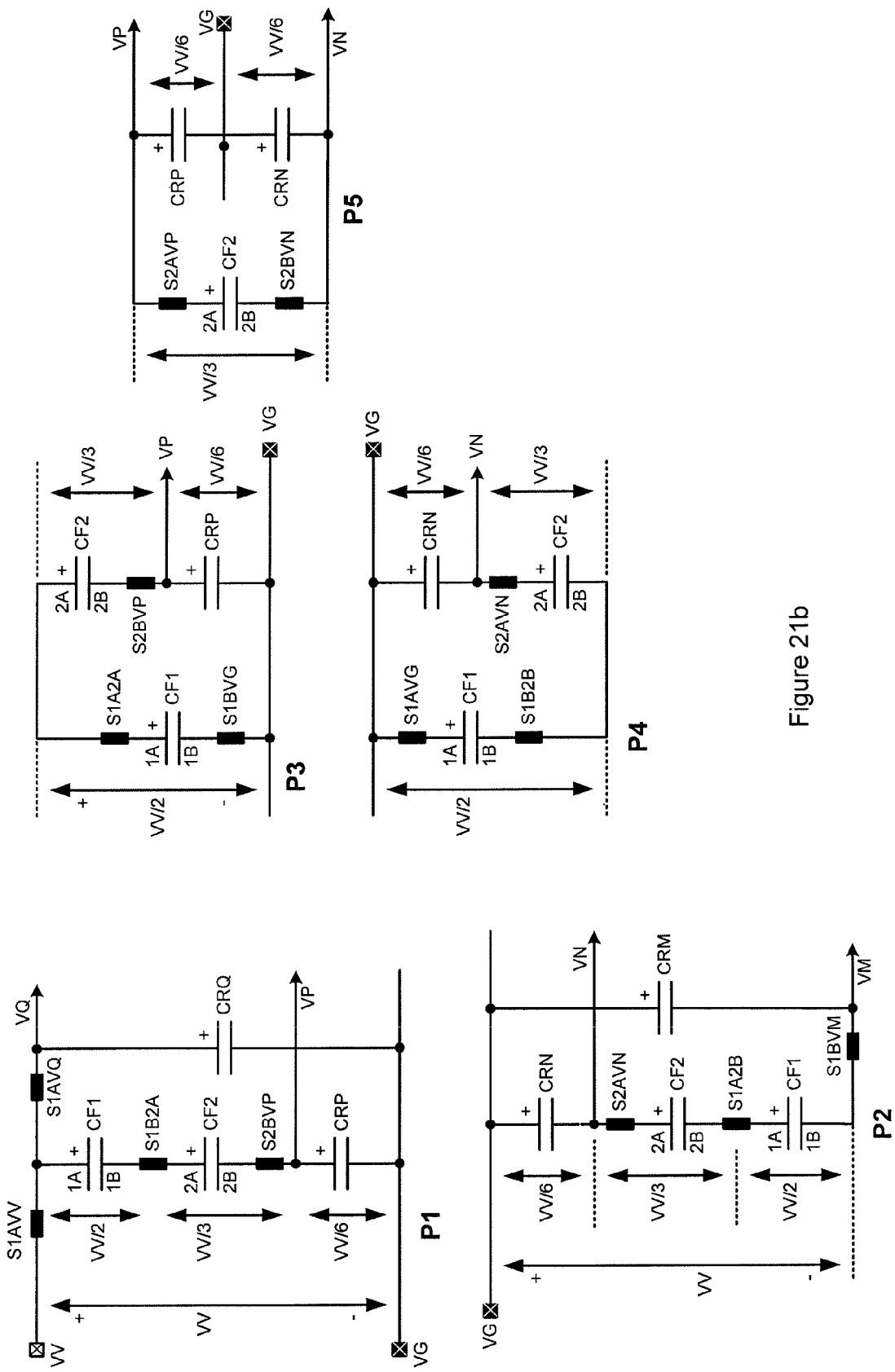
FIG. 21b shows the switching phases of the twelfth mode of operation.

FIG. 21b illustrates one embodiment of a plurality of switching states of the charge pump of FIG. 19a which can be used to provide the above voltages at the output nodes. FIG. 21b shows the switching paths activated in each phase and the resulting respective circuit topologies.

Please note that the first, second, third, and fourth switching states P1, P2, P3, P4 are identical to the respective states of the previous eleventh mode.

From inspection of FIG. 21b, the steady-state output voltages may be derived similarly to analyses above.

In state P1, V(CF1)+V(CF2)+VP=VV, but in state P3, VP=V(CF1)−V(CF2), so 2*V(CF1)=VV, i.e. V(CF1)=VV/2.

In state P3, VP=V(CF1)−V(CF2), but from state P4, VN=−(V(CF1)−V(CF2)), so VN=−VP.

From state P5, V(CF2)=VP−VN, but since VN=−VP, V(CF2)=2*VP.

So returning to state P1, where V(CF1)+V(CF2)+VP=VV, since V(CF1)=VV/2 and V(CF2)=2*VP, then VV/2+2*VP+VP=VV, hence VP=VV/6.

Thus V(CF2)=VV/3, and VN=−VV/6.

From state P2, VM=−(V(CF1)+V(CF2)−VN)=VV.

Finally VQ=VV from the direct connection via S1AVV and S1AVQ in state P1.

FIG. 21a is a table showing which switching paths of the charge pump of FIG. 19a are used in each above state of this mode. In common with other modes of operation, the various states may be sequenced in any order, for example P1, P2, P3, P4, P5 . . . or P1, P4, P1, P2, P1, P3, P1, P5, or some states may be repeated, replaced or omitted in some cycles according to load current demand and droop.

In a thirteenth mode of operation, the switch matrix of FIG. 19a may also be operable to provide a first bipolar output voltage of +/−VV/3 at the first and second output nodes (VP,VN), and a second bipolar output voltage of +/−VV at the third and fourth output nodes (VQ,VM).

Figure 22B:
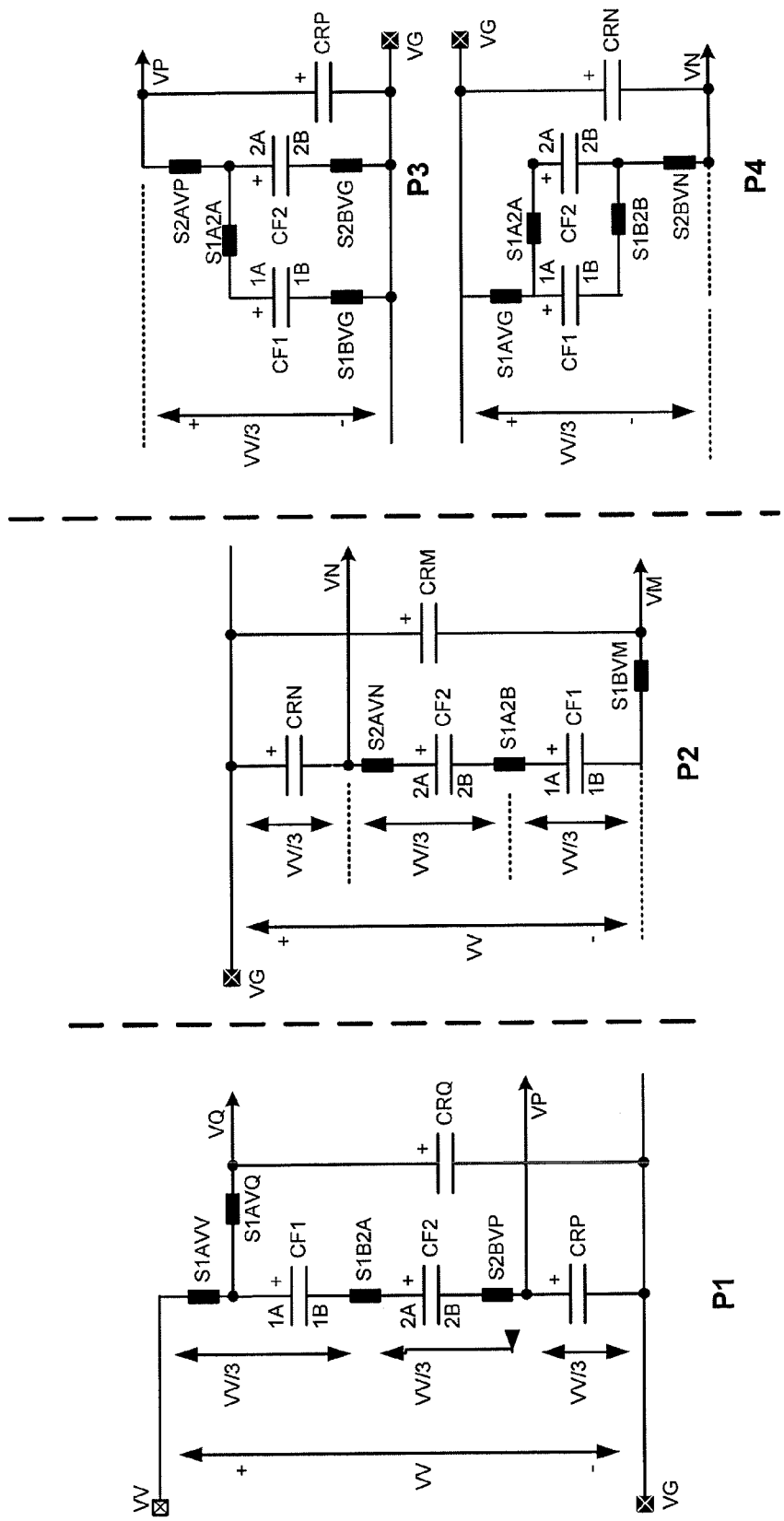
FIG. 22b shows the switching phases of the thirteenth mode of operation.

FIG. 22b illustrates one embodiment of a plurality of switching states of the charge pump of FIG. 19a which can be used to provide the above voltages at the output nodes. FIG. 22b shows the switching paths activated in each phase and the resulting respective circuit topologies.

Please note that the first and second switching states P1 and P2 are identical to the respective states of the previous eleventh and twelfth modes.

From inspection of FIG. 22b, the steady-state output voltages may be derived similarly to analyses above.

In state P1, V(CF1)+V(CF2)+VP=VV, but in state P3, VP=V(CF1)=V(CF2), so V(CF1)=V(CF2)=VP=VV/3.

In state P4, VN=−V(CF1), so VN=−VV/3.

In state P2, VM=−(V(CF1)+V(CF2)−VN), so VM=−VV.

Finally VQ=VV from the direct connection via S1AVV and S1AVQ in state P1

FIG. 22a is a table showing which switching paths of the charge pump of Figure Ca are used in each above state of this mode. In common with other modes of operation, the various states may be sequenced in any order, for example P1, P2, P3, P4 . . . or P1, P4, P1, P2, P1, P3, P1, or some states may be omitted in some cycles according to load current demand and droop.

In a fourteenth mode of operation, the switch matrix of FIG. 19a may also be operable to provide a first bipolar output voltage of +/−VV/2 at the first and second output nodes (VP,VN), and a second bipolar output voltage of +/−VV at the third and fourth output nodes (VQ,VM).

Figure 23B:
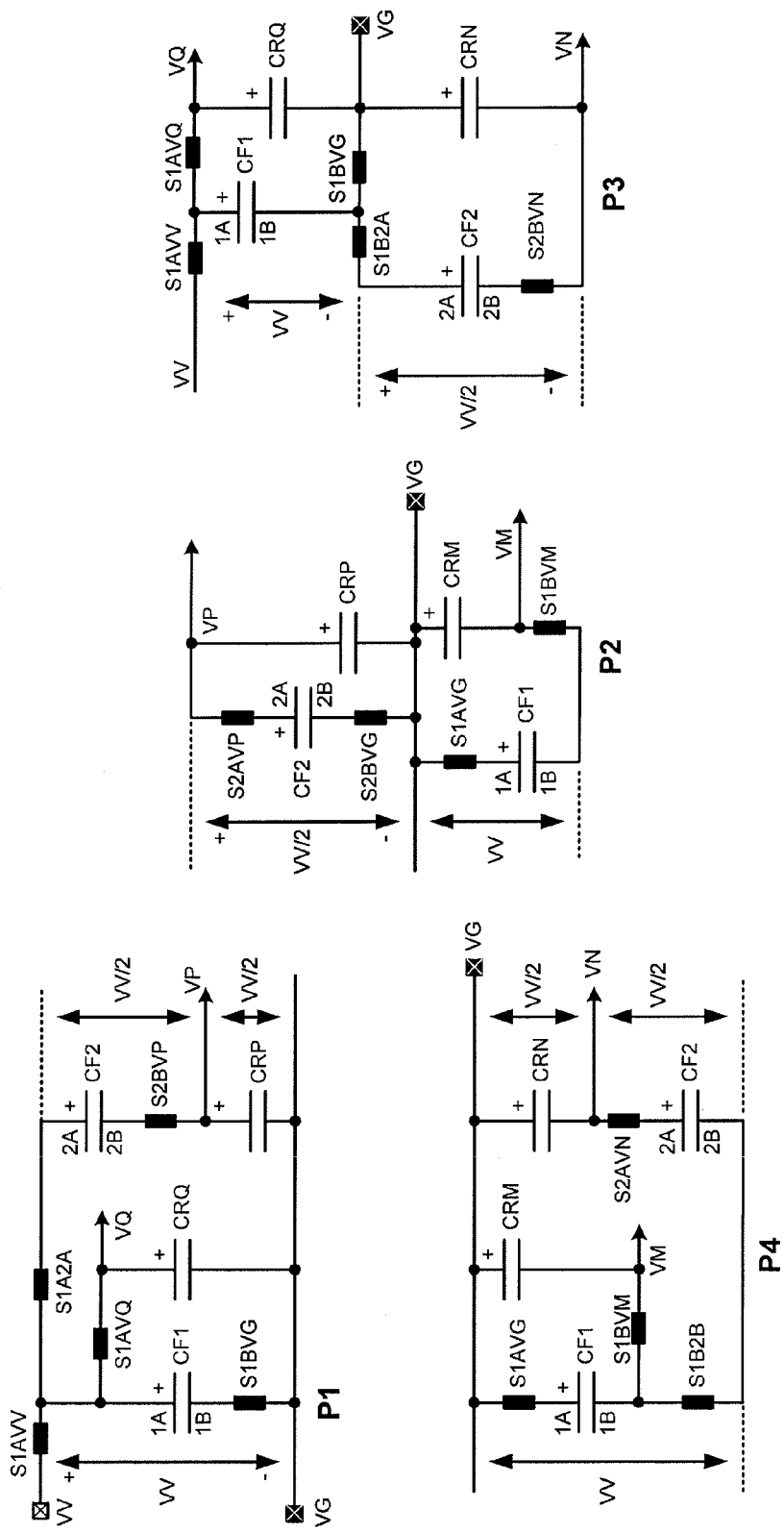
FIG. 23b shows the switching phases of the fourteenth mode of operation.

FIG. 23b illustrates one embodiment of a plurality of switching states of the charge pump of FIG. 19a which can be used to provide the above voltages at the output nodes. FIG. 23b shows the switching paths activated in each phase and the resulting respective circuit topologies.

From inspection of FIG. 23b, the steady-state output voltages may be derived similarly to analyses above.

In states P2 and P3, VQ=V(CF1), VM=−V(CF1), VP=V(CF2), VN=−V(CF2).

From P1, V(CF2)+VP=VV, but since V(CF2)=VP, then VP=VV/2 and V(CF2)=VV/2.

Also from P1, V(CF1)=VV, so VQ=V(CF1)=VV and VM=−V(CF1)=−VV.

State P4 is an optional state realisable with the switches of FIG. 19a, in which CF2 is placed in series with CRN: any droop on CF2 thus actually helps bring VN more negative after transition into this state.

FIG. 23a is a table showing which switching paths of the charge pump of Figure Ca are used in each above state of this mode. In common with other modes of operation, the various states may be sequenced in any order, for example P1, P2, P3, . . . or P1, P4, P1, P2, P1, P3, P1, or some states may be omitted in some cycles according to load current demand and droop.

In a fifteenth mode of operation, the switch matrix of FIG. 19a may also be operable to provide a first bipolar output voltage of +/−VV at the first and second output nodes (VP, VN), and a second bipolar output voltage of +/−VV at the third and fourth output nodes (VQ,VM).

Figure 24B:
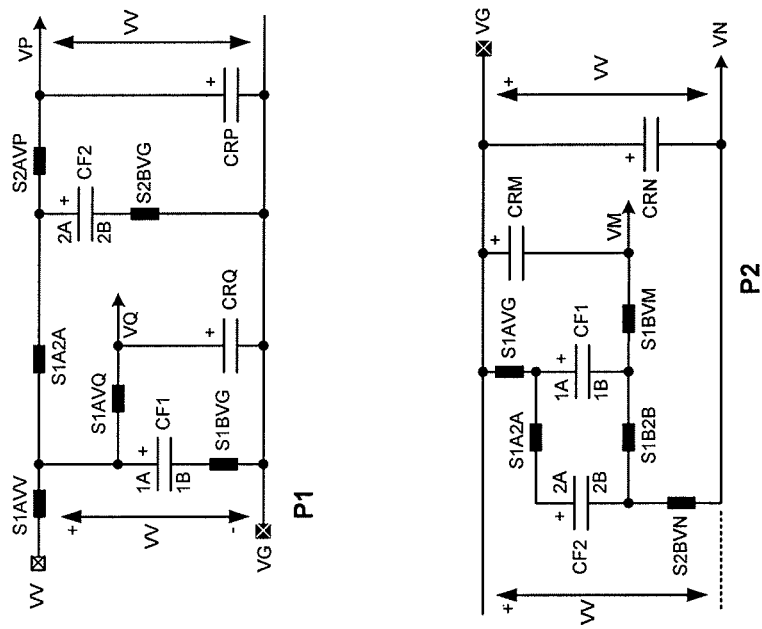
FIG. 24b shows the switching phases of the fifteenth mode of operation.

FIG. 24b illustrates one embodiment of a plurality of switching states of the charge pump of FIG. 19a which can be used to provide the above voltages at the output nodes. FIG. 24b shows the switching paths activated in each phase and the resulting respective circuit topologies.

From inspection of FIG. 24b, the steady-state output voltages may be derived similarly to analyses above.

In state P1, V(CF1)=VQ=V(CF2)=VP=VV. In state P2, VN=VM=−V(CF1)=−VV.

FIG. 24a is a table showing which switching paths of the charge pump of FIG. 19a are used in each above state of this mode. In common with other modes of operation, the various states may be sequenced in any order, and some states may be omitted in some cycles according to load current demand and droop.

In a sixteenth mode of operation, the switch matrix of FIG. 19a may also be operable to provide a first bipolar output voltage of +/−2*VV at the first and second output nodes (VP,VN), and a second bipolar output voltage of +/−VV at the third and fourth output nodes (VQ,VM).

Figure 25B:
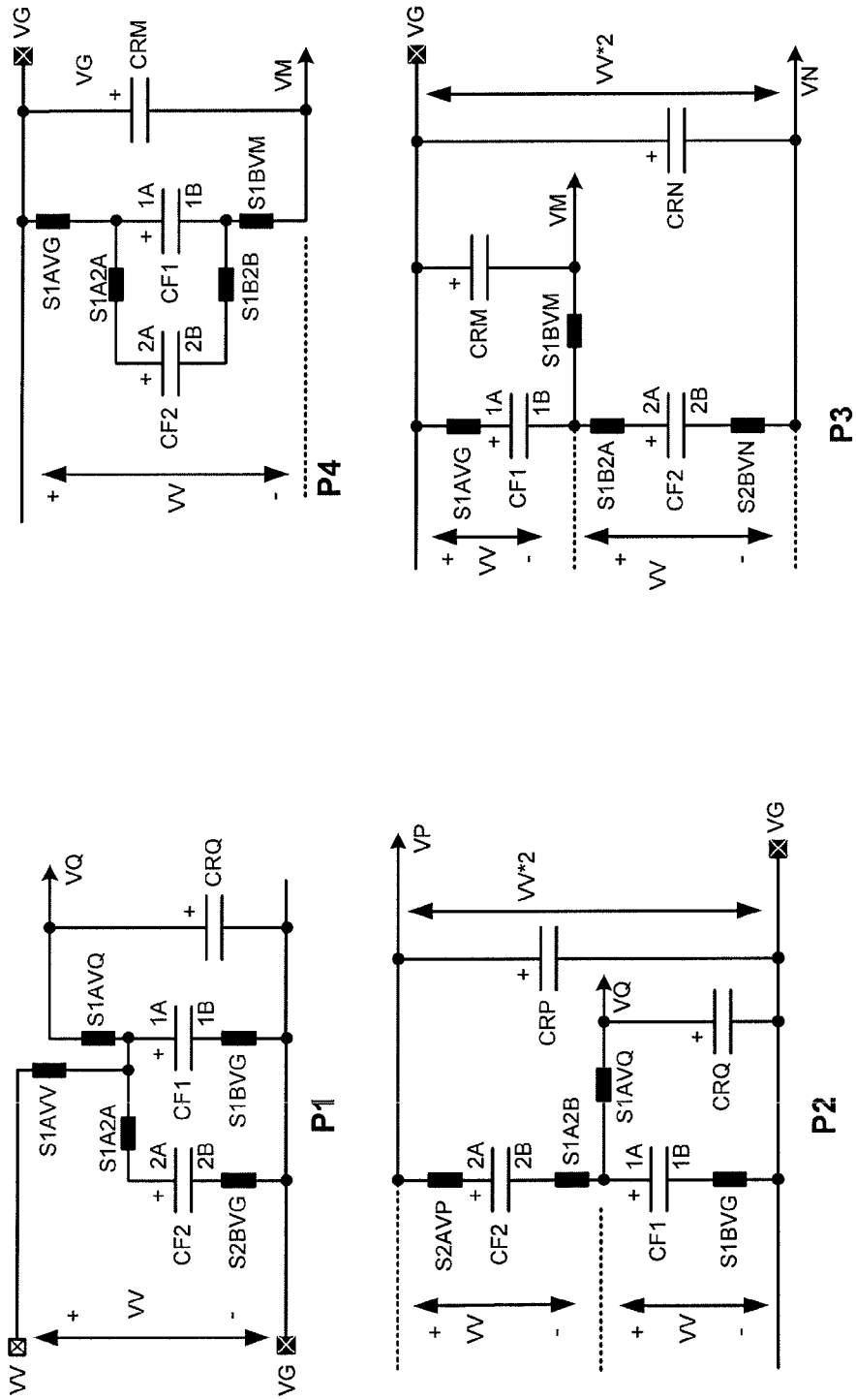
FIG. 25b shows the switching phases of the sixteenth mode of operation.

FIG. 25b illustrates one embodiment of a plurality of switching states of the charge pump of FIG. 19a which can be used to provide the above voltages at the output nodes. FIG. 25b shows the switching paths activated in each phase and the resulting respective circuit topologies.

From inspection of FIG. 25b, the steady-state output voltages may be derived similarly to analyses above.

In state P1, V(CF1)=V(CF2)=VQ=VV.
In state P2, VP=V(CF1)+V(CF2)=2*VV
In state P3, VM=−V(CF1)=−VV, and VN=−(V(CF1)+V(CF2))=−2*VV.

FIG. 25a is a table showing which switching paths of the charge pump of FIG. 19a are used in each above state of this mode. In common with other modes of operation, the various states may be sequenced in any order, and some states may be omitted in some cycles according to load current demand and droop. State P4 is an optional extra state using the existing switches, compatible with the above steady state voltages, which may thus be interleaved with the other states if desired.

As described in the above eleventh to sixteenth modes, the switch matrix of FIG. 19a is operable to provide a bipolar output voltage of +/−2*VV, +/−VV, +/−VV/2, +/−VV/3, +/−VV/4 or +/−VV/6 at the first pair of output nodes (VP, VN), and to provide a bipolar output voltage of +/−VV at the second pair of output nodes (VQ,VM).

Although the above describes individual modes of operation of the switch matrix separately, and the specific switching paths used in each mode, it should be apparent that when all of the switching paths of FIG. 19a are provided the mode of operation of the switch matrix may be varied in use, and thus the switch matrix may be operable to provide a first bipolar voltage that is selectable by the controller from the group of +/−2*VV, +/−VV, +/−VV/2, +/−VV/3, +/−VV/4 or +/−VV/6 at the first pair of output nodes (VP,VN), while providing a bipolar voltage of +/−VV at the second pair of output nodes (VQ,VM).

In other words, the switch matrix of FIG. 19a is operable to provide a variable first bipolar voltage at the first pair of output nodes (VP,VN), and to provide a fixed bipolar output voltage at the second pair of output nodes (VQ,VM).

Figure 26A:
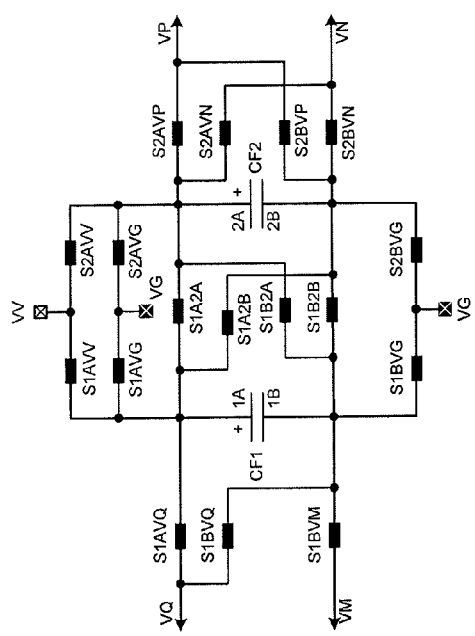
FIG. 26a shows a circuit diagram of a switch matrix according to another embodiment of the invention.
Figure 26B:
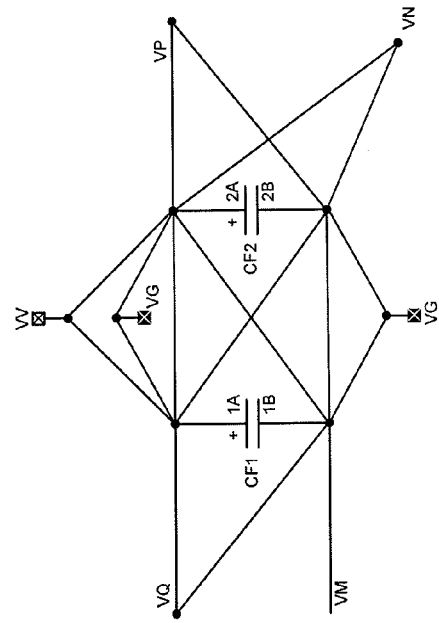

FIG. 26a shows a circuit diagram, similar to FIG. 19a, of another switch matrix, in which the network of switching paths is explicitly shown. FIG. 26b shows a network plan of the switching paths in the switch matrix of FIG. 26a.

This switch matrix comprises all the switches of the switch matrix of FIG. 19a, but with three additional switching paths provided: S1BVQ provided between the fourth flying capacitor terminal CF1B and the input node VV; S2AVV provided between the first flying capacitor terminal CF2A and the input node VV; and S2AVG provided between the first flying capacitor terminal CF2A and the reference node VG.

Also, this switch matrix comprises all the switches of the switch matrix of FIG. 13a, but with one additional switching path S1A2B provided between the third flying capacitor terminal CF1A and the second flying capacitor terminal CF2B.

Since the switch matrix of FIG. 26a includes all of the switching paths of the switch matrix of FIG. 19a, it may therefore be operable in the eleventh to sixteenth modes to provide a first bipolar output voltage of +/−2VV, +/−VV, +/−VV/2, +/−VV/3, +/−VV/4 or +/−VV/6 at the first and second output nodes (VP,VN), and a second bipolar output voltage of +/−VV at the third and fourth output nodes (VQ, VM).

But also, since the switch matrix of FIG. 26a includes all of the switching paths of the switch matrix of FIG. 13a, it may therefore be operable in the first to fourth and seventh to tenth modes to provide a first bipolar output voltage of +/−VV, +/−VV/2, +/−VV/4 or +/−VV/6 at the first and second output nodes (VP,VN), and a second bipolar output voltage of +/−VV/2 at the third and fourth output nodes (VQ,VM).

Moreover, since this switch matrix includes switching path S1A2B, in addition to all the switching paths of FIG. 4a, it may also be operable in the fifth mode to provide a first bipolar output voltage of +/−(⅔)*VV at the first and second output nodes (VP,VN), and a second bipolar output voltage of +/−VV/2 at the third and fourth output nodes (VQ,VM).

Also, as explained below, the switch matrix of FIG. 26a may therefore be operable in a seventeenth mode to provide a first bipolar output voltage of +/−3VV at the first and second output nodes (VP,VN), and a second bipolar output voltage of +/−VV at the third and fourth output nodes (VQ,VM).

Figure 27B:
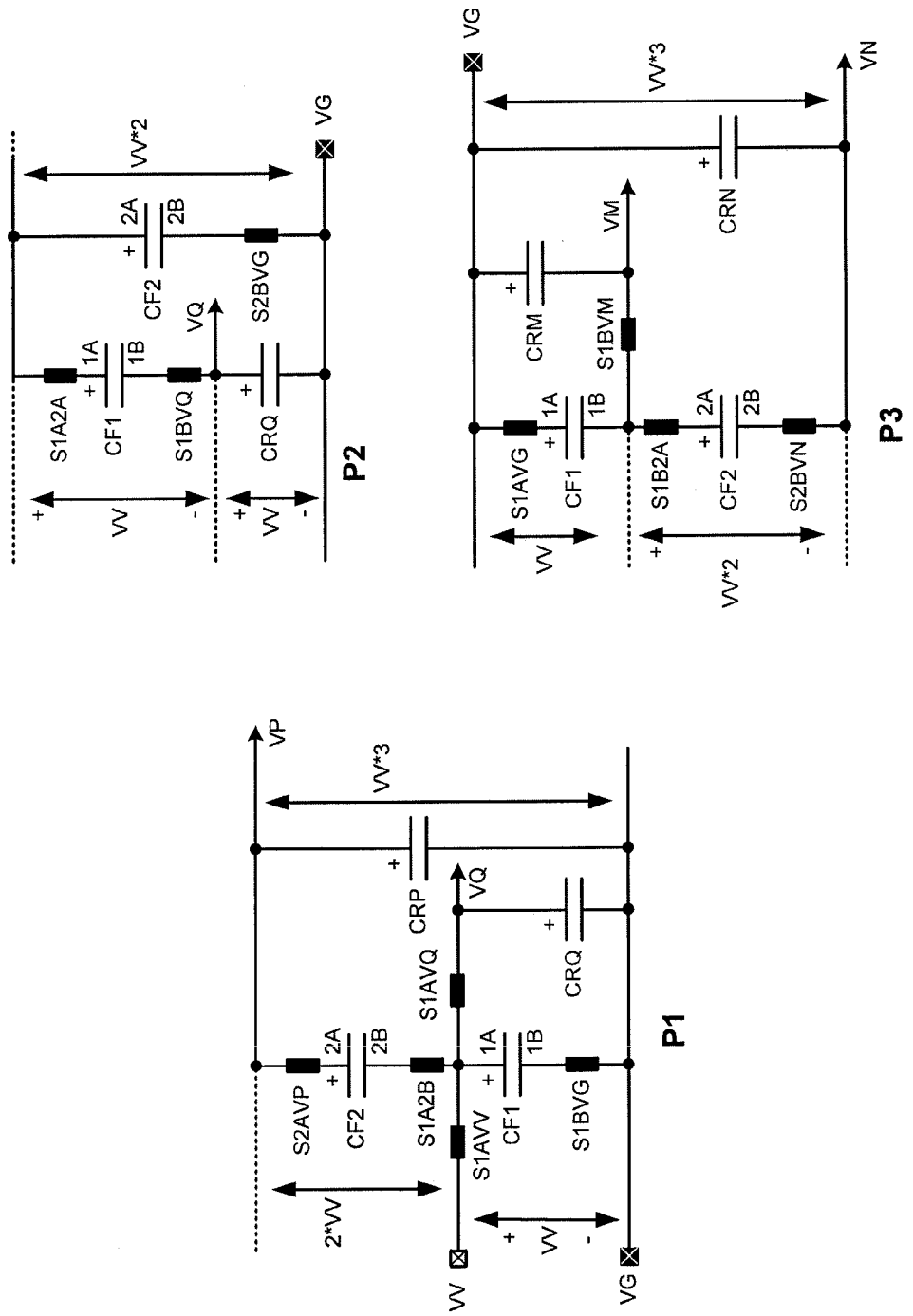
FIG. 27b shows the switching phases of the seventeenth mode of operation.

FIG. 27b illustrates one embodiment of a plurality of switching states of the charge pump of FIG. 26a which can be used to provide the above voltages at the output nodes in a seventeenth mode. FIG. 27b shows the switching paths activated in each phase and the resulting respective circuit topologies.

From inspection of FIG. 27b, the steady-state output voltages may be derived similarly to analyses above.

In state P1, V(CF1)=VV=VQ.
In state P2, V(CF2)=V(CF1)+VQ=2*VV
In state P1, VP=V(CF1)+V(CF2)=VV+2*VV=3*VV
In state P3, VM=−V(CF1)=−VV and VN=−(V(CF1)+V(CF2))=−3*VV.

FIG. 27a is a table showing which switching paths of the charge pump of FIG. 26a are used in each above state of this mode. In common with other modes of operation, the various states may be sequenced in any order, and some states may be omitted in some cycles according to load current demand and droop.

Figure 28A:
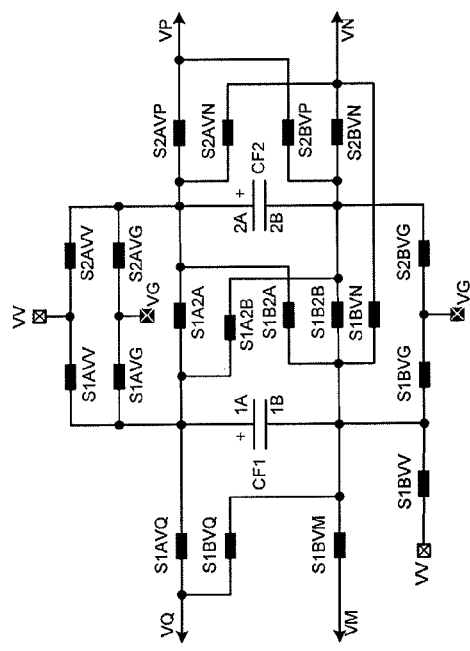
FIG. 28a shows a circuit diagram of a switch matrix according to another embodiment of the invention.
Figure 28B:
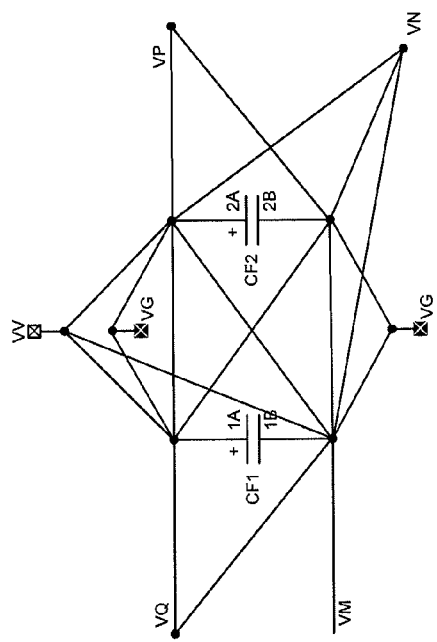

FIG. 28a shows a circuit diagram, similar to FIG. 26a, of another switch matrix, in which the network of switching paths is explicitly shown. FIG. 28b shows a network plan of the switching paths in the switch matrix of FIG. 28a.

This switch matrix comprises all the switches of the switch matrix of FIG. 26a, but with two additional switching paths provided: S1BVV provided between the fourth flying capacitor terminal CF1B and the input node VV; S1BVN provided between the fourth flying capacitor terminal CF1B and the output node VN.

Since the switch matrix of FIG. 28a includes all of the switching paths of the switch matrix of FIG. 26a, it may therefore be operable in the eleventh to seventeenth modes to provide a first bipolar output voltage of +/−3VV, +/−2VV, +/−VV, +/−VV/2, +/−VV/3, +/−VV/4 or +/−VV/6 at the first and second output nodes (VP,VN), and a second bipolar output voltage of +/−VV at the third and fourth output nodes (VQ,VM), also in the first to fourth and sixth to tenth modes to provide a first bipolar output voltage of +/−(3/2)*VV, +/−VV, +/−VV/2, +/−VV/4 or +/−VV/6 at the first and second output nodes (VP,VN), and a second bipolar output voltage of +/−VV/2 at the third and fourth output nodes (VQ,VM).

Moreover, since this switch matrix includes switching path S1BVV, it may also be operable in the sixth mode to provide a first bipolar output voltage of +/−2*VV at the first and second output nodes (VP,VN), and a second bipolar output voltage of +/−VV/2 at the third and fourth output nodes (VQ,VM).

Also, as explained below, the switch matrix of FIG. 28a may be operable in an eighteenth mode to provide a first bipolar output voltage of +/−VV/5 at the first and second output nodes (VP,VN), and a second bipolar output voltage of +/−VV at the third and fourth output nodes (VQ,VM).

Figure 29B:
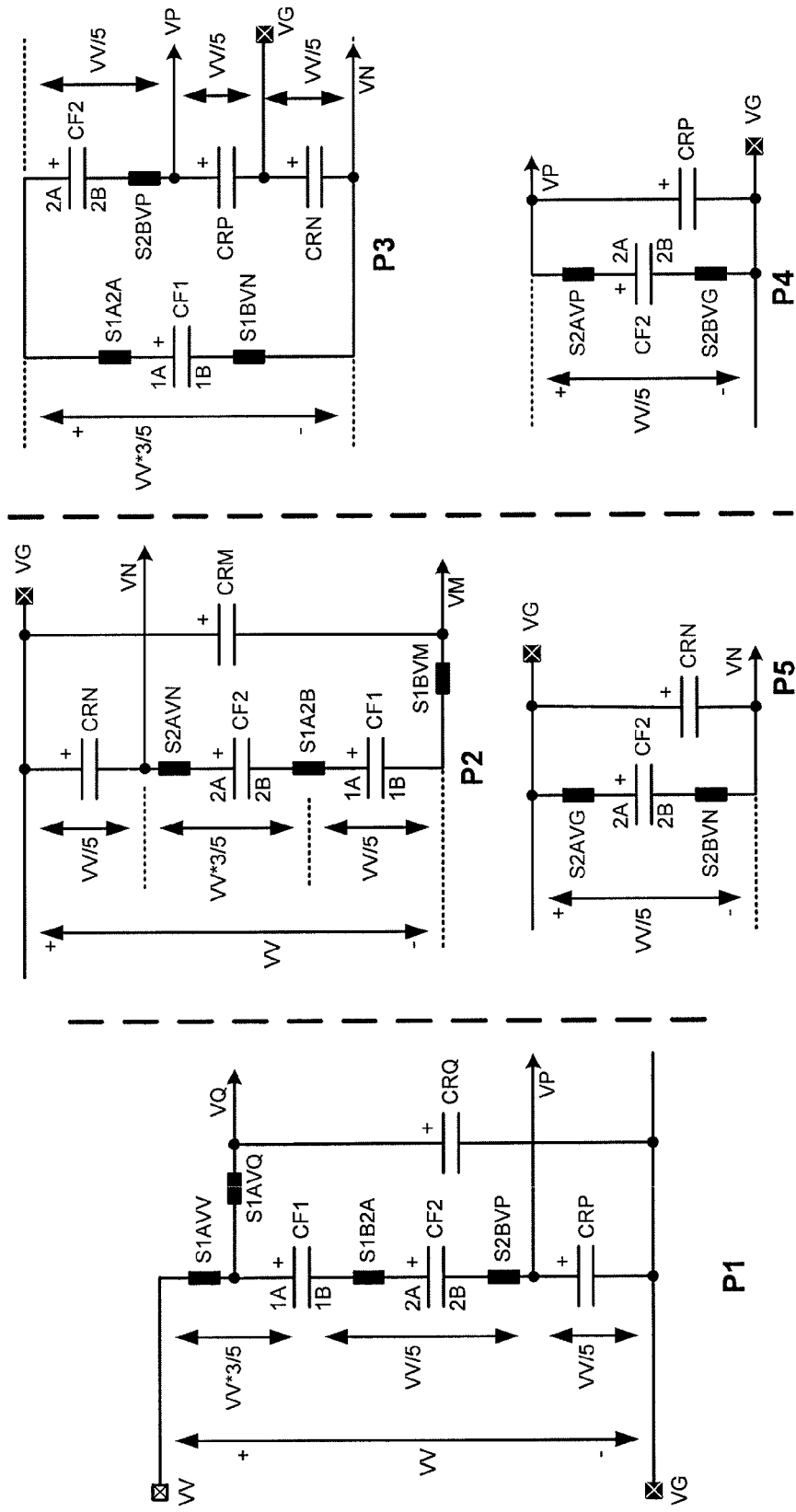
FIG. 29b shows the switching phases of the eighteenth mode of operation.

FIG. 29b illustrates one embodiment of a plurality of switching states of the charge pump of FIG. 28a which can be used in an eighteenth mode to provide the above voltages at the output nodes. FIG. 29b shows the switching paths activated in each phase and the resulting respective circuit topologies.

Please note that the first state P1, second state P2, and fourth state P4 are identical to the first state P1, the second state P2 and the fifth state P5 of FIG. 20b.

From inspection of FIG. 29b, the steady-state output voltages may be derived similarly to analyses above.

In state P4, VP=CF2, but in state P5=VN=−V(CF2), so VN=−VP.

But in state P3, V(CF1)=V(CF2)+VP−VN, so V(CF1)= 3*V(CF2)

From state P1, VV=V(CF1)+V(CF2)+VP
Substituting for V(CF1) and VP, VV=3*V(CF2)+V(CF2)+V(CF2)=5*VV, so V(CF2)=VV/5.
So from state P4, VP=V(CF2)=VV/5
And from state P5, VN=−V(CF2)=−VV/5
From state P2, VM=−((CF1)+V(CF2)−VN)=−5*(VV/5)=−VV
Finally from the direct connection in state P1, VQ=VV.

FIG. 29a is a table showing which switching paths of the charge pump of Figure Ca are used in each above state of this mode. In common with other modes of operation, the various states may be sequenced in any order, and some states may be omitted in some cycles according to load current demand and droop.

The switch matrix of FIG. 28a is operable in the above eleventh to eighteenth modes to provide a bipolar output voltage of +/−3*VV, +/−2*VV, +/−VV, +/−VV/2, +/−VV/3, +/−VV/4, +/−VV/5, or +/−VV/6 at the first pair of output nodes (VP,VN), while providing a bipolar output voltage of +/−VV at the second pair of output nodes (VQ,VM). The switch matrix of FIG. 28a is also operable in the above first to tenth modes to provide a bipolar output voltage of +/−2*VV, +/−(3/2)*VV, +/−VV, +/−VV/2, +/−VV/4 or +/−VV/6 at the first pair of output nodes (VP,VN), while providing a bipolar output voltage of +/−VV/2 at the second pair of output nodes (VQ,VM).

Although the above describes the situations of providing single output voltages when specific switches of the network of switching paths are utilized, it should be apparent that when all of the switching paths of FIG. 28a are provided the switch matrix may be operable to provide a first bipolar voltage that is selectable by the controller from the group of +/−3*VV, +/−2*VV, +/−VV, +/−VV/2, +/−VV/3, +/−VV/4, +/−VV/5 or +/−VV/6 at the first pair of output nodes (VP, VN), while providing a bipolar voltage of +/−VV at the second pair of output nodes (VQ,VM). Also, the switch matrix may be operable to provide a first bipolar voltage that is selectable by the controller from the group of +/−2*VV, +/−(3/2)*VV, +/−VV, +/−VV/2, +/−VV/4 or +/−VV/6 at the first pair of output nodes (VP,VN), while providing a bipolar voltage of +/−VV/2 at the second pair of output nodes (VQ, VM).

In other words, the switch matrix of FIG. 28a is operable to provide a variable first bipolar voltage at the first pair of output nodes (VP,VN), and to provide a fixed or selected bipolar output voltage at the second pair of output nodes (VQ,VM).

Figure 30:
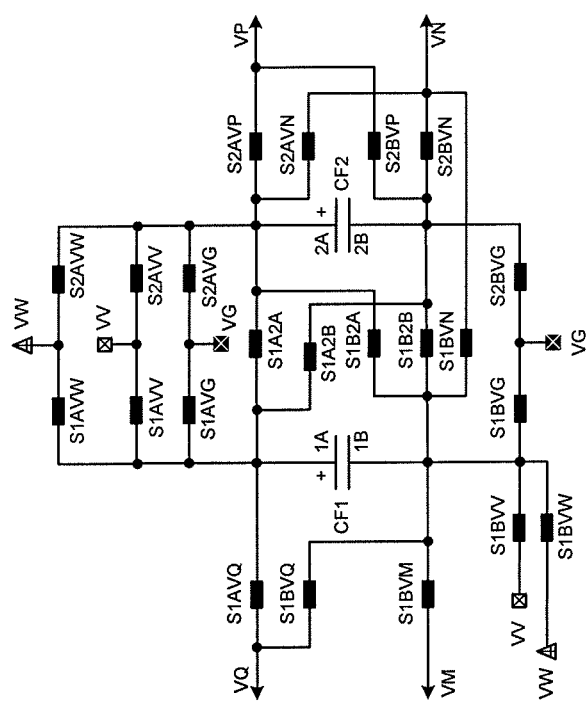
FIG. 30 shows the circuit diagram of switch matrix of FIG. 28a with an alternative input supply voltage.

FIG. 30 shows a circuit diagram of a switch matrix, similar to FIG. 28a, of another switch matrix, in which the network of switching paths is explicitly shown. This switch matrix comprises the switch matrix of FIG. 28a, but includes an additional voltage input node VW and switching paths S1AVW and S2AVW and optionally S1BVW.

In the case of the controller selecting the additional input voltage VW rather than the input voltage VV, the switching paths S1AVV and S2AVV (and S1BVV where applicable) are left open in all of the switching phases of the above described first to eighteenth switching modes and the switching paths S1AVW and S2AVW (and S1BVW where applicable) are used in their place.

These additional switches allow the charge pump to be supplied from either VV or VW. If both VV and VW are available at the same time, but are different voltages, this allows a wider range of output voltages, i.e. a combination of those derivable from VV and those derivable from VW. In some cases, only one may be selected at a time, for example in the case of a host device being powered from a 5V USB port, or from a 3V battery-derived supply in the absence of a USB connection.

In either case, it is preferable to use these parallel switches, rather than use an upstream selector switch between VV and VW, to avoid the ohmic losses ensuing from a series connection of switches.

Although only a single additional input voltage VW is shown, as would be understood by the skilled person, any number of additional input voltages could be used by providing appropriate additional switching paths, similar to S1AVW and S2AVW (and S1BVW if necessary).

Although only a charge pump based on the charge pump of FIG. 28a is shown in FIG. 30, it should be apparent that the charge pumps of FIGS. 4a, 9a, 11a, 13a, 18a, 19a and 26a could be modified in a similar way to provide an additional input voltage(s).

Figure 31A:
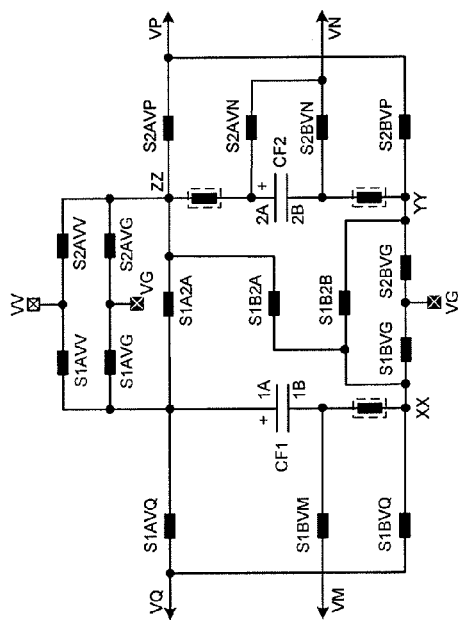
FIG. 31a shows a circuit diagram of a switch matrix according to another embodiment of the invention with additional switches provided to reduce stress.
Figure 31B:
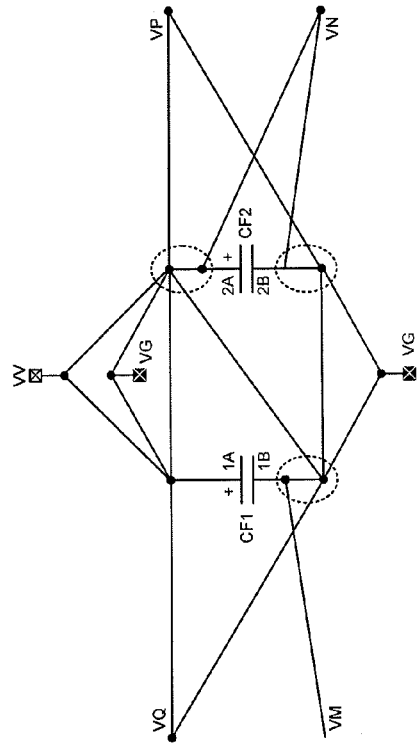

As mentioned above, switching paths may comprise either single switches or possibly equivalent nets comprising a plurality of switches. FIG. 31a shows a circuit diagram of a switch matrix comprising such nets, in which the network of switches is explicitly shown. FIG. 31b shows a network plan of the switching paths in the switch matrix of FIG. 31a.

The extra paths can be identified most clearly by comparing FIG. 31b with FIG. 13b. The networks shown are similar, but FIG. 31b shows extra switching paths to those flying capacitor terminals (CF1B, CF2B and CF2A) that are connected to switching paths to VN or VM and added nodes XX, YY, ZZ where other switching paths terminate. For instance in FIG. 31b the positive plate of CF2 (node CF2A) is still connected via a switching path directly to VN, but connected to other switching paths via an additional switching path and a node ZZ, where the other switching paths previously connected to CF2A now terminate.

FIG. 31a essentially shows the switch matrix of FIG. 13a, but shows three additional switching paths. The first additional switching path is located between the first flying capacitor terminal CF2A and a node labelled ZZ. The second additional switching path is located between the second flying capacitor terminal CF2B and a node labelled ZY. The third additional switching path is located between the fourth flying capacitor terminal CF1B and a node labelled XX.

As can be seen from FIGS. 31a and 31b, the additional switching paths act to reduce the stress on the switching paths connected to the second and fourth output nodes (VN,VM). In particular, if these extra switching paths are deactivated during states where respective capacitor terminals (e.g. CF2A) are switched to VM or VN, then the nearby terminals of the other, open, switching paths (e.g. S2AVP, S2AVV) from the other end of the added switching path (e.g. ZZ) to high voltage nodes VV, VP or VQ are no longer connected to the negative voltage VM or VN so are not subjected to the maximum voltage stress (e.g VV−VN). In such a state, node ZZ would be connected to ground (e.g. by S2AVG). In other words, the additional switching paths act to reduce the maximum voltage across any one switching path, and its component physical switches, allowing smaller or simpler switching structures to be used to implement these switching paths, which is advantageous.

These additional switching paths involved in the connection at certain nodes do not affect the connectivity of the flying capacitor nodes to the voltage nodes VP, VN, VQ, VM, VV, and VG in each switching state. The T-switch arrangements described serve only as a variant method for implementing the required interconnection of these nodes.

Although only three additional switching paths are provided to reduce the loads, it should be apparent that fewer or more than three additional switching paths may be provided to reduce the stress across switching elements of the switch matrix.

Figure 32A:
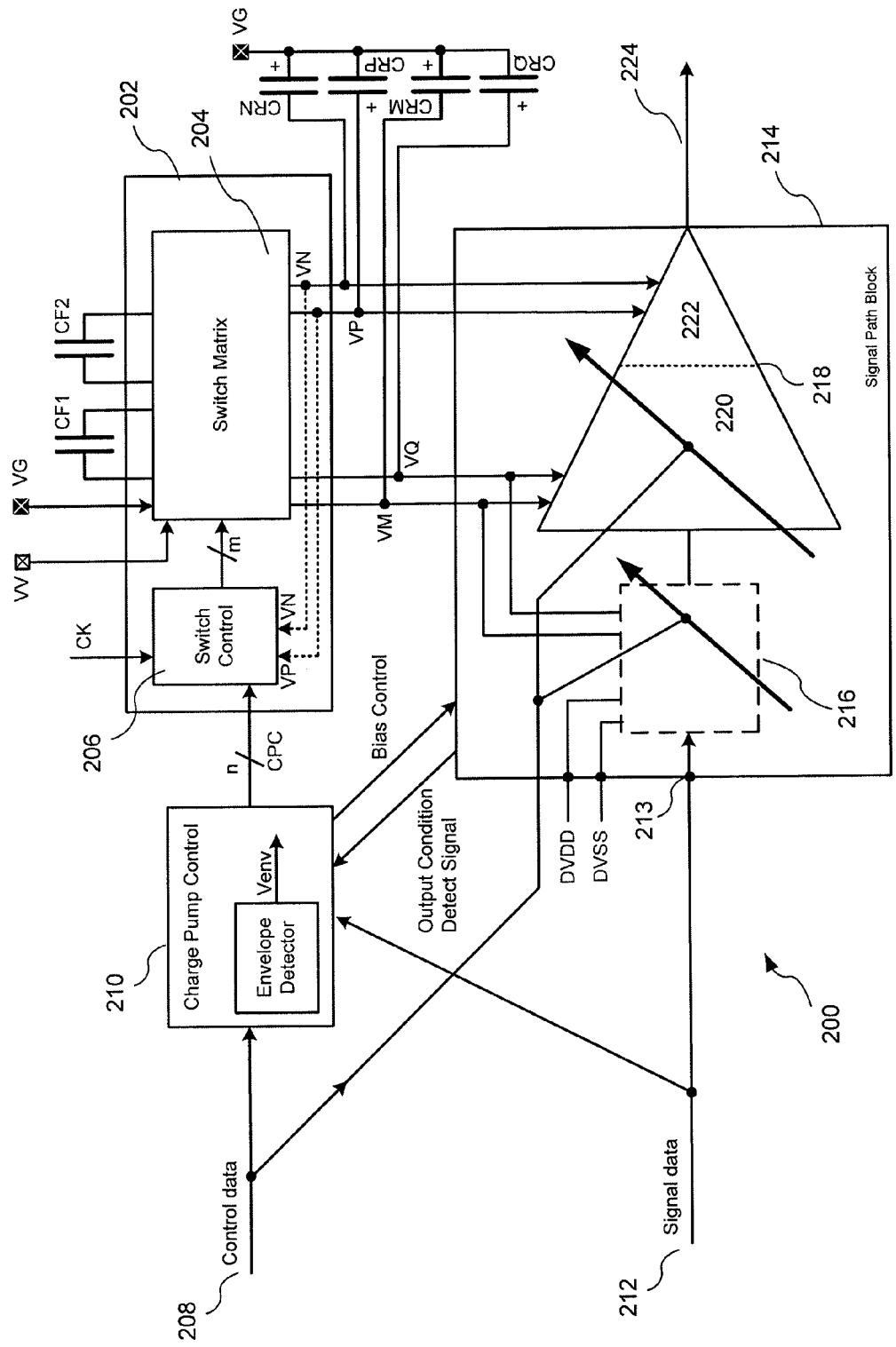
FIG. 32a schematically shows an output chain comprising the charge pump circuit according to embodiments of the present invention.

FIG. 32a schematically shows an audio output chain 200, comprising a charge pump circuit 202 operable in any one or more of the above described first to eighteenth modes.

As can be seen from FIG. 32a, the charge pump circuit 202 comprises a switch matrix or network of switching paths 204 and a switch controller 206 for controlling the opening, i.e. enabling, and closing, i.e. disabling, of the various switching paths of the switch matrix 204 so as to provide the desired output voltages. The switch matrix 204 is operable to selectively connect various nodes together. These nodes may be terminals on the charge pump circuit for connection with an input supply voltage VV, a reference or ground voltage VG, first and second flying capacitors CF2, CF1, and two pairs of output nodes (VP, VN) and (VQ, VM), when the charge pump circuit is in use. First, second, third and fourth reservoir capacitors (CRP, CRN, CRQ, CRM) are arranged in use for permanent connection to the pairs of output nodes, as described above.

Control data 208 is provided to a charge pump control block 210, which is operable to control the switch controller 206 of the charge pump circuit 202. The control data 208 may be a volume control signal, i.e. a gain signal. The control data may also include shut-down/start-up signals.

Signal data 212 is provided to a signal path block 214. The signal data may be digital or analogue data, and may have already undergone some upstream (analogue or digital) gain. Also, the signal data 212 may be audio data.

The signal path block 214 receives the signal data 212 at an input 213 and couples the signal data to the output driver 218. The output driver 218 includes at least an output stage 222 powered from the supplies VP, VN of charge pump 202. In this illustrated example, a preceding amplifier stage 220 is also included which may be powered from supplies VQ, VM of charge pump 202.

Other circuitry 216, for example a DAC or preamplifier gain stage, may be provided in the path from input 213 to the output driver 218. Some of this other circuitry 216 may be powered from VQ, VM. Indeed in some embodiments some of this preceding circuitry 216 and some or all preceding stages of 218 may be supplied from VQ, GND rather than VQ, VM for example to isolate some sensitive stages from possible noise on VM.

Although not shown in FIG. 32a, other circuitry may be provided that may or may not be powered from the VQ, VM, outputs of the charge pump circuit 202. For example, this other circuitry may comprise digital filtering or a digital delay stage that may be powered from digital supplies DVDD and DVSS, and possibly digital level-shifting circuitry to translate logic levels from (DVDD, DVSS) to (VQ, VG) or (VQ, VM).

Further, a gain/volume adjustment, controlled by control data 208, may be included in the signal path block 214. The gain/volume adjustment could be performed digitally, i.e. before a DAC (not illustrated), or in an analogue fashion in an analogue non-final stage, or in/around the output driver 218.

The output 224 of the signal path block 214 is provided to a load (not illustrated) that may be a headphone, speaker, line load, or another type of transducer, such as a haptic or piezoelectric transducer or ultrasonic transducer, possibly via a connector (not illustrated) such as a mono or stereo jack. It will therefore be understood that the audio signal may include data transformed to/from audible sounds, such as music and speech and the like but the audio signal may additionally or alternatively comprise ultrasonic data and/or waveforms for driving haptic transducers etc and the terms "audio", "audio signal," and "audio output chain" should be understood accordingly. The charge pump circuit 202 provides output voltages VP, VN, VQ and VM to power the signal path block. The first output voltage pair (VP, VN) provides a first bipolar voltage to the amplifier output stage 222 and the second output voltage pair (VQ, VM) may provide a second bipolar output voltage to preceding amplifier stage 220 and/or to preceding circuitry 216.

As described above in the first to eighteenth modes, the nominal first output bipolar voltage may be selectable to be one of: $+/-2*VV$; $+-\frac{3}{2}*VV$; $+/-VV$; $+/-VV/2$; $+/-VV/4$; or $+/-VV/6$ and the nominal second output bipolar voltage may be fixed or selected to be $+/-VV/2$, or the nominal first output bipolar voltage may be selectable to be one of: $+/-3*VV$; $+/-2*VV$; $+/-VV$; $+/-VV/2$; $+/-VV/3$; $+/-VV/4$; $+/-VV/5$; or $+/-VV/6$ and the nominal second output bipolar voltage may be fixed or selected to be $+/-VV$. In other words, the switch controller may be operable to drive the switch matrix to selectively operate in modes corresponding to these voltages.

The output voltages (VP, VN, VQ, VM) from charge pump circuit 202 may be selected via charge pump control block 210 based on the input control data 208. The input control data 208 may be, for example, a volume control signal, that may be independent of the signal data 212. The charge pump output voltages (VP, VN, VQ, VM) may then be set to allow adequate headroom, so as to avoid clipping, even for a maximum input signal 212 at the specified gain. However if the input signal 212 is consistently less than maximum expected amplitude, the charge pump output voltages (VP, VN, VQ, VM) will be unnecessarily large, therefore wasting power. Thus, it is advantageous to make some, but preferable all, the charge pump output voltages (VP, VN, VQ, VM) and possibly other operational parameters, dependent on the input signal 212, possibly in addition to the control data 208.

The charge pump control 210 may thus comprise envelope detection circuitry to derive a signal Venv indicative of the size of the input signal 212. The envelope detection circuitry may take a number of forms that would be known to a person skilled in the art. The envelope detection circuitry may, for example, peak detect the input signal, responding rapidly, with a relatively short attack time, to any increase in signal magnitude, but reacting more slowly, with a longer decay time, to any decrease in the input signal. From the signal Venv, the charge pump control 210 may derive and output to the switch controller 206 of the charge pump circuit 202 a charge pump control signal CPC.

The control signal CPC may thus be indicative of the size of the envelope of the signal data 212. The charge pump circuit 202 may then be controlled based on the control signal CPC to supply corresponding output voltages VP, VN and/or VQ, VM. The output voltages of the charge pump circuit 202 may therefore vary with the control signal CPC such that a relatively large envelope will lead to a relatively high voltage being supplied by the charge pump circuit and conversely, a small envelope will lead to a relatively small voltage being supplied by the charge pump circuit. If the envelope detector circuitry employs a relatively short attack time, this will ensure that rapid spikes in the signal data 212 will result in a rapid reaction by the envelope detection circuitry and thus a rapid response can be made so as to increase the supply voltage, whereas the long decay time will avoid unnecessary switching of the control signal, since it is quite likely that one high-amplitude signal peak will be followed soon after by another.

Another example of envelope detection circuitry may comprise a detector to detect an envelope Venv of the input signal and compare it with some threshold value. If the detected envelope is below the threshold, the charge pump circuit 202 may be controlled to provide a relatively low voltage, and if the detected envelope is above the threshold, the charge pump circuit 202 will provide a relatively high voltage. To avoid unproductive switching between charge pump voltage levels that might waste more energy than it saves, there may be some hysteresis applied to the comparison, or there may be a minimum timeout imposed before the charge pump 202 is allowed to be instructed via the control signal CPC to reduce its output voltage(s).

More generally, the envelope detection circuitry may not contain an explicit peak detector, or actual signal Venv, but the charge pump control signal may be generated by other means, for instance a comparator coupled without peak detection to the input signal data 212, the comparator having hysteresis and/or a timeout, to effectively provide a type of envelope detection and generate charge pump control signal.

Depending on the attack and decay time constants, or the hysteresis or time out, the signal Venv output from the envelope detector may follow the instantaneous input signal 212 more closely or less closely. It may essentially track the instantaneous input signal.

As stated above, output driver 218 and/or elements of block 216 may comprise means for applying gain to what becomes the output signal. The envelope detector preferably takes signal data before these gain blocks, so that the input signal is sampled before any processing delay suffered in the output driver 218 or any circuitry 216 preceding it. In particular, circuitry 216 may include a digital interpolation filter (not illustrated) preceding an over-sampling DAC (not illustrated) which may introduce a processing delay to the signal. Any such delay will relax the requirements on the attack time of any peak detector and give the charge pump 202 more time to ramp up its output voltage(s) in time to avoid overload due to a sudden signal spike. The envelope detector may include an asymmetric delay, allowing a quick response to any increase in signal level, but a delay before its output is allowed to start decaying, to avoid the charge pump output decaying before the signal has propagated through the above processing delay.

However since the swing of the output signal from driver 218 is subject to this variable gain, the signal sampled upstream is not directly representative of the output signal. There are several ways of correcting for the effect of this gain applied downstream from the point where the signal is tapped off for application to the envelope detector: an equivalent gain may be inserted in the path between applied input signal 212 and the envelope detector within charge pump control block 210; the envelope detector output signal may be adjusted in amplitude to allow for the gain applied in the signal path; the threshold level applied to the envelope detector output signal may be adjusted to compensate for the programmed gain.

In other words, the charge pump 202 may be controlled by a charge pump control signal derived from the input audio signal prior to some application of gain controlled by a gain control, or volume, signal, the charge pump control signal being adjusted according to the gain control, or volume, signal.

The charge pump control block 210 may also have an output for controlling the bias current of stages of the amplifier block 218. For example, if the signal to be output from driver stage 218 can be predicted to be small, say on the basis of input signal size or volume setting, it will be possible to reduce the bias of at least the output stage without causing too much, or indeed any, distortion. If the output driver is set to a low gain, the contribution of preceding stages to the total output noise may be reduced, so the input stage bias of these stages may be reduced without a significant impact on this output noise. These biases may conveniently be controlled via the charge pump control block 210.

The control signal from the charge pump control block 210 is provided to the switch controller 206. The switch controller 206 outputs drive signals for the switches in the switch matrix 204 of the charge pump 202.

The switch controller 206 may control the switch matrix 204, based on the control signal from the charge pump control 210, to provide the necessary switch selection and phasing to generate a selected value of bipolar output voltage at VP, VN. As described above, the nominal bipolar output voltage at VP, VN may be selectable to be +/−2VV, +−½VV, +/−VV, +/−VV/2, +/−VV/4 or +/−VV/6. Also, the switch controller 206 may control the switch matrix 204, based on the control signal from the charge pump control 210, to provide the necessary switch selection and phasing to generate a selected bipolar output voltage at VQ, VM. As described above, the nominal bipolar output voltage at VQ, VM may selectable to be +/−VV or +/−VV/2.

The switch controller 206 may also control the switch matrix 204, to vary other operational parameters of the charge pump, for instance the frequency or sequencing of switching of the switches in the switch matrix 204 based on the control data 208, for example a volume control signal, or the envelope detector output signal in order to reduce switching activity when light loading is anticipated but not give rise to excessive ripple when heavy loading is anticipated.

Thus the switching frequency of the switches or the sequence or selection of states or other operational parameters of the charge pump 202 may be modulated according to a control signal fed forward from the switch controller. However in some embodiments the switching of the switches or other operational parameters may be influenced by signals fed back from the charge pump output nodes.

Figure 32B:
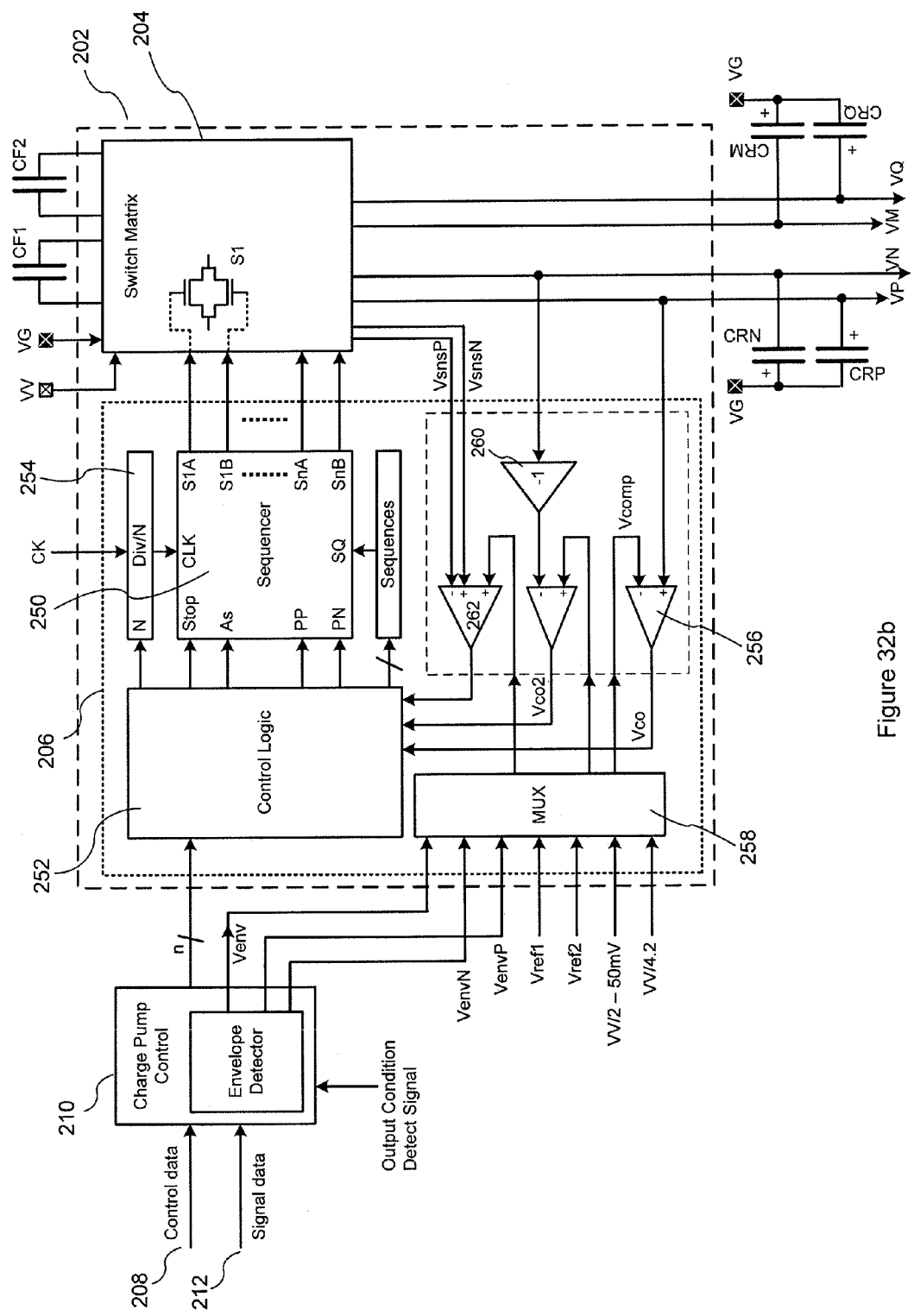
FIG. 32b schematically shows a feed back circuit that enables charge pump control.

Referring to FIG. 32b, this Figure illustrates an embodiment of circuitry to enable such control by means of fed back charge pump output signals. As in FIG. 32a, a charge pump control block 210 is shown controlling a charge pump 202 comprising a switch matrix, i.e. a network of switches, 204 controlled by a switch control block 206 so as to generate appropriate charge pump bipolar output voltages (VP,VN) and (VQ,VM). In FIG. 32b, more details of an embodiment of the switch control block 206 are explicitly shown. The switch control block 206 is shown to comprise a sequencer 250 which drives switches in the switch matrix under control of a control logic block 252, which can select a division ratio N for a clock divider 254 which divides the frequency of the incoming clock CK before application to the sequencer 250, and which can select one of various stored sequences for the sequencer 250 to sequence through. The control logic 252 also controls the sequencer output according to various other inputs by various other outputs which will be described in turn below.

As mentioned above, power consumed by the charge pump 202 in switching the switches can be reduced by interrupting the switching sequence, only activating the switches when the voltage on a reservoir capacitor (CRP, CRN, CRQ, CRM) has drooped enough to render it worthwhile expending the energy involved in switching the necessary switches. The voltage droop can be detected by comparing the actual output voltage with a comparison voltage, equal to say a voltage smaller than the target by an amount equal to the tolerable voltage droop, and passing the result of such a comparison as a comparison control signal to the control logic 252 in the switch controller 206 to interrupt the sequencing.

In FIG. 32b, the charge pump output voltage VP is shown input to comparator 256, where it is compared to a comparison voltage Vcomp selected from one of a plurality of comparison voltages (VenvP, Vref1, Vref2, VV/2-50 mV, VV/4.2) input to a multi-input, multi-output, multiplexer 258. The comparator output signal Vco is input to an appropriate logic in the control logic block shown. This control logic block 252 can command the sequencer to stop sequencing via an input labelled "Stop".

The comparison may be performed by equivalent means. For example, a difference voltage may be generated by a difference amplifier stage (not illustrated), this difference voltage representing the difference between the nominal and actual output voltage, and this difference voltage may be compared against a reference representing the allowable droop by a comparator similar to comparator 256.

Similarly, the differential output voltage between two of the output voltages, e.g. VP−VN, may be generated by a difference amplifier stage (not illustrated), and this differential voltage compared to a threshold voltage.

In either case, the generation of this difference voltage may include some low pass filtering to smooth out switching spikes or some high pass filtering to make the comparison sensitive to any increase in the slope of the droop to try and anticipate any increase in loading.

The nominal output voltage of the charge pump circuit described above is a rational fraction, possibly improper, or multiple of the input supply voltage, so the comparison voltage Vcomp may be set slightly below this fraction of the supply voltage, for example the self-explanatory multiplexer inputs labelled "VV/2-50 mV" or "VV/4.2". Alternatively, the comparison voltage Vcomp may be set at an absolute value, for example the multiplexer inputs labelled Vref1 and Vref2, perhaps derived from a supply-independent voltage reference such as a bandgap voltage reference, especially if the maximum amplifier output signal is well defined in terms of absolute voltages, rather than itself being a fraction of the supply voltage.

The comparison voltage Vcomp may be fixed, or may be changed during use, for example according to the selected output voltage of the charge pump, for example by the control logic altering the multiplexer connections, or some other alteration of a received reference voltage.

The comparison voltage Vcomp may be variable, for instance based on the output Venv of the envelope detector shown in FIG. 32b. If the input audio signal 212 becomes small, the reservoir capacitors would then be allowed to discharge down to a similarly small value or some minimum headroom voltage before being recharged, thus saving switching energy.

Each reservoir capacitor voltage (VQ, VP, VN, VM) may be monitored independently, with respect to respective comparison voltages. Charge pump output voltage VN is shown being input to a second comparator 260 to generate a second comparator output signal Vco2 for use by the control logic block 252. For convenience VN may be inverted as shown before input to the comparator 260, this conveniently allows a common comparison voltage to be used for both comparators if a symmetric response is desired.

Suitable logic in the switch controller 206 can then determine from Vco and Vco2 which reservoir capacitor or capacitors are in need of recharging, and can thus modulate the switching sequence accordingly so as to cope efficiently with an asymmetric loading. The control logic 252 inputs control signals PP and PN that instruct the sequencer to give priority to switching states which will recharge reservoir capacitors CRP or CRN respectively. If no reservoir capacitor needs recharging the switching sequence may be interrupted, i.e. stopped, until a voltage on one of the reservoir capacitors (CRP, CRN, CRQ, CRM) does droop enough to be worthwhile expending the switching energy needed to recharge it.

If the envelope detector in the charge pump control 210 provides an indication of the magnitude of the input signal 212, this common magnitude signal Venv may be used for both positive VP and negative VN charge pump output voltages. If the envelope detector provides separate indications of the positive and negative envelopes of the input signal, shown as VenvP and VenvN, the comparison voltages used for positive and negative charge pump output voltages may be controlled independently, and may no longer be balanced around ground especially if the input signal 212 is asymmetric. In other words, the actual bipolar output voltage may be asymmetric, at least for some time, even if the nominal bipolar voltage of the charge pump operating mode is symmetric.

Figure 32C:
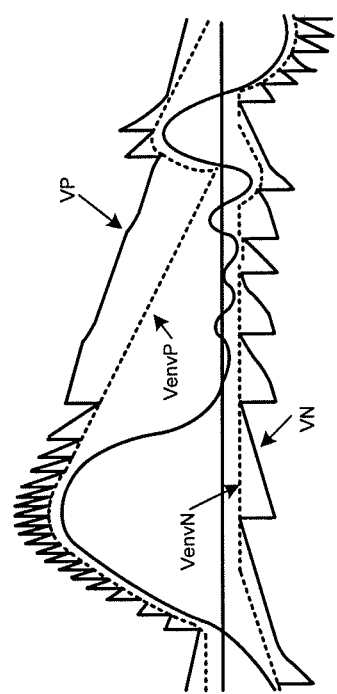
FIG. 32c shows an input signal waveform and corresponding envelope and charge pump output voltage waveforms.

FIG. 32*c* illustrates an input signal waveform and corresponding envelope and charge pump output voltage waveforms for such a case. The positive envelope VenvP follows the rapid positive ramp of the signal, but then decays only slowly after the peak until the next, smaller, peak arrives. The negative envelope VenvN decays to a preset minimum value until the signal goes appreciably negative. These envelopes are also displaced from the input signal by a preset headroom allowance. The charge pump output voltage VP jumps up as the reservoir capacitor CRP is recharged every time VP decays down to the envelope VenvP, before decaying back down to the envelope VenvP at a rate dependent on the signal amplitude, i.e. on the load current. Thus there are frequent recharging events as VP is ramped positive, but relatively few as it ramps negative, particularly when the signal reduces to near zero or negative. (Even with a negative signal, some current may still be taken from CRP to power elements of the amplifier output stage). Similarly, CRN is only recharged frequently while the corresponding signal and envelope VenvN are ramping negatively.

At the maximum rate of recharging, the output voltage may rise close to the nominal output voltage for the set of states, i.e. mode, being employed. For instance this maximum charge pump output voltage might be +/−VV/2. To allow occasional bursts of larger signals, or to increase efficiency if the signal becomes small for a period, the available set of states, i.e. the basic mode of operation of the charge pump, may be altered, say according to control signal CPC based on a detected envelope. For instance, a large envelope may cause a change of mode to one capable of generating +/−VV, or a small envelope may cause a change of mode to one only capable of generating at most +/−VV/4. In this case the operation of the charge pump would be affected by both fed forward and fed back control signals.

Thus the switch controller 206 may control the switch matrix 204, based on feedback via a comparison control signal or signals derived from a charge pump output voltage, so as to modulate operational parameters of the charge pump 202. Thus the switch controller 206 may control the switch matrix 204, based on a control signal fed forward via the charge pump controller 210 or on a control signal fed back via comparison from a charge pump output voltage. The switch controller 206 may control the switch matrix 204, based on fed back or fed forward control signal (including the possibility of using a combination of both), so as to modulate operational parameters of the charge pump 202.

The switch controller 206 may also control the switch matrix 204, based on a fed back or fed forward control signal, to change the size of some or all switches used to minimize supply drop at heavy loads while reducing the energy required for each switch transition at light loads. The effective switch size (W/L in the case of a MOS transistor switch) may be changed by activating or deactivating switching of parallel elements of a switch, for instance parallel segments of a MOS switch. FIG. 32*c* illustrates this possibility by showing the sequencer to have a logic input "As" to indicate whether large or small switches are desired, and two control wires, e.g. S1A and S1B controlling respective portions of each switch, e.g. MOS switch, S1. Normally S1A and S1B will both be driven with the same signal, activating both portions of S1 when required. But if the control logic 252 asserts input "As" of the sequencer, switch elements corresponding to S1B may be deactivated, thus decreasing the effective size of S1. The effective sizes of other switches, e.g. Sn, may be similarly controlled via similar pairs of control wires SnA and SnB. The size of all switches may be affected by the same input "As", or may be controlled separately via similar inputs, or the size of some switches may remain constant.

The switch controller 206 may also control the switch matrix 204, based on a fed back or fed forward control signal, to change the magnitude of a dither applied to the edges of the input clock which controls the clocking of the switching phases. The dither signal may be included so as to reduce spurious tones in the output at light loads, but preserve duty cycle and output impedance at heavy loads, where any such tones would tend to be randomised by the applied signal, i.e. the audio signal. The dithering may be controlled by a control signal output from the control logic to some circuitry in the clock chain generating the clock CLK used by the sequencer. The control logic may modulate the factor N by which the input clock CK is divided by the clock divider 254, or the dither may be generated by some more complex upstream circuitry (not illustrated), for instance to noise shape the dither spectrum by known techniques.

The output current of the charge pump 202 may also be monitored in order to modulate operational parameters of the charge pump, for example to change the switching frequency of the charge pump 202 according to load.

In one embodiment, if a high current is detected, indicating that a low impedance is connected, a headphone load may be deduced, in which case the volume should be restricted to avoid headphone or user overload and hence the output stage supply voltages (VP, VN) from the charge pump 202 can be reduced, or if only low currents are detected for a period of time, indicating connection of only a high impedance load, a line load can be assumed, in which case a maximum output swing is required to maximise signal-to-noise and consequently relatively high supply voltages are required to be output by the charge pump 202 while the output load current is relatively low, or the device may be assumed to be powered from the external peripheral or accessory to which the line output is connected, e.g. a docking station, so power efficiency is less important The current sense block may monitor the voltage drop across one or more switches, for example drain-source voltage of a MOS switch in the switch matrix 204. In the embodiment of FIG. 32*b*, signals VsnsP and VsnsP are shown emerging from the switch matrix, representing the voltages at each terminal of a MOS switch of the matrix. Their difference is then shown being compared by comparator 262 against a threshold signal to generate a corresponding logic signal for use by the control logic 252 to modulate the charge pump output voltage or other operational parameters.

The current may also be sensed by circuitry within the output driver amplifier. This may also be used perhaps for functions such as detecting a short to ground on the driver amplifier output. In this case, the sensed current, or a logic signal derived from it indicating excessive current may be transmitted to the charge pump control 210 instead of or in addition to the control logic 252. This is illustrated in FIG. 32b by the Output Condition Detect Signal input to the charge pump control. Such Output Condition Detect Signals may also be received from other sources, for example from a jack-detect contact on an output jack socket used to connect the driver amplifier to the load.

Although the system illustrated in FIG. 32 illustrates only a single output path from the signal path block 214, it should be understood, that the system of FIG. 32 could be adapted for a stereo output by providing an additional signal path block 214' (not illustrated) with appropriate controls. In practice, given the likely correlation between left and right channels, it is not worth the expense of supplying two charge pumps with independent outputs, so a common control corresponding to the heaviest demand would be applied to a shared charge pump. In general multiple channels, for instance for surround sound formats, such as 2.1, 5.1, or 7.1, may share a common charge pump with appropriate combination of the charge pump control signals.

As stated above, the control data supplied to charge pump control block 210 may comprise start-up/shut-down commands. These may be applied via switch controller 206 to alter the sequencing or duration of switching phases or the effective size or resistance (e.g. by modulating the gate drive voltage applied to a MOS switch) of switches used.

The control data may also comprise commands to ignore any envelope detection or volume control data and to directly control the settings of the switch controller 206, for example to set a fixed charge pump step-down ratio, perhaps during system start-up or to allow the envelope detector to be powered down if the output signal is otherwise known, for example a fixed amplitude tone. The control data may be derived from some sensor, perhaps a mechanical switch or some proximity detector that detects when a mobile device is connected to a docking station. The load may then by known to be a line load so preferably the output signal will be increased to maximise signal-to-noise, and in any case the device may be powered from the docking station so output stage efficiency is no longer so important. Thus the control data may be set by hardware or software to disable and ignore any envelope detection circuitry.

While FIG. 32b shows circuitry to enable all the various responses to fed-back signals, a particular embodiment would probably only require a subset of these, so the circuit could be simplified, for example by replacing the multiplexer and most of its reference voltage inputs by a simple hard-wired reference voltage connection.

Figure 33:
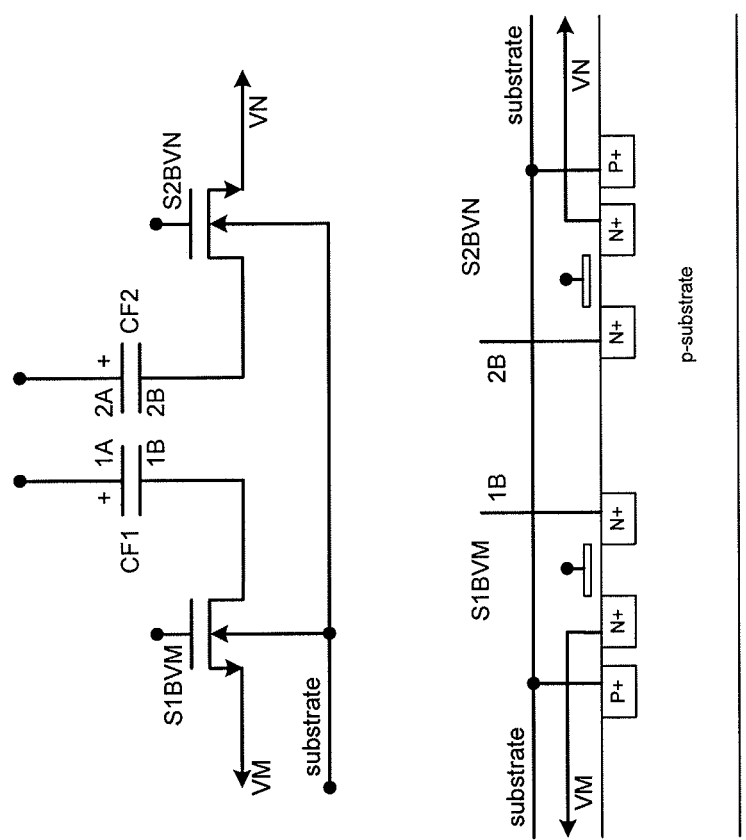
FIG. 33 shows a cross section of an NMOS switch.

The switches in the switch matrix 204 may be implemented as MOS switches. In particular, switches such as S1BVM and S2BVN may be implemented as NMOS switches. FIG. 33 shows a cross section of an NMOS switch.

In operation, the NMOS source, drain will be subject to negative voltages VM, VN. If either of these voltages are more negative than the p substrate, the junction will forward bias, and clamp the node to a diode down from substrate voltage. There is also a possible latch-up and injection of charge into unexpected nodes e.g. via parasitic npn action. To avoid this, the substrate may be connected to the most negative voltage on the chip, probably VM or VN. However this will alter the threshold voltage of every NMOS on the chip, changing as VN changes, and coupling any noise on VN across the chip. Also in configurations where VM or VN may at times be the most negative, it would also be necessary to selectively connect the substrate to the more negative one of the VN, VM.

Figure 34:
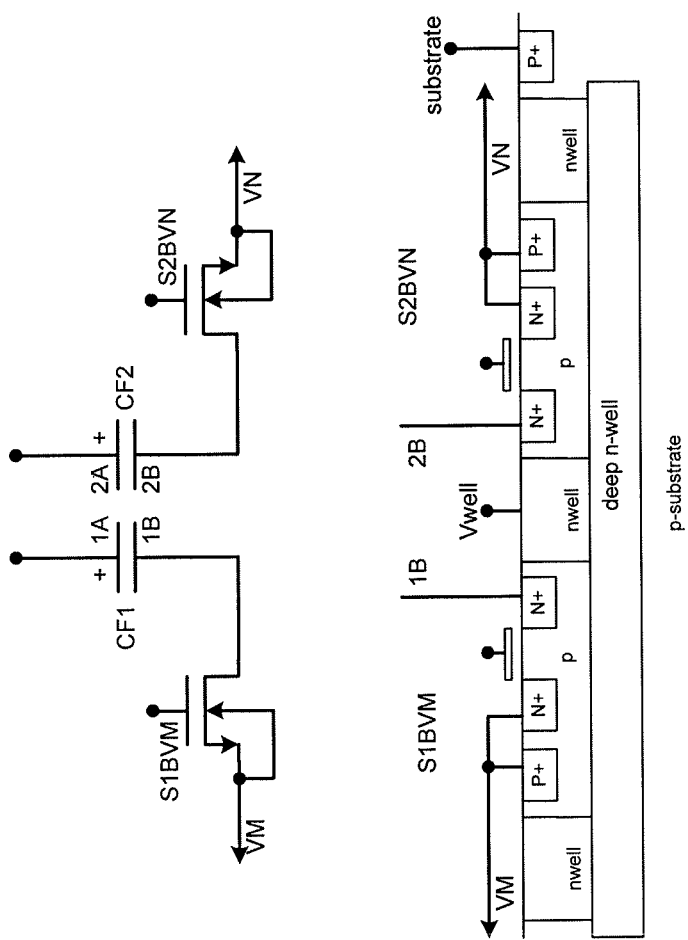
FIG. 34 shows VM and VN switches configured with respective body connections.

In order to avoid this, and to allow the substrate to be at ground for the rest of circuitry, the substrate under VM and VN switches may be isolated using a deep-well (or "triple-well") option available on modern integrated circuit fabrication processes. FIG. 34 shows VM and VN switches configured with respective body connections. The lateral n-well and underlying deep n-well implants isolate these regions. If Vwell is the most positive potential on the chip, then the junctions to these n-wells cannot end up forward biased.

Figure 35:
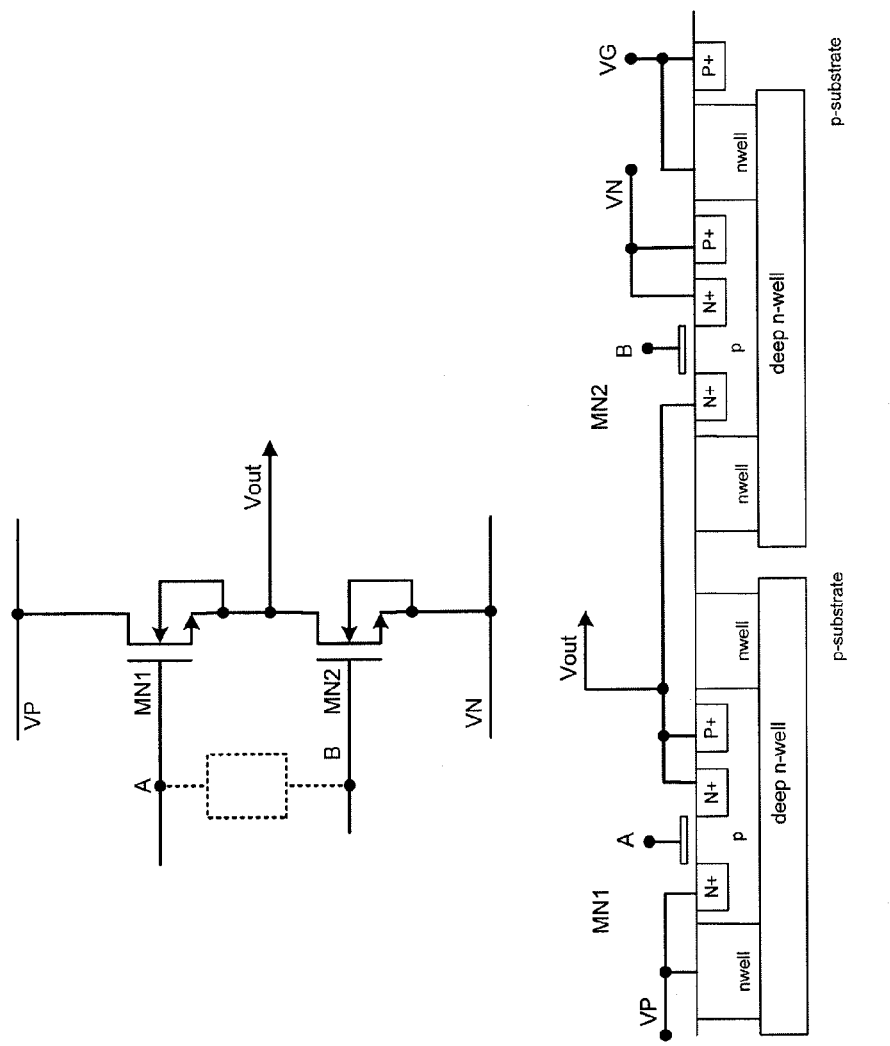
FIG. 35 shows an NMOS output stage.

Similarly there may also be NMOS inside the amplifiers powered from VM and VN that will need similar NMOS body connections. FIG. 35 shows an NMOS output stage. If VB is constant then this is a Class A source follower; or MN2 gate voltage may be modulated by the input signal on A to implement a Class AB output stage. In this case, the p-body of MN2 is biased at VN, so the surrounding n-well may be biased at ground without risk of forward biasing. However the p-body of MN1 is connected to Vout, which may be pulled up near to VP, so the n-well surrounding this p-body needs to be biased to VP (or higher).

Figure 36:
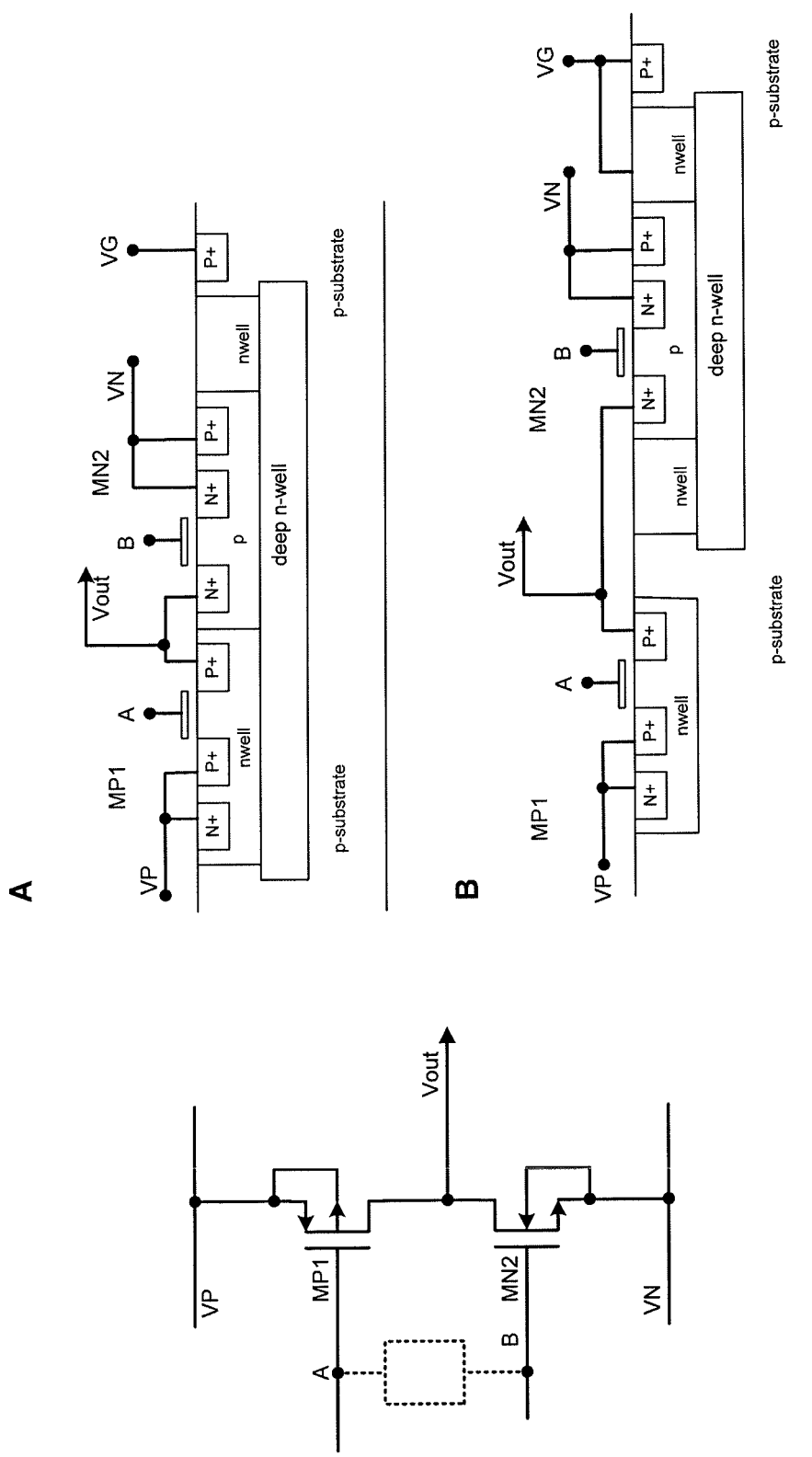
FIG. 36 shows a CMOS output stage.

FIG. 36 shows a CMOS output stage, again possibly with linkage between A and B to give a Class AB output stage. The PMOS well may be merged with the isolating n-well (see figure labelled A) if both are connected to VP, or be separate if MN2 isolating well is connected to e.g. VG. (see figure labelled B)

As would be apparent to the skilled person, although only eighteen modes of operation are described above, various other modes of operation and various other switching sequences for the various phases in each mode operation could be provided based on the switch matrixes of the present invention, without departing from the scope of the present invention.

The above description refers generally to switching paths, it should be understood that each switching path may contain a single switch. Alternatively, each switching path may contain any number of discrete switches as is desired to manage voltage stresses efficiently across each switching path.

The circuits of the charge pump may be controlled by hard-wired logic. But with cheaper, faster processing becoming available, it may be desirable to implement some functions, for example the envelope detection, in general purpose DSP hardware loaded with appropriate software algorithms.

The switching paths may use alternative switching structures, such as MEMS relays for example.

It may be convenient for physical layout reasons or for supply noise management reasons to provide more than one physical terminal (for example package pin, lead, or solder ball) for the input supply and the ground, or possibly the charge pump output nodes, where in use the terminals in question are connected together on an underlying substrate or printed circuit board. These terminals would then constitute a single node. In some cases the connection may be some distance away from the integrated circuit, to provide a star ground connection point for a printed circuit board, but would still constitute a single node.

The above described embodiments use two flying capacitors and associated switch matrices or networks of switches. In further embodiments, the charge pump as described may constitute part of a larger network of switches or use more than two flying capacitors, for example to generate yet further voltages. However if these additional switching paths or flying capacitors were removed, the remaining circuitry could still be operable as described in the above embodiments.

The polarities of voltages on capacitors and outputs in the embodiments described above have assumed a positive input supply voltage VV (or VW) is applied to the charge pump. Equivalent circuits and operation is possible with a negative input supply voltage with consequent adjustments to the polarities of voltages.

In summary, embodiments of the present invention provide a pair of bipolar output voltages from a charge pump, the charge pump being a low power, low cost charge pump that is particularly suitable for battery-powered devices. The described embodiments are also applicable for higher-power amplifiers, where reduced power dissipation on drivers rather than consumption is issue, and the elimination, or at least the minimisation, of audio artefacts is critical.

Although the above describes the invention in relation to audio amplifiers, as will be apparent to the skilled person, the invention is also applicable to other systems, especially those driving appreciable loads with signals of similar frequencies, e.g. haptic transducer driving and ultrasonic drivers.

What is claimed is:

1. A charge pump circuit, comprising:
   an input node (VV) and a reference node (VG) for connection to an input voltage;
   a first pair of output nodes (VP,VN) and a second pair of output nodes (VQ,VM);
   two pairs of flying capacitor nodes (CF1A, CF1B; CF2A, CF2B);
   a network of switching paths for interconnecting said nodes; and
   a controller operable to control the network of switching paths when in use with two flying capacitors (CF1,CF2) connected to the two pairs of flying capacitor nodes, to provide a first bipolar output voltage at the first pair of output nodes (VP,VN) and a second bipolar output voltage at the second pair of bipolar output nodes (VQ,VM).

2. The charge pump according to claim 1, wherein the controller is operable to control the network of switching paths such that the first bipolar output voltage is operable to be a selectively variable bipolar output voltage, and the second bipolar output voltage a fixed bipolar voltage.

3. The charge pump according to claim 1, wherein the controller is operable to control the network of switching paths such that the first bipolar output voltage is operable to be a selectively variable first bipolar output voltage, and the second bipolar output voltage is operable to be a selectively variable second bipolar output voltage.

4. The charge pump circuit according to claim 1, wherein the controller is operable to control the network of switching paths such that the first bipolar output voltage is +/−VV/6, where VV is the input supply voltage to the charge pump circuit.

5. The charge pump circuit according to claim 1, wherein the controller is operable to control the network of switching paths such that the first bipolar output voltage is +/−(3/2)*VV and the second bipolar output voltage is +/−VV/2.

6. The charge pump circuit according to claim 1, wherein the controller is operable to control the network of switching paths such that the voltage across the first flying capacitor (CF2) is VV/4 and the voltage across the second flying capacitor (CF1) is VV/2.

7. The charge pump circuit according to claim 1, wherein the controller is operable to control the network of switching paths such that the first bipolar output voltage is +/−3VV.

8. The charge pump circuit according to claim 1, wherein the controller is operable to control the network of switching paths such that the first bipolar output voltage is +/−VV/4 and the second bipolar output voltage is +/−VV/2.

9. The charge pump circuit according to claim 1, wherein the controller is operable to control the network of switching paths such that the voltage across the first flying capacitor (CF2) is VV/3 and the voltage across the second flying capacitor (CF1) is VV/3.

10. The charge pump circuit according to claim 1, wherein the controller is operable to control the network of switching paths such that the first bipolar output voltage is +/−VV/3.

11. The charge pump circuit according to claim 1, wherein the controller is operable to control the network of switching paths such that the first bipolar output voltage is +/−VV/6 and the second bipolar output voltage is +/−VV/2.

12. The charge pump circuit according to claim 1, wherein the controller is operable to control the network of switching paths such that the voltage across the first flying capacitor (CF2) is VV/5 and the voltage across the second flying capacitor (CF1) is (3/5)*VV.

13. The charge pump circuit according to claim 1, wherein the controller is operable to control the network of switching paths such that the first bipolar output voltage is +/−VV/4.

14. The charge pump circuit according to claim 1, wherein the controller is operable to control the network of switching paths such that the first bipolar output voltage is +/−VV/5.

15. The charge pump circuit according to claim 1, wherein the controller is operable to control the network of switching paths such that first bipolar output voltage is one of +/−2VV, +/−(3/2)*VV, +/−VV, +/−VV/2, +/−VV/4, or +/−VV/6 and the second bipolar output voltage is +/−VV2.

16. The charge pump circuit according to claim 1, wherein the controller is operable to control the network of switching paths such that first bipolar output voltage is one of +/−3VV, +/−2VV, +/−VV, +/−VV/2, +/−VV/3, +/−VV/4, +/−VV/5 or +/−VV/6 and the second bipolar output voltage is +/−VV.

17. The charge pump circuit according to claim 2, wherein the controller is operable to control the network of switching paths to provide +/−VV/2 as said fixed bipolar output voltage, where VV is the input supply voltage to the charge pump circuit.

18. The charge pump circuit according to claim 17, wherein the controller is operable to control the network of switching paths to selectively provide two or more modes, said variable bipolar output voltage in each mode corresponding to a bipolar output voltage of +/−2VV, +/−(3/2)*VV, +/−VV, +/−VV/2, +/−VV/4, or +/−VV/6.

19. The charge pump circuit according to claim 2, wherein the controller is operable to control the network of switching paths to provide +/−VV as the fixed bipolar output voltage, where VV is the input supply voltage to the charge pump circuit.

20. The charge pump circuit according to claim 19, wherein the controller is operable to control the network of switching paths to selectively provide two or more modes, the variable bipolar output voltage in each mode corresponding to a bipolar output voltage of +/−3VV, +/−2VV, +/−VV, +/−VV/2, +/−VV/3, +/−VV/4, +/−VV/5 or +/−VV/6.

21. The charge pump circuit according to claim 3, wherein the controller is operable to control the network of switching paths to selectively provide, the variable second bipolar output voltage to be +/−VV or +/−VV/2, where VV is the input supply voltage to the charge pump circuit.

22. The charge pump circuit according to claim 21, wherein
   when the variable second bipolar output voltage is +/−VV, the controller is operable to control the network of switching paths to selectively provide one or more modes, the variable bipolar output voltage in each mode corresponding to a bipolar output voltage of +/−3VV, +/−2VV, +/−VV, +/−VV/2, +/−VV/3, +/−VV/4, +/−VV/5 or +/−VV/6; and when the variable second bipolar output voltage is +/−VV/2, the controller is operable to control the network of switching paths to selectively provide one or more modes, the variable bipolar output voltage in each mode corresponding to a bipolar output voltage of +/−2VV, +/−(3/2)*VV, +/−VV, +/−VV/2, +/−VV/4, or +/−VV/6.

23. The charge pump circuit according to claim 1, wherein the first pair of output nodes (VP,VN) comprises a first output node (VP) and a second output node (VN), the second pair of output nodes (VQ,VM) comprises a third output node (VQ) and a fourth output node (VM), the first pair of flying capacitor nodes comprises a first flying capacitor node (CF2A) and a second flying capacitor node (CF2B), the second pair of flying capacitor nodes comprises a third flying capacitor node (CF1A) and a fourth flying capacitor node (CF1B), and wherein in use, the first flying capacitor (CF2) is connected to the first and second flying capacitor nodes (CF2A,CF2B), and a second flying capacitor (CF1) is connected to the third and fourth flying capacitor nodes (CF1A,CF1B), a first reservoir capacitor (CRP) is connected between the first output node (VP) and the reference node (VG), a second reservoir capacitor (CRN) is connected between the reference node (VG) and the second output node (VN), a third reservoir capacitor (CRQ) is connected between the third output node (VQ) and the reference node (VG) and a fourth reservoir capacitor (CRM) is connected between the reference node (VG) and the fourth output node (VM).

24. The charge pump circuit according to claim 23, wherein the controller is operable to control the network of switching paths such that, in a first switching state, the first flying capacitor (CF2), the second flying capacitor (CF1) and the first reservoir capacitor (CRP) are connected in series between the input node (VV) and the reference node (VG), the series connected first flying capacitor (CF2) and the first reservoir capacitor (CRP) are also connected in parallel to the third reservoir capacitor (CRQ) between the third output node (VQ) and the reference node (VG), and the second flying capacitor (CF1) and the third reservoir capacitor (CRQ) are connected in series between the input node (VV) and the reference node (VG).

25. The charge pump circuit according to claim 24, wherein the controller is operable to control the network of switching paths such that the first bipolar output voltage is +/−VV/4 and the second bipolar output voltage is +/−VV/2.

26. The charge pump circuit according to claim 23, wherein the controller is operable to control the network of switching paths such that in a second switching state, the first flying capacitor (CF2) and the second reservoir capacitor (CRN) are connected in series, and the second flying capacitor (CF1) is connected in parallel with the series connected first flying capacitor (CF2) and second reservoir capacitor (CRN).

27. The charge pump circuit according to claim 24, wherein the controller is operable to control the network of switching paths such that the first bipolar output is +/−/6 and the second bipolar output is +/−VV/2.

28. The charge pump circuit according to claim 1, wherein at least one output voltage (VP, VN, VQ, VM) or a voltage difference between any two output voltages, is compared with a threshold level.

29. The charge pump circuit according to claim 28, wherein the threshold is independent of the input supply voltage VV.

30. The charge pump circuit according to claim 28, wherein when in use with a first reservoir capacitor (CRP) connected between the first output node (VP) and the reference node (VG), a second reservoir capacitor (CRN) connected between the reference node (VG) and the second output node (VN), a third reservoir capacitor (CRQ) connected between the first output node (VQ) and the reference node (VG), and a fourth reservoir capacitor (CRM) connected between the reference node (VG) and the fourth output node (VM), the controller is operable to control the network of switching paths such that first reservoir capacitor (CRP) is recharged when the first output (VP) is smaller in magnitude than a first threshold, the second reservoir capacitor (CRN) is recharged when the second output (VN) is smaller in magnitude than a second threshold, the third reservoir capacitor (CRQ) is recharged when the third output (VQ) is smaller in magnitude than a third threshold, and the fourth reservoir capacitor (CRM) is recharged when the fourth output (VM) is smaller in magnitude than a fourth threshold.

31. An audio output chain arranged to receive an input audio signal and process the audio signal to drive a load, said load comprising at least one of: a headphone, a speaker, a line load, a haptic transducer, a piezoelectric transducer, an ultrasonic transducer, wherein the audio output chain comprises the charge pump circuit according to claim 1.

32. The audio output chain according to claim 31, wherein the controller is operable to control the switching sequence of the network of switches in dependence on a comparison of at least one of the outputs of the charge pump with a threshold level.

33. The audio output chain according to claim 32, wherein the threshold level is independent of the input voltage (VV).

34. The audio output chain according to claim 32, further comprising a charge pump controller (210), wherein the charge pump controller (210) is operable to receive a control signal (208), the threshold level being dependent on the control signal (208).

35. The audio output chain according to claim 34, wherein the control signal (208) is a gain or volume signal.

36. The audio output chain according to claim 32, wherein when in use with a first reservoir capacitor (CRP) connected between the first output node (VP) and the reference node (VG), and a second reservoir capacitor (CRN) connected between the reference node (VG) and the second output node (VN), the controller is operable to control the network of switching paths such that first reservoir capacitor (CRP) is recharged when the first output (VP) is smaller in magnitude than a first threshold, and the second reservoir capacitor (CRN) is recharged when the second output (VN) is smaller in magnitude than a second threshold.

37. The audio output chain according to claim 36, wherein when in use with a third reservoir capacitor (CRQ) connected between the first output node (VQ) and the reference node (VG), and a fourth reservoir capacitor (CRM) connected between the reference node (VG) and the fourth output node (VM), the controller is operable to control the network of switching paths such that first reservoir capacitor (CRP) is recharged when the first output (VP) is smaller in magnitude than the first threshold, the second reservoir capacitor (CRN) is recharged when the second output (VN) is smaller in magnitude than the second threshold, the third reservoir capacitor (CRQ) is recharged when the third output (VQ) is smaller in magnitude than a third threshold, and the fourth reservoir capacitor (CRM) is recharged when the fourth output (VM) is smaller in magnitude than a fourth threshold.

38. The audio output chain according to claim 34, wherein the charge pump controller (210) is operable to receive said input audio signal (212), and wherein the threshold level is dependent on the input audio signal (212).

39. An integrated circuit comprising the charge pump circuit according to claim 1.

40. An audio device comprising the charge pump circuit according to claim 1.

41. A device as claimed in claim 40 wherein said device is at least one of: a battery powered device, a portable device, a personal audio device, a personal video device; a mobile telephone, a personal data assistant, a gaming device, a portable computing device, a laptop and a satellite navigation system.

42. A method of controlling a charge pump circuit to generate a bipolar output voltage, the charge pump circuit comprising an input node (VV) and a reference node (VG) for connection to an input voltage, a first pair of output nodes (VP,VN) and a second pair of output nodes (VQ,VM), two pairs of flying capacitor nodes (CF1A, CF1B; CF2A,CF2B), and a network of switching paths for interconnecting said nodes, the method comprising the step of:

controlling the network of switching paths when in use with two flying capacitors (CF1,CF2) connected to the two pairs of flying capacitor nodes, to provide a first bipolar output voltage at the first pair of output nodes (VP,VN) and a second bipolar output voltage at the second pair of bipolar output nodes (VQ,VM).

\* \* \* \* \*